US012682970B2

(12) United States Patent
Feng et al.

(10) Patent No.: US 12,682,970 B2
(45) **Date of Patent: *Jul. 14, 2026**

(54) SHIFT REGISTER AND METHOD FOR DRIVING THE SAME, GATE DRIVING CIRCUIT, AND DISPLAY DEVICE

(71) Applicants: Hefei BOE Joint Technology Co., Ltd., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD, Beijing (CN)

( * ) Notice: Subject to any disclaimer, the term of this patent is extended or adjusted under 35 U.S.C. 154(b) by 42 days.

This patent is subject to a terminal disclaimer.

(21) Appl. No.: 18/773,836

(22) Filed: Jul. 16, 2024

(65) Prior Publication Data

US 2024/0371454 A1    Nov. 7, 2024

Related U.S. Application Data

(63) Continuation of application No. 17/791,597, filed as application No. PCT/CN2020/139714 on Dec. 26, 2020, now Pat. No. 12,080,364.

(51) Int. Cl.
*G11C 19/28*          (2006.01)
(52) U.S. Cl.
CPC ... *G11C 19/287* (2013.01); *G09G 2310/0286* (2013.01)
(58) Field of Classification Search
CPC ..... G11C 19/18; G11C 19/182; G11C 19/184; G11C 19/188; G11C 19/28; G11C 19/287; G11C 27/04; G09G 2310/0286
See application file for complete search history.

(56) References Cited

U.S. PATENT DOCUMENTS 11,475,824 B2 * 10/2022 Feng .................... G09G 3/3266
12,080,364 B2 *  9/2024 Feng ..................... G11C 19/28
(Continued)

FOREIGN PATENT DOCUMENTS

CN        105185292 A    12/2015
CN        106448607 A     2/2017
(Continued)

OTHER PUBLICATIONS

Non-Final Office Action received in corresponding U.S. Appl. No. 17/791,597, dated Dec. 21, 2023, 6 pages.
(Continued)

*Primary Examiner* — Long Nguyen
(74) *Attorney, Agent, or Firm* — Dority & Manning, P.A.

(57)          ABSTRACT

A shift register includes a first scan unit including a first input circuit and a first output circuit, and a second scan unit including a second input circuit, a second output circuit, and a fourth transistor. The first input circuit is electrically connected to an input signal terminal and a first pull-up node. The first output circuit is electrically connected to the first pull-up node, a first clock signal terminal, a second clock signal terminal, a shift signal terminal, and a first scan signal terminal. The second input circuit is electrically connected to the input signal terminal and a second pull-up node. The second output circuit is electrically connected to the second pull-up node, a third clock signal terminal, and a second scan signal terminal. The fourth transistor is electrically connected to the second pull-up node, a sub-clock signal terminal, and a dummy shift signal terminal.

20 Claims, 19 Drawing Sheets

(56) References Cited

U.S. PATENT DOCUMENTS

| | | | |
|---|---|---|---|
| 2011/0002438 A1 | 1/2011 | Kim | |
| 2011/0316834 A1 | 12/2011 | Lee et al. | |
| 2017/0301279 A1 | 10/2017 | Lee et al. | |
| 2018/0211627 A1 | 7/2018 | Shi et al. | |
| 2018/0337682 A1 | 11/2018 | Takasugi et al. | |
| 2020/0118509 A1 | 4/2020 | Noh et al. | |
| 2020/0243018 A1 | 7/2020 | Kim et al. | |
| 2021/0020090 A1* | 1/2021 | Shang | G11C 19/28 |
| 2021/0201774 A1 | 7/2021 | Feng et al. | |
| 2021/0201804 A1 | 7/2021 | Feng et al. | |
| 2021/0201807 A1 | 7/2021 | Feng et al. | |
| 2021/0209987 A1 | 7/2021 | Feng et al. | |
| 2021/0335203 A1 | 10/2021 | Feng et al. | |
| 2021/0335301 A1 | 10/2021 | Liang et al. | |
| 2022/0076609 A1 | 3/2022 | Feng et al. | |
| 2023/0041664 A1 | 2/2023 | Feng et al. | |

FOREIGN PATENT DOCUMENTS

| | | | |
|---|---|---|---|
| CN | 106683624 | A | 5/2017 |
| CN | 107452350 | A | 12/2017 |
| KR | 20060034059 | A | 4/2006 |
| KR | 20110123459 | A | 11/2011 |

OTHER PUBLICATIONS

Notice of Allowance received in corresponding U.S. Appl. No. 17/791,597, dated Apr. 17, 2024, 8 pages.

International Search Report and Written Opinion (with English translation) received in corresponding PCT Application No. PCT/CN2020/139714, dated Sep. 28, 2021, 25 pages.

Chinese First Office Action (with English translation) received in corresponding CN Application No. 202080003724.5, dated Feb. 15, 2023, 12 pages.

\* cited by examiner

2000

SHIFT REGISTER AND METHOD FOR DRIVING THE SAME, GATE DRIVING CIRCUIT, AND DISPLAY DEVICE

CROSS-REFERENCE TO RELATED APPLICATIONS

This application is a continuation of U.S. patent application Ser. No. 17/791,597, filed on Jul. 8, 2022, now U.S. Pat. No. 12,080,364, issued on Sep. 3, 2024, which claims priority to a national phase entry under 35 USC 371 of International Patent Application No. PCT/CN 2020/139714 filed on Dec. 26, 2020, which are incorporated herein by reference in their entirety.

TECHNICAL FIELD

The present disclosure relates to the field of display technologies, and in particular, to a shift register and a method for driving the same, a gate driving circuit, and a display device.

BACKGROUND

A gate driving circuit (also referred to as a scan driving circuit) is an important component of a display device. The gate driving circuit may include a plurality of stages of shift registers that are cascaded, and each stage of shift register is electrically connected to a gate line in a row in the display device. The gate driving circuit may input scan signals (also referred to as gate signals) to a plurality of gate lines in the display device row by row, so as to drive sub-pixels in each row in the display device to display image(s), so that the display device is able to display image(s).

The gate driving circuit is provided in the display device, which is able to effectively reduce a cost and improve a yield.

SUMMARY

In an aspect, a shift register is provided. The shift register includes a first scan unit and a second scan unit. The first scan unit includes a first input circuit and a first output circuit. The first input circuit is electrically connected to an input signal terminal and a first pull-up node. The first output circuit is electrically connected to the first pull-up node, a first clock signal terminal, a second clock signal terminal, a shift signal terminal, and a first scan signal terminal. The second scan unit includes a second input circuit, a second output circuit, and a fourth transistor. The second input circuit is electrically connected to the input signal terminal and a second pull-up node. The second output circuit is electrically connected to the second pull-up node, a third clock signal terminal, and a second scan signal terminal. A control electrode of the fourth transistor is electrically connected to the second pull-up node, a first electrode of the fourth transistor is electrically connected to a sub-clock signal terminal, and a second electrode of the fourth transistor is electrically connected to a dummy shift signal terminal. The sub-clock signal terminal is the third clock signal terminal electrically connected to the second output circuit.

In some embodiments, in a phase of outputting the first scan signal from the first scan signal terminal, the voltage of the first pull-up node is a first preset voltage. In the phase of outputting the second scan signal from the second scan signal terminal, the voltage of the second pull-up node is a second preset voltage. The first preset voltage is approximately equal to the second preset voltage.

In some embodiments, a coupling capacitance value of the first output circuit is approximately equal to a coupling capacitance value of the second output circuit and the fourth transistor.

In some embodiments, the first output circuit includes a first transistor, a second transistor, and a first capacitor. A control electrode of the first transistor is electrically connected to the first pull-up node, a first electrode of the first transistor is electrically connected to the first clock signal terminal, and a second electrode of the first transistor is electrically connected to the shift signal terminal. A control electrode of the second transistor is electrically connected to the first pull-up node, a first electrode of the second transistor is electrically connected to the second clock signal terminal, and a second electrode of the second transistor is electrically connected to the first scan signal terminal. A first terminal of the first capacitor is electrically connected to the first pull-up node, and a second terminal of the first capacitor is electrically connected to the first scan signal terminal. The second output circuit includes a third transistor and a second capacitor. A control electrode of the third transistor is electrically connected to the second pull-up node, a first electrode of the third transistor is electrically connected to the third clock signal terminal, and a second electrode of the third transistor is electrically connected to the second scan signal terminal. A first terminal of the second capacitor is electrically connected to the second pull-up node, and a second terminal of the second capacitor is electrically connected to the second scan signal terminal.

In some embodiments, the first output circuit is further electrically connected to a fifth clock signal terminal and a first sensing signal terminal. The first output circuit is further configured to transmit a fifth clock signal received at the fifth clock signal terminal to the first sensing signal terminal under the control of the voltage of the first pull-up node, so that a first sensing signal is output from the first sensing signal terminal. The second output circuit is further electrically connected to a sixth clock signal terminal and a second sensing signal terminal. The second output circuit is configured to transmit a sixth clock signal received at the sixth clock signal terminal to the second sensing signal terminal under the control of the voltage of the second pull-up node, so that a second sensing signal is output from the second sensing signal terminal.

In some embodiments, the first output circuit further includes a fifty-third transistor and a fourth capacitor. A control electrode of the fifty-third transistor is electrically connected to the first pull-up node, a first electrode of the fifty-third transistor is electrically connected to the fifth clock signal terminal, and a second electrode of the fifty-third transistor is electrically connected to the first sensing signal terminal. A first terminal of the fourth capacitor is electrically connected to the first pull-up node, and a second terminal of the fourth capacitor is electrically connected to the first sensing signal terminal. The second output circuit further includes a fifty-fourth transistor and a fifth capacitor. A control electrode of the fifty-fourth transistor is electrically connected to the second pull-up node, a first electrode of the fifty-fourth transistor is electrically connected to the sixth clock signal terminal, and a second electrode of the fifty-fourth transistor is electrically connected to the second sensing signal terminal. A first terminal of the fifth capacitor is electrically connected to the second pull-up node, and a second terminal of the fifth capacitor is electrically connected to the second sensing signal terminal.

In some embodiments, a sum of a width-to-length ratio of the first transistor and a width-to-length ratio of the second transistor is approximately equal to a sum of a width-to-length ratio of the third transistor and a width-to-length ratio of the fourth transistor. In a case where the first output circuit further includes the fifty-third transistor, and the second output circuit further includes the fifty-fourth transistor, a sum of the width-to-length ratio of the first transistor, the width-to-length ratio of the second transistor, and a width-to-length ratio of the fifty-third transistor is approximately equal to a sum of the width-to-length ratio of the third transistor, the width-to-length ratio of the fourth transistor, and a width-to-length ratio of the fifty-fourth transistor.

In some embodiments, a width-to-length ratio of the first transistor is approximately equal to one of a width-to-length ratio of the third transistor and a width-to-length ratio of the fourth transistor. A width-to-length ratio of the second transistor is approximately equal to another one of the width-to-length ratio of the third transistor and the width-to-length ratio of the fourth transistor. In a case where the first output circuit further includes the fifty-third transistor, and the second output circuit further includes the fifty-fourth transistor, the width-to-length ratio of the first transistor is approximately equal to one of the width-to-length ratio of the third transistor, the width-to-length ratio of the fourth transistor, and a width-to-length ratio of the fifty-fourth transistor. The width-to-length ratio of the second transistor is approximately equal to another one of the width-to-length ratio of the third transistor, the width-to-length ratio of the fourth transistor, and the width-to-length ratio of the fifty-fourth transistor. A width-to-length ratio of the fifty-third transistor is approximately equal to yet another one of the width-to-length ratio of the third transistor, the width-to-length ratio of the fourth transistor, and the width-to-length ratio of the fifty-fourth transistor.

In some embodiments, a width-to-length ratio of the first transistor, a width-to-length ratio of the second transistor, a width-to-length ratio of the third transistor, and a width-to-length ratio of the fourth transistor are approximately equal. In a case where the first output circuit further includes the fifty-third transistor, and the second output circuit further includes the fifty-fourth transistor, the width-to-length ratio of the first transistor, the width-to-length ratio of the second transistor, the width-to-length ratio of the third transistor, the width-to-length ratio of the fourth transistor, a width-to-length ratio of the fifty-third transistor, and a width-to-length ratio of the fifty-fourth transistor are approximately equal.

In some embodiments, a width-to-length ratio of the first transistor is in a range of 50:6 to 300:6, and a width-to-length ratio of the fourth transistor is in a range of 50:6 to 300:6. A width-to-length ratio of the second transistor is in a range of 300:6 to 3000:6, and a width-to-length ratio of the third transistor is in a range of 300:6 to 3000:6. In a case where the first output circuit further includes the fifty-third transistor, and the second output circuit further includes the fifty-fourth transistor, a width-to-length ratio of the fifty-third transistor is in a range of 300:6 to 3000:6, and a width-to-length ratio of the fifty-fourth transistor is in a range of 300:6 to 3000:6.

In some embodiments, the first scan unit further includes a first control circuit. The first control circuit is electrically connected to the first pull-up node, a first voltage signal terminal, a first pull-down node, and a second voltage signal terminal. The first control circuit is configured to control a voltage of the first pull-down node under one of a control of the voltage of the first pull-up node and a first voltage signal transmitted by the first voltage signal terminal and a control of the voltage of the first pull-up node and a second voltage signal transmitted by the second voltage signal terminal. The second scan unit further includes a second control circuit. The second control circuit is electrically connected to the second pull-up node, a third voltage signal terminal, a second pull-down node, and the second voltage signal terminal. The second control circuit is configured to control a voltage of the second pull-down node under one of a control of the voltage of the second pull-up node and a third voltage signal transmitted by the third voltage signal terminal and a control of the voltage of the second pull-up node and the second voltage signal transmitted by the second voltage signal terminal.

In some embodiments, the second scan unit further includes a third control circuit. The third control circuit is electrically connected to the first pull-down node, the second pull-down node, the second voltage signal terminal, and the dummy shift signal terminal. The third control circuit is configured to, under a control of one of the voltage of the first pull-down node and the voltage of the second pull-down node, transmit the second voltage signal transmitted by the second voltage signal terminal to the dummy shift signal terminal to control a voltage of the dummy shift signal terminal.

In some embodiments, the first control circuit includes a fifth transistor, a sixth transistor, a seventh transistor, and an eighth transistor. A control electrode of the fifth transistor is electrically connected to the first voltage signal terminal, a first electrode of the fifth transistor is electrically connected to the first voltage signal terminal, and a second electrode of the fifth transistor is electrically connected to a control electrode of the sixth transistor and a first electrode of the seventh transistor. A first electrode of the sixth transistor is electrically connected to the first voltage signal terminal, and a second electrode of the sixth transistor is electrically connected to the first pull-down node and a first electrode of the eighth transistor. A control electrode of the seventh transistor is electrically connected to the first pull-up node, and a second electrode of the seventh transistor is electrically connected to the second voltage signal terminal. A control electrode of the eighth transistor is electrically connected to the first pull-up node, and a second electrode of the eighth transistor is electrically connected to the second voltage signal terminal. The second control circuit includes a ninth transistor, a tenth transistor, an eleventh transistor, and a twelfth transistor. A control electrode of the ninth transistor is electrically connected to the third voltage signal terminal, a first electrode of the ninth transistor is electrically connected to the third voltage signal terminal, and a second electrode of the ninth transistor is electrically connected to a control electrode of the tenth transistor and a first electrode of the eleventh transistor. A first electrode of the tenth transistor is electrically connected to the third voltage signal terminal, and a second electrode of the tenth transistor is electrically connected to the second pull-down node and a first electrode of the twelfth transistor. A control electrode of the eleventh transistor is electrically connected to the second pull-up node, and a second electrode of the eleventh transistor is electrically connected to the second voltage signal terminal. A control electrode of the twelfth transistor is electrically connected to the second pull-up node, and a second electrode of the twelfth transistor is electrically connected to the second voltage signal terminal.

In some embodiments, the third control circuit includes a thirteenth transistor and a fourteenth transistor. A control electrode of the thirteenth transistor is electrically connected to the second pull-down node, a first electrode of the thirteenth transistor is electrically connected to the dummy shift signal terminal, and a second electrode of the thirteenth transistor is electrically connected to the second voltage signal terminal. A control electrode of the fourteenth transistor is electrically connected to the first pull-down node, a first electrode of the fourteenth transistor is electrically connected to the dummy shift signal terminal, and a second electrode of the fourteenth transistor is electrically connected to the second voltage signal terminal.

In some embodiments, the first scan unit further includes a first reset circuit, a second reset circuit, a third reset circuit, and a fourth reset circuit. The first reset circuit is electrically connected to the input signal terminal, the first pull-down node, and the second voltage signal terminal. The first reset circuit is configured to, under a control of the input signal transmitted by the input signal terminal, transmit the second voltage signal transmitted by the second voltage signal terminal to the first pull-down node to reset the first pull-down node. The second reset circuit is electrically connected to the first pull-down node, the second pull-down node, the first pull-up node, and the second voltage signal terminal. The second reset circuit is configured to, under a control of one of the voltage of the first pull-down node and the voltage of the second pull-down node, transmit the second voltage signal transmitted by the second voltage signal terminal to the first pull-up node to reset the first pull-up node. The third reset circuit is electrically connected to the first pull-down node, the second pull-down node, the shift signal terminal, the first scan signal terminal, the second voltage signal terminal, and a fourth voltage signal terminal. The third reset circuit is configured to, under the control of one of the voltage of the first pull-down node and the voltage of the second pull-down node, transmit the second voltage signal transmitted by the second voltage signal terminal to the shift signal terminal to reset the shift signal terminal, and transmit a fourth voltage signal transmitted by the fourth voltage signal terminal to the first scan signal terminal to reset the first scan signal terminal. The fourth reset circuit is electrically connected to a display reset signal terminal, the first pull-up node, and the second voltage signal terminal. The fourth reset circuit is configured to, under a control of a display reset signal transmitted by the display reset signal terminal, transmit the second voltage signal transmitted by the second voltage signal terminal to the first pull-up node to reset the first pull-up node. The second scan unit further includes a fifth reset circuit, a sixth reset circuit, a seventh reset circuit, and an eighth reset circuit. The fifth reset circuit is electrically connected to the input signal terminal, the second pull-down node, and the second voltage signal terminal. The fifth reset circuit is configured to, under the control of the input signal transmitted by the input signal terminal, transmit the second voltage signal transmitted by the second voltage signal terminal to the second pull-down node to reset the second pull-down node. The sixth reset circuit is electrically connected to the first pull-down node, the second pull-down node, the second pull-up node, and the second voltage signal terminal. The sixth reset circuit is configured to, under the control of one of the voltage of the first pull-down node and the voltage of the second pull-down node, transmit the second voltage signal transmitted by the second voltage signal terminal to the second pull-up node to reset the second pull-up node. The seventh reset circuit is electrically connected to the first pull-down node, the second pull-down node, the second scan signal terminal, and fourth voltage signal terminal. The seventh reset circuit is configured to, under the control of one of the voltage of the first pull-down node and the voltage of the second pull-down node, transmit the fourth voltage signal transmitted by the fourth voltage signal terminal to the second scan signal terminal to reset the second scan signal terminal. The eighth reset circuit is electrically connected to the display reset signal terminal, the second pull-up node, and the second voltage signal terminal. The eighth reset circuit is configured to, under the control of the display reset signal transmitted by the display reset signal terminal, transmit the second voltage signal transmitted by the second voltage signal terminal to the second pull-up node to reset the second pull-up node.

In some embodiments, the first reset circuit includes a fifteenth transistor. A control electrode of the fifteenth transistor is electrically connected to the input signal terminal, a first electrode of the fifteenth transistor is electrically connected to the first pull-down node, and a second electrode of the fifteenth transistor is electrically connected to the second voltage signal terminal. The second reset circuit includes a sixteenth transistor and a seventeenth transistor. A control electrode of the sixteenth transistor is electrically connected to the second pull-down node, a first electrode of the sixteenth transistor is electrically connected to the first pull-up node, and a second electrode of the sixteenth transistor is electrically connected to the second voltage signal terminal. A control electrode of the seventeenth transistor is electrically connected to the first pull-down node, a first electrode of the seventeenth transistor is electrically connected to the first pull-up node, and a second electrode of the seventeenth transistor is electrically connected to the second voltage signal terminal. The third reset circuit includes an eighteenth transistor, a nineteenth transistor, a twentieth transistor, and a twenty-first transistor. A control electrode of the eighteenth transistor is electrically connected to the first pull-down node, a first electrode of the eighteenth transistor is electrically connected to the shift signal terminal, and a second electrode of the eighteenth transistor is electrically connected to the second voltage signal terminal. A control electrode of the nineteenth transistor is electrically connected to the second pull-down node, a first electrode of the nineteenth transistor is electrically connected to the shift signal terminal, and a second electrode of the nineteenth transistor is electrically connected to the second voltage signal terminal. A control electrode of the twentieth transistor is electrically connected to the first pull-down node, a first electrode of the twentieth transistor is electrically connected to the first scan signal terminal, and a second electrode of the twentieth transistor is electrically connected to the fourth voltage signal terminal. A control electrode of the twenty-first transistor is electrically connected to the second pull-down node, a first electrode of the twenty-first transistor is electrically connected to the first scan signal terminal, and a second electrode of the twenty-first transistor is electrically connected to the fourth voltage signal terminal. The fourth reset circuit includes a twenty-second transistor. A control electrode of the twenty-second transistor is electrically connected to the display reset signal terminal, a first electrode of the twenty-second transistor is electrically connected to the first pull-up node, and a second electrode of the twenty-second transistor is electrically connected to the second voltage signal terminal. The fifth reset circuit includes a twenty-third transistor. A control electrode of the twenty-third transistor is electrically connected to the input signal terminal, a first electrode of the twenty-third transistor is electrically connected to the second pull-down node, and a second electrode of the twenty-third transistor is electrically connected to the second voltage signal terminal. The sixth reset circuit includes a twenty-fourth transistor and a twenty-fifth transistor. A control electrode of the twenty-fourth transistor is electrically connected to the first pull-down node, a first electrode of the twenty-fourth transistor is electrically connected to the second pull-up node, and a second electrode of the twenty-fourth transistor is electrically connected to the second voltage signal terminal. A control electrode of the twenty-fifth transistor is electrically connected to the second pull-down node, a first electrode of the twenty-fifth transistor is electrically connected to the second pull-up node, and a second electrode of the twenty-fifth transistor is electrically connected to the second voltage signal terminal.

The seventh reset circuit includes a twenty-sixth transistor and a twenty-seventh transistor. A control electrode of the twenty-sixth transistor is electrically connected to the second pull-down node, a first electrode of the twenty-sixth transistor is electrically connected to the second scan signal terminal, and a second electrode of the twenty-sixth transistor is electrically connected to the fourth voltage signal terminal. A control electrode of the twenty-seventh transistor is electrically connected to the first pull-down node, a first electrode of the twenty-seventh transistor is electrically connected to the second scan signal terminal, and a second electrode of the twenty-seventh transistor is electrically connected to the fourth voltage signal terminal. The eighth reset circuit includes a twenty-eighth transistor. A control electrode of the twenty-eighth transistor is electrically connected to the display reset signal terminal, a first electrode of the twenty-eighth transistor is electrically connected to the second pull-up node, and a second electrode of the twenty-eighth transistor is electrically connected to the second voltage signal terminal.

In some embodiments, in a case where the first output circuit is further electrically connected to the fifth clock signal terminal and the first sensing signal terminal, and the second output circuit is further electrically connected to the sixth clock signal terminal and the second sensing signal terminal, the third reset circuit is further electrically connected to the first sensing signal terminal, and the third reset circuit is further configured to reset the first sensing signal terminal under the control of one of the voltage of the first pull-down node and the voltage of the second pull-down node. The seventh reset circuit is further electrically connected to the second sensing signal terminal, and the seventh reset circuit is further configured to reset the second sensing signal terminal under the control of one of the voltage of the first pull-down node and the voltage of the second pull-down node.

In some embodiments, the third reset circuit further includes a fifty-fifth transistor and a fifty-sixth transistor. A control electrode of the fifty-fifth transistor is electrically connected to the first pull-down node, a first electrode of the fifty-fifth transistor is electrically connected to the first sensing signal terminal, and a second electrode of the fifty-fifth transistor is electrically connected to the fourth voltage signal terminal. A control electrode of the fifty-sixth transistor is electrically connected to the second pull-down node, a first electrode of the fifty-sixth transistor is electrically connected to the first sensing signal terminal, and a second electrode of the fifty-sixth transistor is electrically connected to the fourth voltage signal terminal. The seventh reset circuit further includes a fifty-seventh transistor and a fifty-eighth transistor. A control electrode of the fifty-seventh transistor is electrically connected to the second pull-down node, a first electrode of the fifty-seventh transistor is electrically connected to the second sensing signal terminal, and a second electrode of the fifty-seventh transistor is electrically connected to the fourth voltage signal terminal. A control electrode of the fifty-eighth transistor is electrically connected to the first pull-down node, a first electrode of the fifty-eighth transistor is electrically connected to the second sensing signal terminal, and a second electrode of the fifty-eighth transistor is electrically connected to the fourth voltage signal terminal.

In some embodiments, the first scan unit further includes a ninth reset circuit. The ninth reset circuit is electrically connected to a global reset signal terminal, the first pull-up node, and the second voltage signal terminal. The ninth reset circuit is configured to reset the first pull-up node under a control of a global reset signal transmitted by the global reset signal terminal. The second scan unit further includes a tenth reset circuit. The tenth reset circuit is electrically connected to the global reset signal terminal, the second pull-up node, and the second voltage signal terminal. The tenth reset circuit is configured to reset the second pull-up node under the control of the global reset signal transmitted by the global reset signal terminal.

In some embodiments, the ninth reset circuit includes a twenty-ninth transistor. A control electrode of the twenty-ninth transistor is electrically connected to the global reset signal terminal, a first electrode of the twenty-ninth transistor is electrically connected to the first pull-up node, and a second electrode of the twenty-ninth transistor is electrically connected to the second voltage signal terminal. The tenth reset circuit includes a thirtieth transistor. A control electrode of the thirtieth transistor is electrically connected to the global reset signal terminal, a first electrode of the thirtieth transistor is electrically connected to the second pull-up node, and a second electrode of the thirtieth transistor is electrically connected to the second voltage signal terminal.

In some embodiments, the shift register further includes a blanking input unit. The blanking input unit is electrically connected to a selection control signal terminal, the input signal terminal, a second voltage signal terminal, a fourth clock signal terminal, the first pull-up node, and the second pull-up node. The blanking input unit is configured to, under a control of a selection control signal transmitted by the selection control signal terminal and the input signal transmitted by the input signal terminal, transmit a fourth clock signal received at the fourth clock signal terminal to the first pull-up node and the second pull-up node.

In some embodiments, the blanking input unit includes a selection control circuit, a third input circuit, a first transmission circuit, and a second transmission circuit. The selection control circuit is electrically connected to the selection control signal terminal, the input signal terminal, the second voltage signal terminal, and a first blanking node. The selection control circuit is configured to transmit the input signal received at the input signal terminal to the first blanking node under the control of the selection control signal, and to maintain a voltage of the first blanking node under a control of the input signal received at the input signal terminal and a second voltage signal received at the second voltage signal terminal. The third input circuit is electrically connected to the first blanking node, the fourth clock signal terminal, and a second blanking node. The third input circuit is configured to transmit the fourth clock signal received at the fourth clock signal terminal to the second blanking node under a control of a voltage of the first blanking node. The first transmission circuit is electrically connected to the fourth clock signal terminal, the second blanking node, and the first pull-up node. The first transmission circuit is configured to transmit the fourth clock signal received at the second blanking node to the first pull-up node under a control of the fourth clock signal transmitted by the fourth clock signal terminal. The second transmission circuit is electrically connected to the fourth clock signal terminal, the second blanking node, and the second pull-up node. The second transmission circuit is configured to transmit the fourth clock signal received at the second blanking node to the second pull-up node under the control of the fourth clock signal transmitted by the fourth clock signal terminal.

In some embodiments, the selection control circuit includes a thirty-third transistor and a third capacitor. A control electrode of the thirty-third transistor is electrically connected to the selection control signal terminal, a first electrode of the thirty-third transistor is electrically connected to the input signal terminal, and a second electrode of the thirty-third transistor is electrically connected to the first blanking node. A first terminal of the third capacitor is electrically connected to the first blanking node, and a second terminal of the third capacitor is electrically connected to the second voltage signal terminal. The third input circuit includes a thirty-fourth transistor. A control electrode of the thirty-fourth transistor is electrically connected to the first blanking node, a first electrode of the thirty-fourth transistor is electrically connected to the fourth clock signal terminal, and a second electrode of the thirty-fourth transistor is electrically connected to the second blanking node. The first transmission circuit includes a thirty-fifth transistor. A control electrode of the thirty-fifth transistor is electrically connected to the fourth clock signal terminal, a first electrode of the thirty-fifth transistor is electrically connected to the second blanking node, and a second electrode of the thirty-fifth transistor is electrically connected to the first pull-up node. The second transmission circuit includes a thirty-sixth transistor. A control electrode of the thirty-sixth transistor is electrically connected to the fourth clock signal terminal, a first electrode of the thirty-sixth transistor is electrically connected to the second blanking node, and a second electrode of the thirty-sixth transistor is electrically connected to the second pull-up node.

In some embodiments, the first scan unit further includes an eleventh reset circuit. The eleventh reset circuit is electrically connected to the fourth clock signal terminal, the first blanking node, the first pull-down node, and the second voltage signal terminal. The eleventh reset circuit is configured, under a control of the fourth clock signal transmitted by the fourth clock signal terminal and the voltage of the first blanking node, transmit the second voltage signal transmitted by the second voltage signal terminal to the first pull-down node to reset the first pull-down node. The second scan unit further includes a twelfth reset circuit. The twelfth reset circuit is electrically connected to the fourth clock signal terminal, the first blanking node, the second pull-down node, and the second voltage signal terminal. The twelfth reset circuit is configured to, under a control of the fourth clock signal transmitted by the fourth clock signal terminal and the voltage of the first blanking node, transmit the second voltage signal transmitted by the second voltage signal terminal to the second pull-down node to reset the second pull-down node.

In some embodiments, the eleventh reset circuit includes a fifty-ninth transistor and a sixtieth transistor. A control electrode of the fifty-ninth transistor is electrically connected to the fourth clock signal terminal, a first electrode of the fifty-ninth transistor is electrically connected to the first pull-down node, and a second electrode of the fifty-ninth transistor is electrically connected to a first electrode of the sixtieth transistor. A control electrode of the sixtieth transistor is electrically connected to the first blanking node, and a second electrode of the sixtieth transistor is electrically connected to the second voltage signal terminal. The twelfth reset circuit includes a sixty-first transistor and a sixty-second transistor. A control electrode of the sixty-first transistor is electrically connected to the fourth clock signal terminal, a first electrode of the sixty-first transistor is electrically connected to the second pull-down node, and a second electrode of the sixty-first transistor is electrically connected to a first electrode of the sixty-second transistor. A control electrode of the sixty-second transistor is electrically connected to the first blanking node, and a second electrode of the sixty-second transistor is electrically connected to the second voltage signal terminal.

In some embodiments, the blanking input unit further includes a first leakage prevention circuit. The first leakage prevention circuit is electrically connected to the first blanking node, a fifth voltage signal terminal, and a first leakage prevention node. The first leakage prevention circuit is configured to transmit a fifth voltage signal received at the fifth voltage signal terminal to the first leakage prevention node under the control of the voltage of the first blanking node. The selection control circuit is further electrically connected to the first leakage prevention node.

In some embodiments, the first leakage prevention circuit includes a thirty-seventh transistor. A control electrode of the thirty-seventh transistor is electrically connected to the first blanking node, a first electrode of the thirty-seventh transistor is electrically connected to the fifth voltage signal terminal, and a second electrode of the thirty-seventh transistor is electrically connected to the first leakage prevention node. The selection control circuit further includes a thirty-eighth transistor. A control electrode of the thirty-eighth transistor is electrically connected to the selection control signal terminal, a first electrode of the thirty-eighth transistor is electrically connected to the first leakage prevention node, and a second electrode of the thirty-eighth transistor is electrically connected to the first blanking node. The second electrode of the thirty-third transistor is electrically connected to the first leakage prevention node, and is electrically connected to the first blanking node through the thirty-eighth transistor.

In some embodiments, the shift register further includes a leakage prevention unit, and the leakage prevention unit includes a second leakage prevention circuit. The second leakage prevention circuit is electrically connected to the first pull-up node, a second leakage prevention node, and a fifth voltage signal terminal. The second leakage prevention circuit is configured to transmit a fifth voltage signal received at the fifth voltage signal terminal to the second leakage prevention node under the control of the voltage of the first pull-up node. In a case where the first scan unit further includes the second reset circuit, the second reset circuit is further electrically connected to the second leakage prevention node. In a case where the first scan unit further includes the fourth reset circuit, the fourth reset circuit is further electrically connected to the second leakage prevention node. In a case where the first scan unit further includes the ninth reset circuit, the ninth reset circuit is further electrically connected to the second leakage prevention node. In a case where the second scan unit further includes the sixth reset circuit, the sixth reset circuit is further electrically connected to the second leakage prevention node. In a case where the second scan unit further includes the eighth reset circuit, the eighth reset circuit is further electrically connected to the second leakage prevention node. In a case where the second scan unit further includes the tenth reset circuit, the tenth reset circuit is further electrically connected to the second leakage prevention node. In a case where the shift register further includes the blanking input unit, and the blanking input unit includes the first transmission circuit and the second transmission circuit, the first transmission circuit is further electrically connected to the second leakage prevention node, and the second transmission circuit is further electrically connected to the second leakage prevention node.

In some embodiments, the second leakage prevention circuit includes a thirty-ninth transistor. A control electrode of the thirty-ninth transistor is electrically connected to the first pull-up node, a first electrode of the thirty-ninth transistor is electrically connected to the fifth voltage signal terminal, and a second electrode of the thirty-ninth transistor is electrically connected to the second leakage prevention node. If the second reset circuit is electrically connected to the second leakage prevention node, the second reset circuit further includes a fortieth transistor and a forty-first transistor. A control electrode of the fortieth transistor is electrically connected to the second pull-down node, a first electrode of the fortieth transistor is electrically connected to the second leakage prevention node, and a second electrode of the fortieth transistor is electrically connected to the second voltage signal terminal. The second electrode of the sixteenth transistor is electrically connected to the second leakage prevention node, and is electrically connected to the second voltage signal terminal through the fortieth transistor. A control electrode of the forty-first transistor is electrically connected to the first pull-down node, a first electrode of the forty-first transistor is electrically connected to the second leakage prevention node, and a second electrode of the forty-first transistor is electrically connected to the second voltage signal terminal. The second electrode of the seventeenth transistor is electrically connected to the second leakage prevention node, and is electrically connected to the second voltage signal terminal through the forty-first transistor. If the fourth reset circuit is electrically connected to the second leakage prevention node, the fourth reset circuit further includes a forty-second transistor. A control electrode of the forty-second transistor is electrically connected to the display reset signal terminal, a first electrode of the forty-second transistor is electrically connected to the second leakage prevention node, and a second electrode of the forty-second transistor is electrically connected to the second voltage signal terminal. The second electrode of the twenty-second transistor is electrically connected to the second leakage prevention node, and is electrically connected to the second voltage signal terminal through the forty-second transistor. If the ninth reset circuit is electrically connected to the second leakage prevention node, the ninth reset circuit further includes a forty-third transistor. A control electrode of the forty-third transistor is electrically connected to the global reset signal terminal, a first electrode of the forty-third transistor is electrically connected to the second leakage prevention node, and a second electrode of the forty-third transistor is electrically connected to the second voltage signal terminal. The second electrode of the twenty-ninth transistor is electrically connected to the second leakage prevention node, and is electrically connected to the second voltage signal terminal through the forty-third transistor. If the sixth reset circuit is electrically connected to the second leakage prevention node, in the sixth reset circuit, the second electrode of the twenty-fourth transistor is electrically connected to the second leakage prevention node, and is electrically connected to the second voltage signal terminal through the forty-first transistor. The second electrode of the twenty-fifth transistor is electrically connected to the second leakage prevention node, and is electrically connected to the second voltage signal terminal through the fortieth transistor. If the eighth reset circuit is electrically connected to the second leakage prevention node, in the eighth reset circuit, the second electrode of the twenty-eighth transistor is electrically connected to the second leakage prevention node, and is electrically connected to the second voltage signal terminal through the forty-second transistor. If the tenth reset circuit is electrically connected to the second leakage prevention node, in the tenth reset circuit, the second electrode of the thirtieth transistor is electrically connected to the second leakage prevention node, and is electrically connected to the second voltage signal terminal through the forty-third transistor. If the first transmission circuit and the second transmission circuit are electrically connected to the second leakage prevention node, the first transmission circuit further includes a forty-ninth transistor. A control electrode of the forty-ninth transistor is electrically connected to the fourth clock signal terminal, a first electrode of the forty-ninth transistor is electrically connected to the second leakage prevention node, and a second electrode of the forty-ninth transistor is electrically connected to the first pull-up node. The second electrode of the thirty-fifth transistor is electrically connected to the second leakage prevention node, and is electrically connected to the first pull-up node through the forty-ninth transistor. In the second transmission circuit, the first electrode of the thirty-sixth transistor is electrically connected to the second leakage prevention node, and is electrically connected to the second blanking node through the thirty-fifth transistor.

In some embodiments, the shift register further includes a leakage prevention unit, and the leakage prevention unit includes a third leakage prevention circuit and a fourth leakage prevention circuit. The third leakage prevention circuit is electrically connected to the first pull-up node, a second leakage prevention node, and a fifth voltage signal terminal. The third leakage prevention circuit is configured to transmit a fifth voltage signal received at the fifth voltage signal terminal to the second leakage prevention node under the control of the voltage of the first pull-up node. The fourth leakage prevention circuit is electrically connected to the second pull-up node, a third leakage prevention node, and the fifth voltage signal terminal. The fourth leakage prevention circuit is configured to transmit the fifth voltage signal received at the fifth voltage signal terminal to the third leakage prevention node under the control of the voltage of the second pull-up node. In a case where the first scan unit further includes the second reset circuit, the second reset circuit is further electrically connected to the second leakage prevention node. In a case where the first scan unit further includes the fourth reset circuit, the fourth reset circuit is further electrically connected to the second leakage prevention node. In a case where the first scan unit further includes the ninth reset circuit, the ninth reset circuit is further electrically connected to the second leakage prevention node. In a case where the second scan unit further includes the sixth reset circuit, the sixth reset circuit is further electrically connected to the third leakage prevention node. In a case where the second scan unit further includes the eighth reset circuit, the eighth reset circuit is further electrically connected to the third leakage prevention node. In a case where the second scan unit further includes the tenth reset circuit, the tenth reset circuit is further electrically connected to the third leakage prevention node. In a case where the shift register further includes the blanking input unit, and the blanking input unit includes the first transmission circuit and the second transmission circuit, the first transmission circuit is further electrically connected to the second leakage prevention node, and the second transmission circuit is further electrically connected to the third leakage prevention node.

In some embodiments, the third leakage prevention circuit includes a sixty-third transistor. A control electrode of the sixty-third transistor is electrically connected to the first pull-up node, a first electrode of the sixty-third transistor is electrically connected to the fifth voltage signal terminal, and a second electrode of the sixty-third transistor is electrically connected to the second leakage prevention node. If the second reset circuit is further electrically connected to the second leakage prevention node, the second reset circuit further includes a fortieth transistor and a forty-first transistor. A control electrode of the fortieth transistor is electrically connected to the second pull-down node, a first electrode of the fortieth transistor is electrically connected to the second leakage prevention node, and a second electrode of the fortieth transistor is electrically connected to the second voltage signal terminal. The second electrode of the sixteenth transistor is electrically connected to the second leakage prevention node, and is electrically connected to the second voltage signal terminal through the fortieth transistor. A control electrode of the forty-first transistor is electrically connected to the first pull-down node, a first electrode of the forty-first transistor is electrically connected to the second leakage prevention node, and a second electrode of the forty-first transistor is electrically connected to the second voltage signal terminal. The second electrode of the seventeenth transistor is electrically connected to the second leakage prevention node, and is electrically connected to the second voltage signal terminal through the forty-first transistor. If the fourth reset circuit is further electrically connected to the second leakage prevention node, the fourth reset circuit further includes a forty-second transistor. A control electrode of the forty-second transistor is electrically connected to the display reset signal terminal, a first electrode of the forty-second transistor is electrically connected to the second leakage prevention node, and a second electrode of the forty-second transistor is electrically connected to the second voltage signal terminal. The second electrode of the twenty-second transistor is electrically connected to the second leakage prevention node, and is electrically connected to the second voltage signal terminal through the forty-second transistor. If the ninth reset circuit is further electrically connected to the second leakage prevention node, the ninth reset circuit further includes a forty-third transistor. A control electrode of the forty-third transistor is electrically connected to the global reset signal terminal, a first electrode of the forty-third transistor is electrically connected to the second leakage prevention node, and a second electrode of the forty-third transistor is electrically connected to the second voltage signal terminal. The second electrode of the twenty-ninth transistor is electrically connected to the second leakage prevention node, and is electrically connected to the second voltage signal terminal through the forty-third transistor. The fourth leakage prevention circuit includes a forty-fourth transistor. A control electrode of the forty-fourth transistor is electrically connected to the second pull-up node, a first electrode of the forty-fourth transistor is electrically connected to the fifth voltage signal terminal, and a second electrode of the forty-fourth transistor is electrically connected to the third leakage prevention node. If the sixth reset circuit is further electrically connected to the third leakage prevention node, the sixth reset circuit further includes a forty-fifth transistor and a forty-sixth transistor. A control electrode of the forty-fifth transistor is electrically connected to the first pull-down node, a first electrode of the forty-fifth transistor is electrically connected to the third leakage prevention node, and a second electrode of the forty-fifth transistor is electrically connected to the second voltage signal terminal. The second electrode of the twenty-fourth transistor is electrically connected to the third leakage prevention node, and is electrically connected to the second voltage signal terminal through the forty-fifth transistor. A control electrode of the forty-sixth transistor is electrically connected to the second pull-down node, a first electrode of the forty-sixth transistor is electrically connected to the third leakage prevention node, and a second electrode of the forty-sixth transistor is electrically connected to the second voltage signal terminal. The second electrode of the twenty-fifth transistor is electrically connected to the third leakage prevention node, and is electrically connected to the second voltage signal terminal through the forty-sixth transistor. If the eighth reset circuit is further electrically connected to the third leakage prevention node, the eighth reset circuit further includes a forty-seventh transistor. A control electrode of the forty-seventh transistor is electrically connected to the display reset signal terminal, a first electrode of the forty-seventh transistor is electrically connected to the third leakage prevention node, and a second electrode of the forty-seventh transistor is electrically connected to the second voltage signal terminal. The second electrode of the twenty-eighth transistor is electrically connected to the third leakage prevention node, and is electrically connected to the second voltage signal terminal through the forty-seventh transistor. If the tenth reset circuit is further electrically connected to the third leakage prevention node, the tenth reset circuit further includes a forty-eighth transistor. A control electrode of the forty-eighth transistor is electrically connected to the global reset signal terminal, a first electrode of the forty-eighth transistor is electrically connected to the third leakage prevention node, and a second electrode of the forty-eighth transistor is electrically connected to the second voltage signal terminal. The second electrode of the thirtieth transistor is electrically connected to the third leakage prevention node, and is electrically connected to the second voltage signal terminal through the forty-eighth transistor. If the first transmission circuit is electrically connected to the second leakage prevention node, and the second transmission circuit is electrically connected to the third leakage prevention node, the first transmission circuit further includes a forty-ninth transistor. A control electrode of the forty-ninth transistor is electrically connected to the fourth clock signal terminal, a first electrode of the forty-ninth transistor is electrically connected to the second leakage prevention node, and a second electrode of the forty-ninth transistor is electrically connected to the first pull-up node. The second electrode of the thirty-fifth transistor is electrically connected to the second leakage prevention node, and is electrically connected to the first pull-up node through the forty-ninth transistor. The second transmission circuit further includes a fiftieth transistor. A control electrode of the fiftieth transistor is electrically connected to the fourth clock signal terminal, a first electrode of the fiftieth transistor is electrically connected to the third leakage prevention node, and a second electrode of the fiftieth transistor is electrically connected to the second pull-up node. The second electrode of the thirty-sixth transistor is electrically connected to the third leakage prevention node, and is electrically connected to the second pull-up node through the fiftieth transistor.

In yet another aspect, a gate driving circuit is provided. The gate driving circuit includes N stages of shift registers that are cascaded in any one of the above embodiments. N is a positive integer.

In yet another aspect, a display device is provided. The display device includes the gate driving circuit in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, and an actual process of a method involved in the embodiments of the present disclosure.

DETAILED DESCRIPTION

Figure 1:
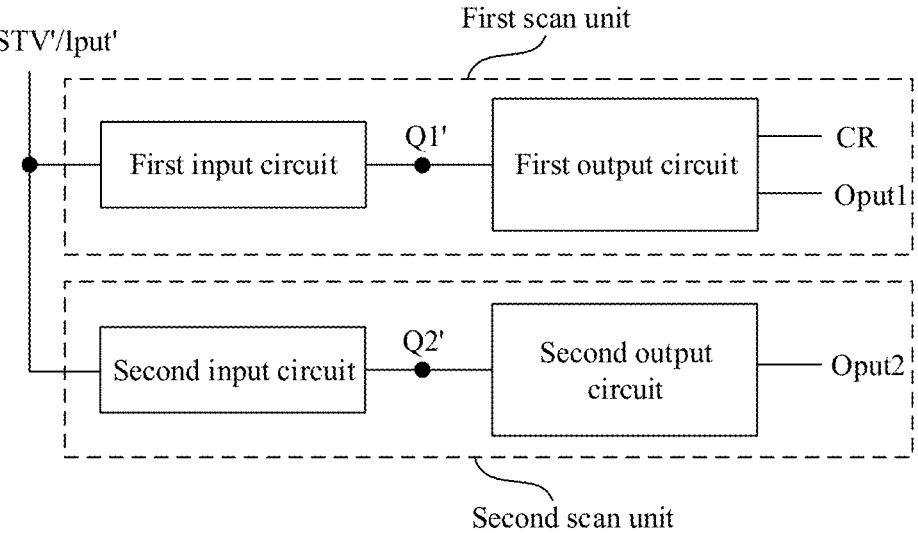
FIG. 1 is a structural diagram of a shift register, in accordance with an implementation.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", both including the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" means openness and inclusiveness, since a process, step, calculation or other action that is "based on" one or more of the stated conditions or values may, in practice, be based on additional conditions or values exceeding those stated.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors used in circuits in the embodiments of the present disclosure may be thin film transistors, field effect transistors, or other switching devices with same characteristics. In the embodiments of the present disclosure, a description will be made considering the thin film transistors as an example.

In some embodiments, a control electrode of each transistor used in a shift register is a gate of the transistor, a first electrode of the transistor is one of a source and a drain of the transistor, and a second electrode of the transistor is another one of the source and the drain of the transistor. Since the source and the drain of the transistor may be symmetrical in structure, the source and the drain of the transistor may be same in structure. That is, the first electrode and the second electrode of the transistor in the embodiments of the present disclosure may be same in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits in the embodiments of the present disclosure, nodes such as a first pull-up node, a second pull-up node, a first pull-down node and a second pull-down node do not represent actual components, but represent junctions of related electrical connections in circuit diagrams. That is, these nodes are nodes that are equivalent to the junctions of the related electrical connections in the circuit diagrams.

Below, the circuits in the embodiments of the present disclosure will be described in an example where the transistors are all N-type transistors.

In the embodiments of the present disclosure, the term "pull-up" refers to charging a node or an electrode of a transistor, so that an absolute value of a voltage of the node or the electrode is increased, thereby operating (e.g., turning on) a corresponding transistor. The term "pull-down" refers to discharging a node or an electrode of a transistor, so that an absolute value of a voltage of the node or the electrode is reduced, thereby operating (e.g., turning off) a corresponding transistor.

In the related art, each shift register may include two scan units. The two scan units are electrically connected to gate lines in two adjacent rows (i.e., a gate line in an odd-numbered row and a gate line in an even-numbered row that are adjacent to each other), respectively, and input scan signals to the gate lines in the two rows, respectively, so that the gate line in the odd-numbered row and the gate line in the even-numbered row share the shift register. In this way, the number of signal lines is able to be effectively reduced, and an occupied area of a gate driving circuit in a display device is reduced, thereby reducing a bezel size of the display device to realize a narrow bezel design.

Figure 2:
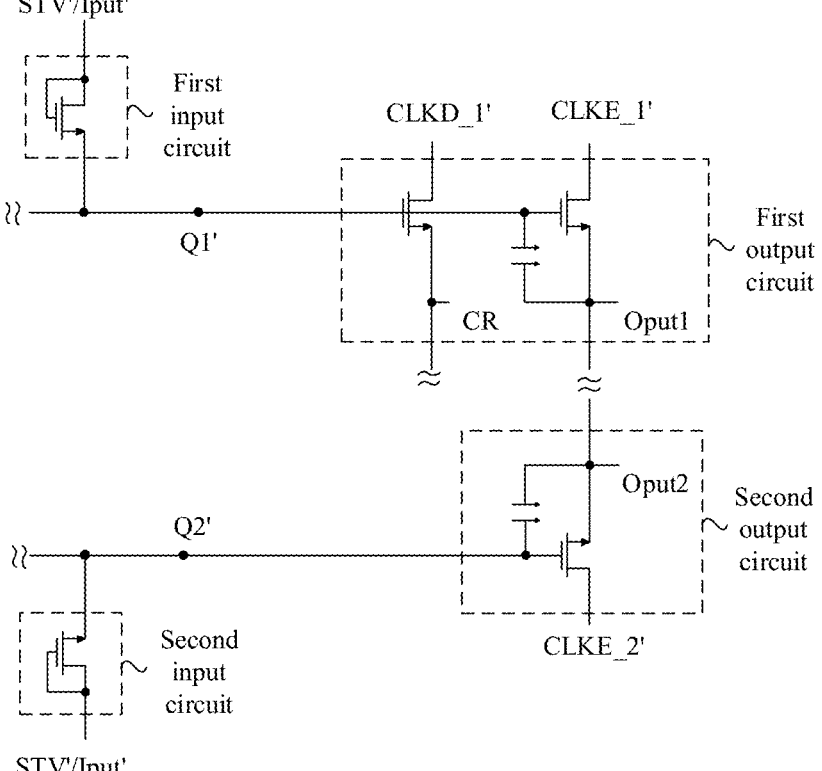
FIG. 2 is a circuit diagram of a shift register, in accordance with an implementation.

In an implementation, a structure of the shift register may be as shown in FIGS. 1 and 2, and the two scan units included in the shift register may be referred to as a first scan unit and a second scan unit. The first scan unit includes a first input circuit and a first output circuit electrically connected to the first input circuit. The first output circuit may be electrically connected to the gate line in the odd-numbered row, and output a first scan signal to the corresponding gate line in the odd-numbered row through a first scan signal terminal Output1 (Oput1 in the figures and in the following). The second scan unit includes a second input circuit and a second output circuit electrically connected to the second input circuit. The second output circuit may be electrically connected to the gate line in the even-numbered row, and output a second scan signal to the corresponding gate line in the even-numbered row through a second scan signal terminal Output2 (Oput2 in the figures and in the following).

After a plurality of shift registers are cascaded to from the gate driving circuit, the gate driving circuit is able to be used for driving the display device to display image(s). The first scan unit in an N-th stage shift register may further be electrically connected to an input signal terminal Input' (Iput' in the figures and in the following) in an (N+1)-th stage shift register through a shift signal terminal CR, so that a shift signal output from the shift signal terminal CR serves as an input signal of the (N+1)-th stage shift register, where N is an integer greater than or equal to 1 (i.e., N≥1).

Figures 3, 4:
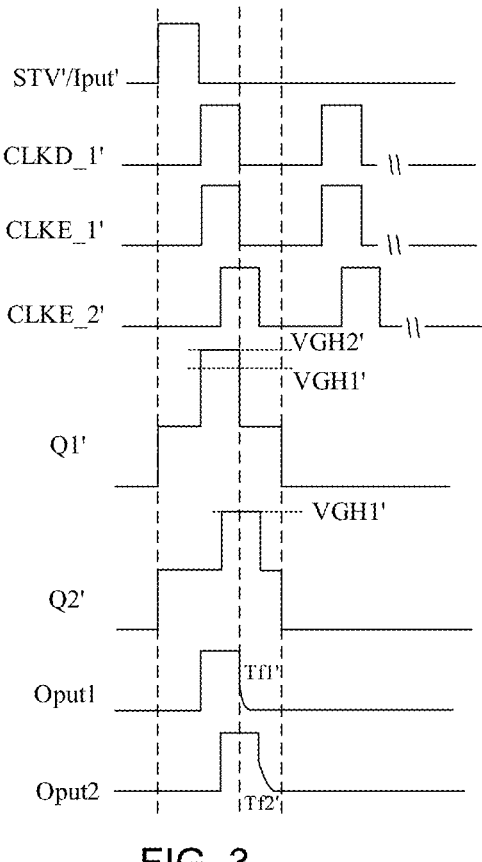
FIG. 3 is a timing control diagram corresponding to the shift register shown in FIG. 2, in accordance with an implementation.
FIG. 4 is a structural diagram of a display device, in accordance with some embodiments of the present disclosure.

It will be noted that as shown in FIGS. 2 and 3, in a case where a high level signal is input to the input signal terminal Iput' and the first input circuit is turned on, a voltage of a first pull-up node Q1' in the first scan unit is pulled high, and the first output circuit may be turned on under a control of the voltage of the first pull-up node Q1', so that the shift signal is output from the shift signal terminal CR, and the first scan signal is output from the first scan signal terminal Oput1. The voltage of the first pull-up node Q1' may be further increased under a bootstrap action of the first output circuit, e.g., to VGH2' as shown in FIG. 3. In a case where a high level signal is input to the input signal terminal Iput' and the second input circuit is turned on, a voltage of a second pull-up node Q2' in the second scan unit is pulled high, and the second output circuit may be turned on under a control of the voltage of the second pull-up node Q2', so that the second scan signal is output from the second scan signal terminal Oput2. The voltage of the second pull-up node Q2' may be further increased under a bootstrap action of the second output circuit, e.g., to VGH1' as shown in FIG. 3.

Since the first scan unit is required to output the shift signal and the first scan signal, and the second scan unit only outputs the second scan signal, a structure of the first output circuit is more complex than a structure of the second output circuit, so that the number of transistors included in the first output circuit is greater than the number of transistors included in the second output circuit. In this way, the bootstrap action of the first output circuit is stronger than the bootstrap action of the second output circuit, which causes the voltage of the first pull-up node Q1 to increase more than the voltage of the second pull-up node Q2. That is, VGH2' is greater than VGH1'. As a result, a falling edge time Tf1' of the first scan signal output from the first scan signal terminal Oput1 is earlier than a falling edge time Tf2' of the second scan signal output from the second scan signal terminal Oput2. In a display process of the display device, a cross striation phenomenon easily occurs due to a fact that the falling edge time of the first scan signal input to the gate line in the odd-numbered row is inconsistent with the falling edge time of the second scan signal input to the gate line in the even-numbered row, thereby affecting the display effect.

Based on this, some embodiments of the present disclosure provide a shift register and a method for driving the same, a gate driving circuit, and a display device. The shift register, the method for driving the shift register, the gate driving circuit, and the display device will be described below.

Some embodiments of the present disclosure provide the display device 2000, as shown in FIG. 4. The display device may be any device that displays images whether moving (e.g., videos) or stationary (e.g., sill images). It is contemplated that the embodiments may be implemented in, or associated with, a variety of electronic devices. The variety of electronic devices are, for example (but not limited to), mobile phones, wireless devices, personal digital assistants (PDAs), hand-held or portable computers, global positioning system (GPS) receivers/navigators, cameras, MP4 video players, camcorders, game consoles, watches, clocks, calculators, TV monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

In some examples, the display device 2000 includes a frame, and a display panel PNL, a circuit board, a display driving integrated circuit (IC) and other electronic accessories that are disposed in the frame.

The display panel may be, for example, an organic light-emitting diode (OLED) display panel, a quantum dot light-emitting diode (QLED) display panel, or a micro light-emitting diode (Micro LED) display panel, which is not limited.

Some embodiments of the present disclosure will be schematically described below in an example where the display panel is the OLED display panel.

Figure 5:
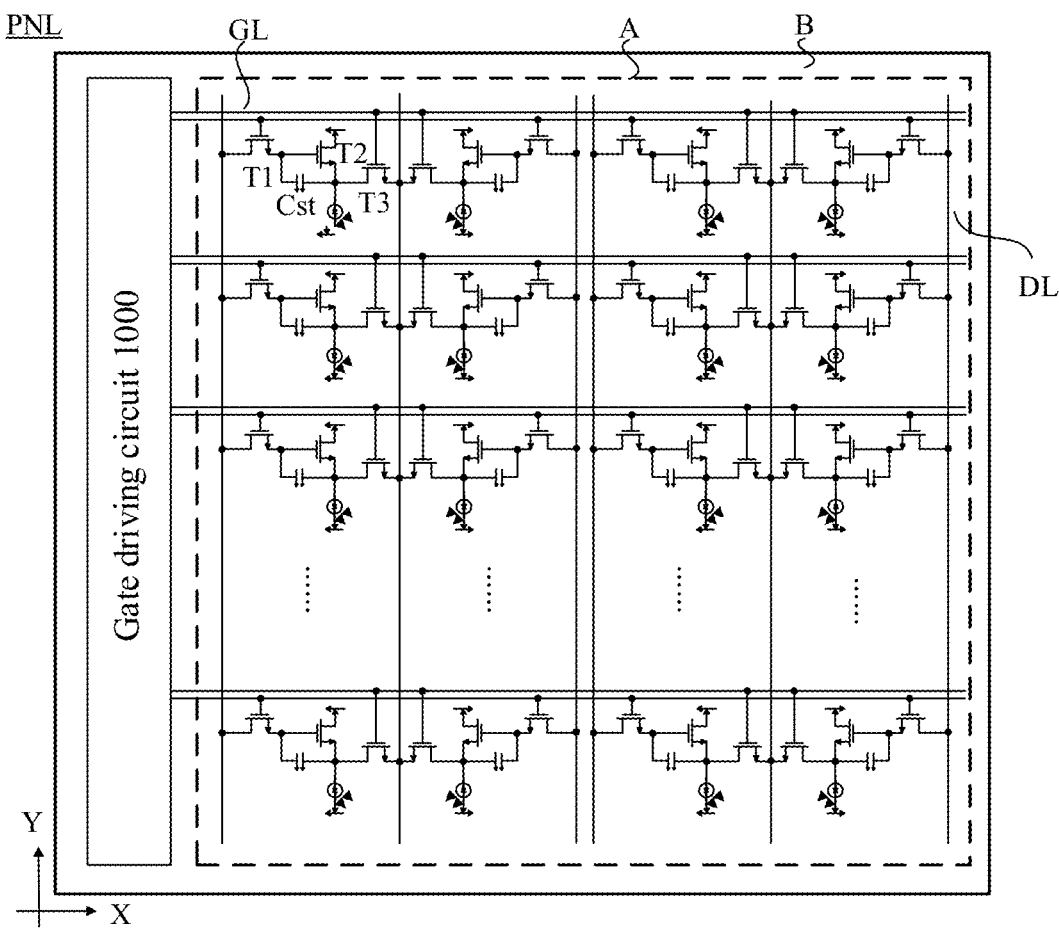
FIG. 5 is a structural diagram of a display panel, in accordance with some embodiments of the present disclosure.
Figure 6:
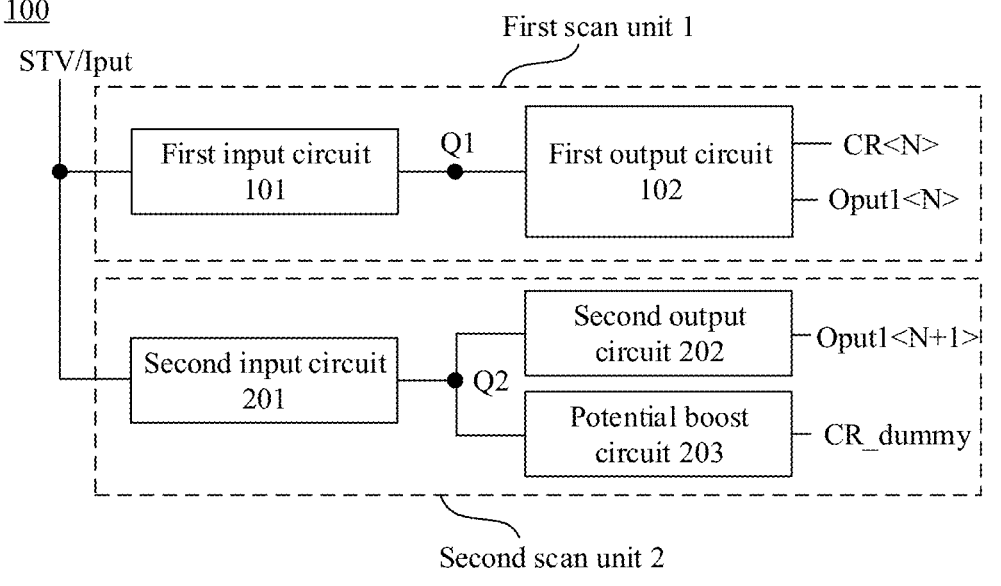
FIG. 6 is a structural diagram of a shift register, in accordance with some embodiments of the present disclosure.
Figure 7:
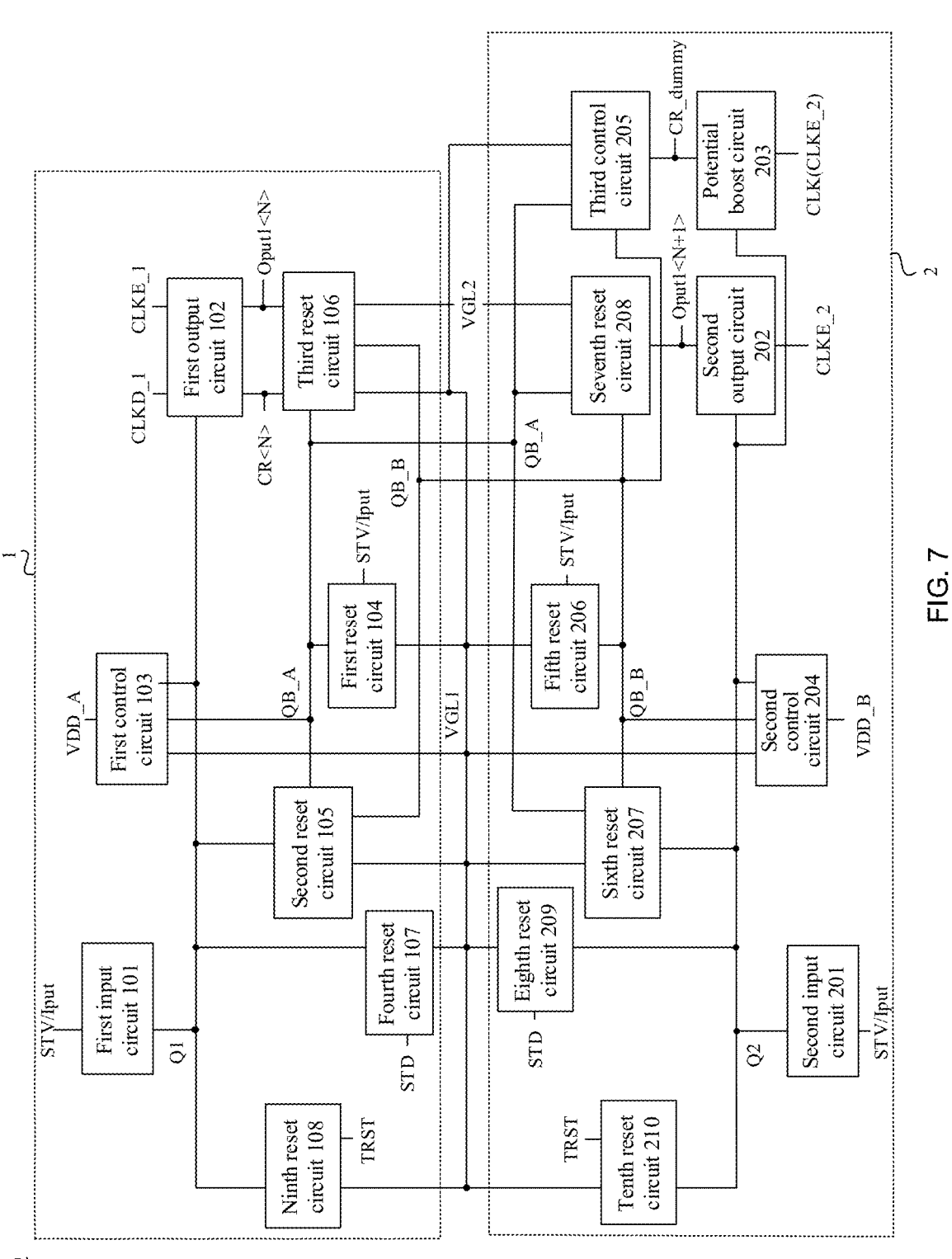
FIG. 7 is a structural diagram of another shift register, in accordance with some embodiments of the present disclosure.
Figure 8:
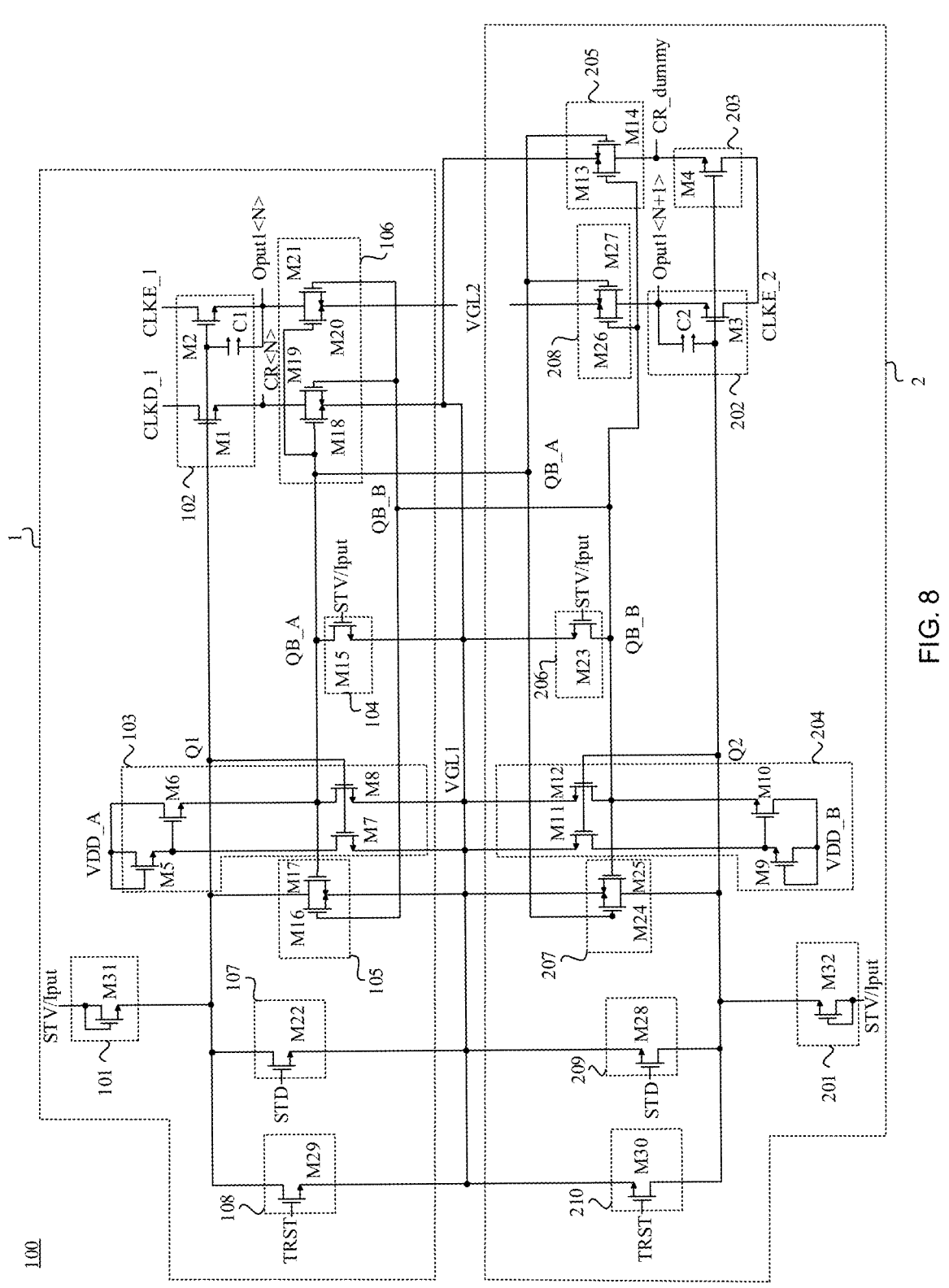
FIG. 8 is a circuit diagram of a shift register, in accordance with some embodiments of the present disclosure.
Figure 9:
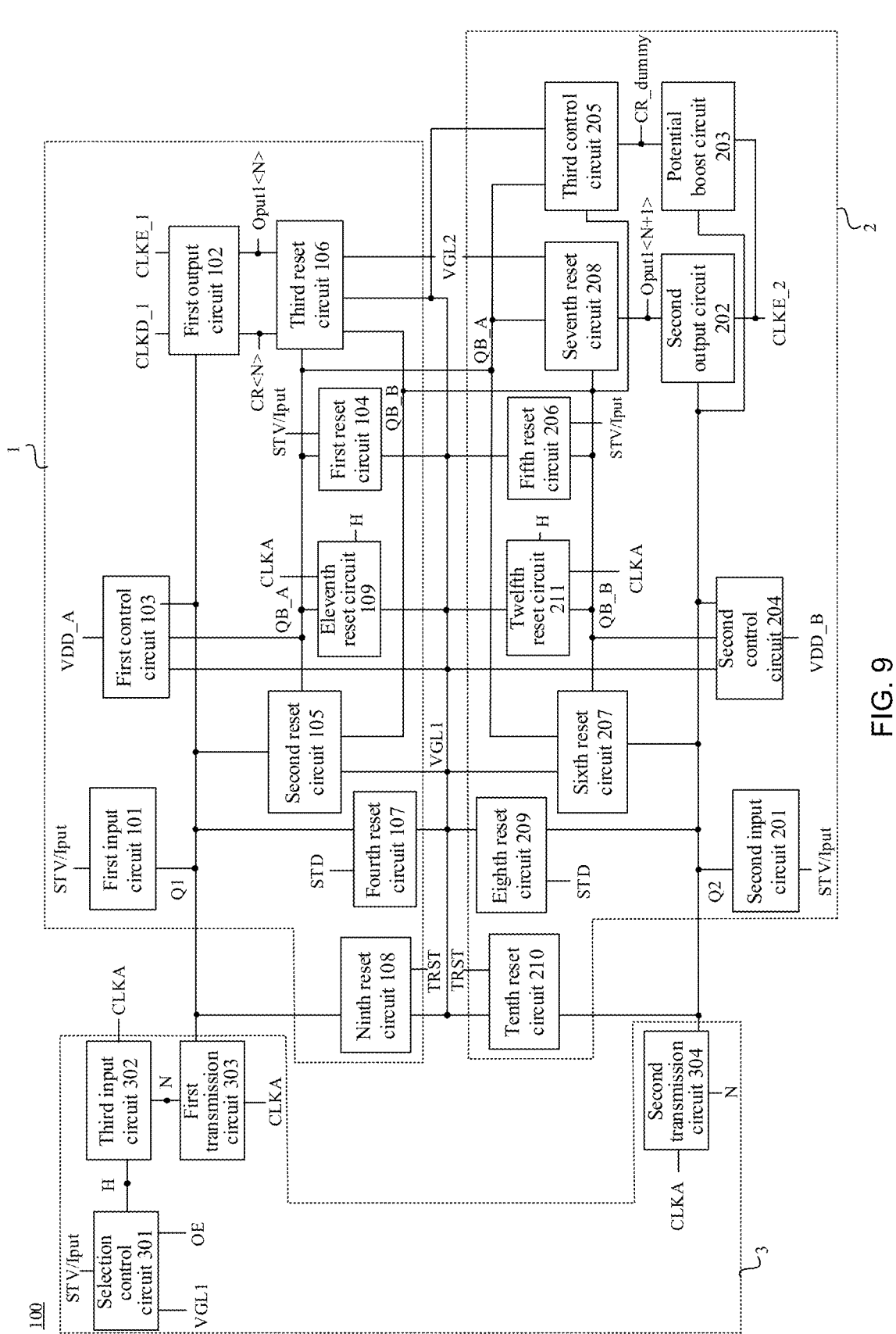
FIG. 9 is a structural diagram of yet another shift register, in accordance with some embodiments of the present disclosure.

In some embodiments, as shown in FIG. 5, the display panel PNL has a display area A and a bezel area B disposed on side(s) of the display area A. The "side(s)" refers to a side, two sides, three sides, or a peripheral side of the display area A. That is, the bezel area B may be located on a side, two sides, or three sides of the display area A. Or, the bezel area B may be arranged around the display area A.

In some examples, as shown in FIG. 5, the display panel PNL may include a plurality of sub-pixels, a plurality of gate lines GL extending in a first direction X, and a plurality of data lines DL extending in a second direction Y, which are disposed in the display area A.

For example, sub-pixels arranged in line in the first direction X may be referred to as sub-pixels in a same row, and sub-pixels P arranged in line in the second direction Y may be referred to as sub-pixels in a same column. The sub-pixels in the same row may be electrically connected to at least one gate line GL, and the sub-pixels in the same column may be electrically connected to a data line DL. The number of the gate line(s) GL electrically connected to the sub-pixels in the same row may be set according to a structure of the sub-pixel.

In some examples, as shown in FIG. 5, the gate driving circuit 1000 may be disposed in the bezel area B, and located on a side in an extending direction of the plurality of gate lines GL. The gate driving circuit 1000 may be electrically connected to the plurality of gate lines GL, and output scan signals to the plurality of gate lines GL, so as to drive the plurality of sub-pixels for image display.

In some examples, the gate driving circuit 1000 may be a gate driving IC. Of course, the gate driving circuit 1000 may also be a gate driver on array (GOA) circuit. That is, the gate driving circuit 1000 is directly integrated into an array substrate in the display panel PNL. The gate driving circuit 1000 is provided as the GOA circuit, which may reduce a manufacturing cost of the display panel PNL, and in addition, may further reduce a bezel size of the display panel PNL to realize a narrow bezel design. Following embodiments will be described in an example where the gate driving circuit 1000 is the GOA circuit.

In the shift register 100 in some embodiments of the present disclosure, as shown in FIGS. 6 to 16, 20 and 21, a first scan unit 1 includes a first input circuit 101 and a first output circuit 102. A second scan unit 2 includes a second input circuit 201, a second output circuit 202 and a potential boost circuit 203. A plurality of shift registers 100 may be cascaded to form the gate driving circuit 1000, and the gate driving circuit 1000 may be used in the display device 2000 to provide scan signals in a process of displaying a frame of image on the display device 2000.

In some examples, as shown in FIGS. 6 to 16, 20 and 21, the first input circuit 101 is electrically connected to an input signal terminal Iput and a first pull-up node Q1. The first input circuit 101 is configured to, in response to an input signal received at the input signal terminal Iput, transmit the input signal to the first pull-up node Q1.

For example, the first input circuit 101 may be turned on due to an action of the input signal, and transmit the input signal to the first pull-up node Q1 to charge the first pull-up node Q1, so that a voltage of the first pull-up node Q1 is increased.

In some examples, as shown in FIGS. 7 to 16, 20 and 21, the first output circuit 102 is electrically connected to the first pull-up node Q1, a first clock signal terminal CLKD_1, a second clock signal terminal CLKE_1, a shift signal terminal CR<N>, and a first scan signal terminal Output1<N> (Oput1<N> in the figures and in the following). The first output circuit 102 is configured to: transmit a first clock signal received at the first clock signal terminal CLKD_1 to the shift signal terminal CR<N>under a control of the voltage of the first pull-up node Q1, so that a shift signal is output from the shift signal terminal CR<N>; and transmit a second clock signal received at the second clock signal terminal CLKE_1 to the first scan signal terminal Oput1<N>under the control of the voltage of the first pull-up node Q1, so that a first scan signal is output from the first scan signal terminal Oput1<N>.

For example, in a case where the first input circuit 101 charges the first pull-up node Q1 and the voltage of the first pull-up node Q1 is increased, the first output circuit 102 may be turned on under the control of the voltage of the first pull-up node Q1, and output the first clock signal received at the first clock signal terminal CLKD_1 as the shift signal from the shift signal terminal CR<N>, and synchronously output the second clock signal received at the second clock signal terminal CLKE_1 as the first scan signal from the first scan signal terminal Oput1<N>.

For example, in a display phase of a frame, the shift signal output from the first output circuit 102 in the first scan unit 1 may be transmitted as the input signal to the input signal terminal Iput of other shift register 100, so as to complete the scan row by row. The first scan signal output from the first output circuit 102 may drive sub-pixels in a corresponding row in the display panel PNL to display image(s).

Of course, the input signal terminals Iput of some shift registers 100 may also be electrically connected to a start signal terminal STV, so as to receive a start signal transmitted by the start signal terminal STV as the input signal.

Here, in the display phase of the frame, signal waveforms of both the shift signal and the first scan signal output from the first output circuit 102 may be same or different.

Figure 18:
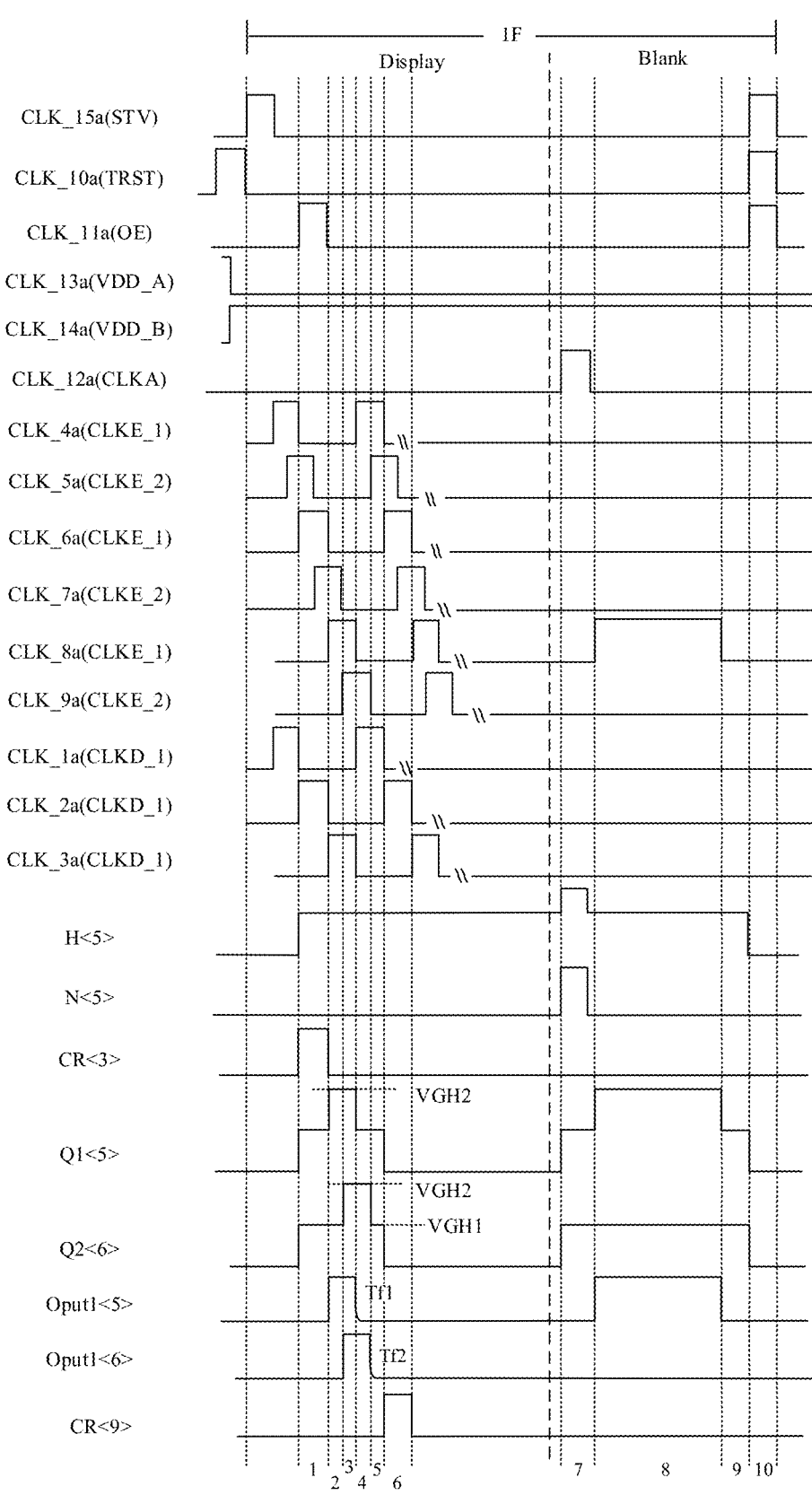
FIG. 18 is a timing control diagram corresponding to the shift register shown in FIG. 16, in accordance with some embodiments of the present disclosure.

It will be noted that in a case where the first output circuit 102 is turned on, the voltage of the first pull-up node Q1 may be further increased under a bootstrap action of the first output circuit 102. For example, the voltage of the first pull-up node Q1 (i.e., Q1<5>) may be increased to VGH2 as shown in FIG. 18.

In some examples, as shown in FIGS. 6 to 16, 20 and 21, the second input circuit 201 is electrically connected to the input signal terminal Iput and a second pull-up node Q2. The second input circuit 201 is configured to, in response to the input signal received at the input signal terminal Iput, transmit the input signal to the second pull-up node Q2.

For example, the second input circuit 201 may be turned on due to the action of the input signal, and transmit the input signal to the second pull-up node Q2 to charge the second pull-up node Q2, so that a voltage of the second pull-up node Q2 is increased.

For example, in a case where the input signal transmitted by the input signal terminal Iput is at a high level, the first input circuit 101 and the second input circuit 201 may receive the input signal synchronously, so that the first input circuit 101 and the second input circuit 201 are turned on synchronously, so as to charge the first pull-up node Q1 and the second pull-up node Q2 synchronously.

In some examples, as shown in FIGS. 7 to 12, the second output circuit 202 is electrically connected to the second pull-up node Q2, a third clock signal terminal CLKE_2 and a second scan signal terminal Output1<N+1> (Oput1<N+1> in the figures and in the following). The second output circuit 202 is configured to transmit a third clock signal received at the third clock signal terminal CLKE_2 to the second scan signal terminal Output1<N+1>under a control of the voltage of the second pull-up node Q2, so that a second scan signal is output from the second scan signal terminal Output1<N+1>.

For example, in a case where the second input circuit 201 charges the second pull-up node Q2 and the voltage of the second pull-up node Q2 is increased, the second output circuit 202 may be turned on under the control of the voltage of the second pull-up node Q2, and output the third clock signal received at the third clock signal terminal CLKE_2 as the second scan signal from the second scan signal terminal Oput1<N+1>.

For example, in the display phase of the frame, the second scan signal output from the second output circuit 202 may drive sub-pixels in a corresponding row in the display panel PNL to display image(s).

It will be noted that in a case where the second output circuit 202 is turned on, the voltage of the second pull-up node Q2 may be further increased under a bootstrap action of the second output circuit 202. For example, the voltage of the second pull-up node Q2 (i.e., Q2<6>) may be increased to VGH1 as shown in FIG. 18. VGH1 is less than VGH2.

In some examples, as shown in FIGS. 7 to 16, 20 and 21, the potential boost circuit 203 is electrically connected to the second pull-up node Q2, a sub-clock signal terminal CLK and a dummy shift signal terminal CR_dummy. The sub-clock signal terminal CLK is one of clock signal terminal(s) electrically connected to the second output circuit 202. The potential boost circuit 203 is configured to boost the voltage of the second pull-up node Q2 in cooperation with the second output circuit 202 in a phase of outputting the second scan signal from the second scan signal terminal Oput1<N+1>.

Here, in a case where the second output circuit 202 is electrically connected to the third clock signal terminal CLKE_2, the sub-clock signal terminal CLK may be, for example, the third clock signal terminal CLKE_2.

For example, in the case where the second input circuit 201 charges the second pull-up node Q2 and the voltage of the second pull-up node Q2 is increased, the potential boost circuit 203 may be turned on synchronously with the second output circuit 202 under the control of the voltage of the second pull-up node Q2, and transmit the third clock signal received at the third clock signal terminal CLKE_2 as a dummy shift signal to the dummy shift signal terminal CR_dummy.

Here, the dummy shift signal terminal CR_dummy is not electrically connected to other circuit structures, and the dummy shift signal is not transmitted to other circuit structures.

For example, in a phase of outputting the first scan signal from the first scan signal terminal Oput1<N>, the voltage of the first pull-up node Q1 may be referred to as a first preset voltage (i.e., VGH2). In the phase of outputting the second scan signal from the second scan signal terminal Oput1<N+1>, the voltage of the second pull-up node Q2 may be referred to as a second preset voltage.

It will be noted that in the phase of outputting the second scan signal from the second scan signal terminal Oput1<N+1>, on a basis that the voltage of the second pull-up node Q2 is increased to VGH1 under the bootstrap action of the second output circuit 202, the voltage of the second pull-up node Q2 is further increased under a bootstrap action of the potential boost circuit 203, so that the voltage of the second pull-up node Q2 is greater than VGH1 under a joint cooperation of the second output circuit 202 and the potential boost circuit 203. That is, the second preset voltage is greater than VGH1. The second preset voltage may be, for example, VGH2 as shown in FIG. 18. In this way, a difference between the first preset voltage and the second preset voltage may be reduced or even eliminated, and thus a difference between a falling edge time Tf1 of the first scan signal output from the first scan signal terminal Oput1<N> and a falling edge time Tf2 of the second scan signal output from the second scan signal terminal Oput1<N+1> may be reduced or even eliminated.

Thus, in the shift register 100 in some embodiments of the present disclosure, by providing the potential boost circuit 203 in the second scan unit 2, a difference between a structural complexity of the first output circuit 102 in the first scan unit 1 and a structural complexity of the second output circuit 202 and the potential boost circuit 203 in the second scan unit 2 may be reduced. In the embodiments of the present disclosure, the potential boost circuit 203 is electrically connected to the second pull-up node Q2 and the third clock signal terminal CLKE_2, so that the potential boost circuit 203 and the second output circuit 202 may be turned on synchronously, and thus the voltage of the second pull-up node Q2 may be increased under the joint action of the potential boost circuit 203 and the second output circuit 202, so as to reduce or even eliminate the difference between the first preset voltage and the second preset voltage.

In this way, the difference between the falling edge time Tf1 of the first scan signal output from the first scan signal terminal Oput1<N> and the falling edge time Tf2 of the second scan signal output from the second scan signal terminal Oput1<N+1> is able to be reduced or even eliminated, so as to improve the cross striation phenomenon due to the fact that the falling edge time of the first scan signal input to the gate line GL in the odd-numbered row is inconsistent with the falling edge time of the second scan signal input to the gate line GL in the even-numbered row, thereby improving the display effect of the display device 2000 to which the shift register 100 is applied.

In some embodiments, the first preset voltage and the second preset voltage are equal or approximately equal. That is, a degree to which the voltage of the first pull-up node Q1 is increased due to the bootstrap action of the first output circuit 102 in the phase of outputting the first scan signal from the first scan signal terminal Oput1<N>, is equal to or approximately equal to a degree to which the voltage of the second pull-up node Q2 is increased due to a joint bootstrap action of the second output circuit 202 and the potential boost circuit 203 in the phase of outputting the second scan signal from the second scan signal terminal Oput1<N+1>. The second preset voltage is, or is approximately VGH2.

This may also make the falling edge time Tf1 of the first scan signal output from the first scan signal terminal Oput1<N>equal to or approximately equal to the falling edge time Tf2 of the second scan signal output from the second scan signal terminal Oput1<N+1>, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row, so that the display device 2000 to which the shift register 100 is applied has a good display effect.

In some embodiments, a coupling capacitance value of the first output circuit 102 is equal to or approximately equal to a coupling capacitance value of the second output circuit 202 and the potential boost circuit 203. That is, there is no difference or approximately no difference between the bootstrap action of the first output circuit 102 and the joint bootstrap action of the second output circuit 202 and the potential boost circuit 203.

This may also make the voltage of the first pull-up node Q1 in the phase of outputting the first scan signal from the first scan signal terminal Oput1<N>equal to or approximately equal to the voltage of the second pull-up node Q2 in the phase of outputting the second scan signal from the second scan signal terminal Oput1<N+1>, and thus make the falling edge time Tf1 of the first scan signal output from the first scan signal terminal Oput1<N>equal to or approximately equal to the falling edge time Tf2 of the second scan signal output from the second scan signal terminal Oput1<N+1>, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row, so that the display device 2000 to which the shift register 100 is applied has a good display effect.

Structures of the first input circuit 101 included in the first scan unit 1 and the second input circuit 201 included in the second scan unit 2 will be schematically described below.

In some examples, as shown in FIGS. 8, 10, 12, 14, 16 and 21, the first input circuit 101 includes a thirty-first transistor M31, and the second input circuit 201 includes a thirty-second transistor M32.

For example, as shown in FIGS. 8, 10, 12, 14, 16 and 21, a control electrode of the thirty-first transistor M31 is electrically connected to the input signal terminal Iput, a first electrode of the thirty-first transistor M31 is electrically connected to the input signal terminal Iput, and a second electrode of the thirty-first transistor M31 is electrically connected to the first pull-up node Q1. The thirty-first transistor M31 is configured to be turned on under a control of the input signal transmitted by the input signal terminal Iput, and to transmit the input signal to the first pull-up node Q1 to increase the voltage of the first pull-up node Q1.

For example, as shown in FIGS. 8, 10, 12, 14, 16 and 21, a control electrode of the thirty-second transistor M32 is electrically connected to the input signal terminal Iput, a first electrode of the thirty-second transistor M32 is electrically connected to the input signal terminal Iput, and a second electrode of the thirty-second transistor M32 is electrically connected to the second pull-up node Q2. The thirty-second transistor M32 is configured to be turned on under the control of the input signal transmitted by the input signal terminal Iput, and to transmit the input signal to the second pull-up node Q2 to increase the voltage of the second pull-up node Q2.

In some embodiments, as shown in FIGS. 11 to 14, 20 and 21, the first output circuit 102 is further electrically connected to a fifth clock signal terminal CLKF_1 and a first sensing signal terminal Output2<N> (Oput2<N> in the figures and in the following). The first output circuit 102 is further configured to transmit a fifth clock signal received at the fifth clock signal terminal CLKF_1 to the first sensing signal terminal Oput2<N>under the control of the voltage of the first pull-up node Q1, so that a first sensing signal is output from the first sensing signal terminal Oput2<N>.

For example, in a case where the voltage of the first pull-up node Q1 is at a high level, the first output circuit 102 may be turned on under the control of the voltage of the first pull-up node Q1, and output the fifth clock signal received at the fifth clock signal terminal CLKF_1 as the first sensing signal from the first sensing signal terminal Oput2<N>.

In some embodiments, as shown in FIGS. 11 to 14, 20 and 21, the second output circuit 202 is further electrically connected to a sixth clock signal terminal CLKF_2 and a second sensing signal terminal Output2<N+1> (Oput2<N+1> in the figures and in the following). The second output circuit 202 is further configured to transmit a sixth clock signal received at the sixth clock signal terminal CLKF_2 to the second sensing signal terminal Oput2<N+1>under the control of the voltage of the second pull-up node Q2, so that a second sensing signal is output from the second sensing signal terminal Oput2<N+1>.

Here, in a case where the second output circuit 202 is further electrically connected to the sixth clock signal terminal CLKF_2, the potential boost circuit 203 may be electrically connected to one of the third clock signal terminal CLKE_2 and the sixth clock signal terminal CLKF_2. Below, a description will be made in an example where the potential boost circuit 203 is electrically connected to the third clock signal terminal CLKE_2.

For example, in a case where the voltage of the second pull-up node Q2 is at a high level, the second output circuit 202 may be turned on under the control of the voltage of the second pull-up node Q2, and output the sixth clock signal received at the sixth clock signal terminal CLKF_2 as the second sensing signal from the second sensing signal terminal Oput2<N+1>.

It will be noted that the display phase of the frame may include a display period and a blanking period that are sequentially performed.

For example, in the display period in the display phase of the frame, the first input circuit 101 increases the voltage of the first pull-up node Q1, and the second input circuit 201 increases the voltage of the second pull-up node Q2. The first scan signal and the first sensing signal that are output from the first output circuit 102 may cooperate with each other to drive sub-pixels in a corresponding row in the display panel PNL to display image(s). The second scan signal and the second sensing signal that are output from the second output circuit 202 may cooperate with each other to drive sub-pixels in a corresponding row in the display panel PNL to display image(s).

For example, in the blanking period in the display phase of the frame, a blanking input unit 3 increases both the voltage of the first pull-up node Q1 and the voltage of the second pull-up node Q2. The first scan signal and the first sensing signal that are output from the first output circuit 102 may cooperate with each other to drive sub-pixels in a corresponding row in the display panel PNL to be externally compensated. The second scan signal and the second sensing signal that are output from the second output circuit 102 may cooperate with each other to drive sub-pixels in a corresponding row in the display panel PNL to be externally compensated.

In a case where the first output circuit 102 is not electrically connected to the first sensing signal terminal Oput2<N>, and the second output circuit 202 is not connected to the second sensing signal terminal Oput2<N+1>, both the first scan signal and the second scan signal may drive sub-pixels in a corresponding row in the display panel PNL to display image(s) in the display period in the display phase of the frame, and drive sub-pixels in a corresponding row in the display panel PNL to be externally compensated in the blanking period in the display phase of the frame.

A description of the blanking input unit 3 may refer to a relevant description below, and will not be repeated here.

Structures of the first output circuit 102 included in the first scan unit 1, and both the second output circuit 202 and the potential boost circuit 203 included in the second scan unit 2 will be schematically described below.

In some examples, as shown in FIGS. 8, 10, 12, 14, 16 and 21, the first output circuit 102 includes a first transistor M1, a second transistor M2 and a first capacitor C1.

For example, as shown in FIGS. 8, 10, 12, 14, 16 and 21, a control electrode of the first transistor M1 is electrically connected to the first pull-up node Q1, a first electrode of the first transistor M1 is electrically connected to the first clock signal terminal CLKD_1, and a second electrode of the first transistor M1 is electrically connected to the shift signal terminal CR<N>. The first transistor M1 is configured to be turned on under the control of the voltage of the first pull-up node Q1, and to transmit the first clock signal received at the first clock signal terminal CLKD_1 to the shift signal terminal CR<N>, so that the shift signal is output from the shift signal terminal CR<N>.

For example, in the case where the first input circuit 101 is turned on and the voltage of the first pull-up node Q1 is increased, the first transistor M1 may be turned on under the control of the high voltage of the first pull-up node Q1, so as to transmit the first clock signal to the shift signal terminal CR<N> and output the first clock signal as the shift signal from the shift signal terminal CR<N>.

For example, as shown in FIGS. 8, 10, 12, 14, 16 and 21, a control electrode of the second transistor M2 is electrically connected to the first pull-up node Q1, a first electrode of the second transistor M2 is electrically connected to the second clock signal terminal CLKE_1, and a second electrode of the second transistor M2 is electrically connected to the first scan signal terminal Oput1<N>. The second transistor M2 is configured to be turned on under the control of the voltage of the first pull-up node Q1, and to transmit the second clock signal received at the second clock signal terminal CLKE_1 to the first scan signal terminal Oput1<N>, so that the first scan signal is output from the first scan signal terminal Oput1<N>.

For example, in the case where the first input circuit 101 is turned on and the voltage of the first pull-up node Q1 is increased, the second transistor M2 may be turned on under the control of the high voltage of the first pull-up node Q1, so as to transmit the second clock signal to the first scan signal terminal Oput1<N> and output the second clock signal as the first scan signal from the first scan signal terminal Oput1<N>.

For example, as shown in FIGS. 8, 10, 12, 14, 16 and 21, a first terminal of the first capacitor C1 is electrically connected to the first pull-up node Q1, and a second terminal of the first capacitor C1 is electrically connected to the first scan signal terminal Oput1<N>.

For example, in the case where the first input circuit 101 is turned on and the voltage of the first pull-up node Q1 is increased, the first capacitor C1 may be charged synchronously. In a case where the first input circuit 101 is turned off, the first capacitor C1 may be discharged, so that the voltage of the first pull-up node Q1 is maintained at a high level, and thus the second transistor M2 is maintained in an on state.

In some examples, as shown in FIGS. 8, 10, 12, 14, 16 and 21, the second output circuit 202 includes a third transistor M3 and a second capacitor C2.

For example, as shown in FIGS. 8, 10, 12, 14, 16 and 21, a control electrode of the third transistor M3 is electrically connected to the second pull-up node Q2, a first electrode of the third transistor M3 is electrically connected to the third clock signal terminal CLKE_2, and a second electrode of the third transistor M3 is electrically connected to the second scan signal terminal Oput1<N+1>. The third transistor M3 is configured to be turned on under the control of the voltage of the second pull-up node Q2, and to transmit the third clock signal received at the third clock signal terminal CLKE_2 to the second scan signal terminal Oput1<N+1>, so that the second scan signal is output from the second scan signal terminal Oput1<N+1>.

For example, in the case where the second input circuit 201 is turned on and the voltage of the second pull-up node Q2 is increased, the third transistor M3 may be turned on under the control of the high voltage of the second pull-up node Q2, so as to transmit the third clock signal to the second scan signal terminal Oput1<N+1> and output the third clock signal as the second scan signal from the second scan signal terminal Oput1<N+1>.

For example, as shown in FIGS. 8, 10, 12, 14, 16 and 21, a first terminal of the second capacitor C2 is electrically connected to the second pull-up node Q2, and a second terminal of the second capacitor C2 is electrically connected to the second scan signal terminal Oput1<N+1>.

For example, in the case where the second input circuit 201 is turned on and the voltage of the second pull-up node Q2 is increased, the second capacitor C2 may be charged synchronously. In a case where the second input circuit 201 is turned off, the second capacitor C2 may be discharged, so that the voltage of the second pull-up node Q2 is maintained at a high level, and thus the third transistor M3 is maintained in an on state.

In some examples, as shown in FIGS. 8, 10, 12, 14, 16 and 21, the potential boost circuit 203 includes a fourth transistor M4.

For example, as shown in FIGS. 8, 10, 12, 14, 16 and 21, a control electrode of the fourth transistor M4 is electrically connected to the second pull-up node Q2, a first electrode of the fourth transistor M4 is electrically connected to the sub-clock signal terminal CLK, and a second electrode of the fourth transistor M4 is electrically connected to the dummy shift signal terminal CR_dummy.

For example, in the case where the second input circuit 201 is turned on and the voltage of the second pull-up node Q2 is increased, the fourth transistor M4 may be turned on under the control of the high voltage of the second pull-up node Q2, so as to transmit the third clock signal to the dummy shift signal terminal CR_dummy.

It can be known from the structures of the first output circuit 102, the second output circuit 202 and the potential boost circuit 203 that in the phase of outputting the first scan signal from the first scan signal terminal Oput1<N> in the first output circuit 102, the voltage of the first pull-up node Q1 may be increased due to bootstrap actions of both the first transistor M1 and the second transistor M2. In the phase of outputting the second scan signal from the second scan signal terminal Oput1<N+1> in the second output circuit 202, the voltage of the second pull-up node Q2 may be increased due to a bootstrap action of the third transistor M3, and may be further increased due to a bootstrap action of the fourth transistor M4.

Since the voltage of the first pull-up node Q1 and the voltage of the second pull-up node Q2 are each increased under bootstrap actions of two transistors, the difference between the first preset voltage of the first pull-up node Q1 and the second preset voltage of the second pull-up node Q2 may be reduced. Thus, the difference between the falling edge time Tf1 of the first scan signal output from the first scan signal terminal Oput1<N> and the falling edge time Tf2 of the second scan signal output from the second scan signal terminal Oput1<N+1> may be reduced, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row.

Figure 12:
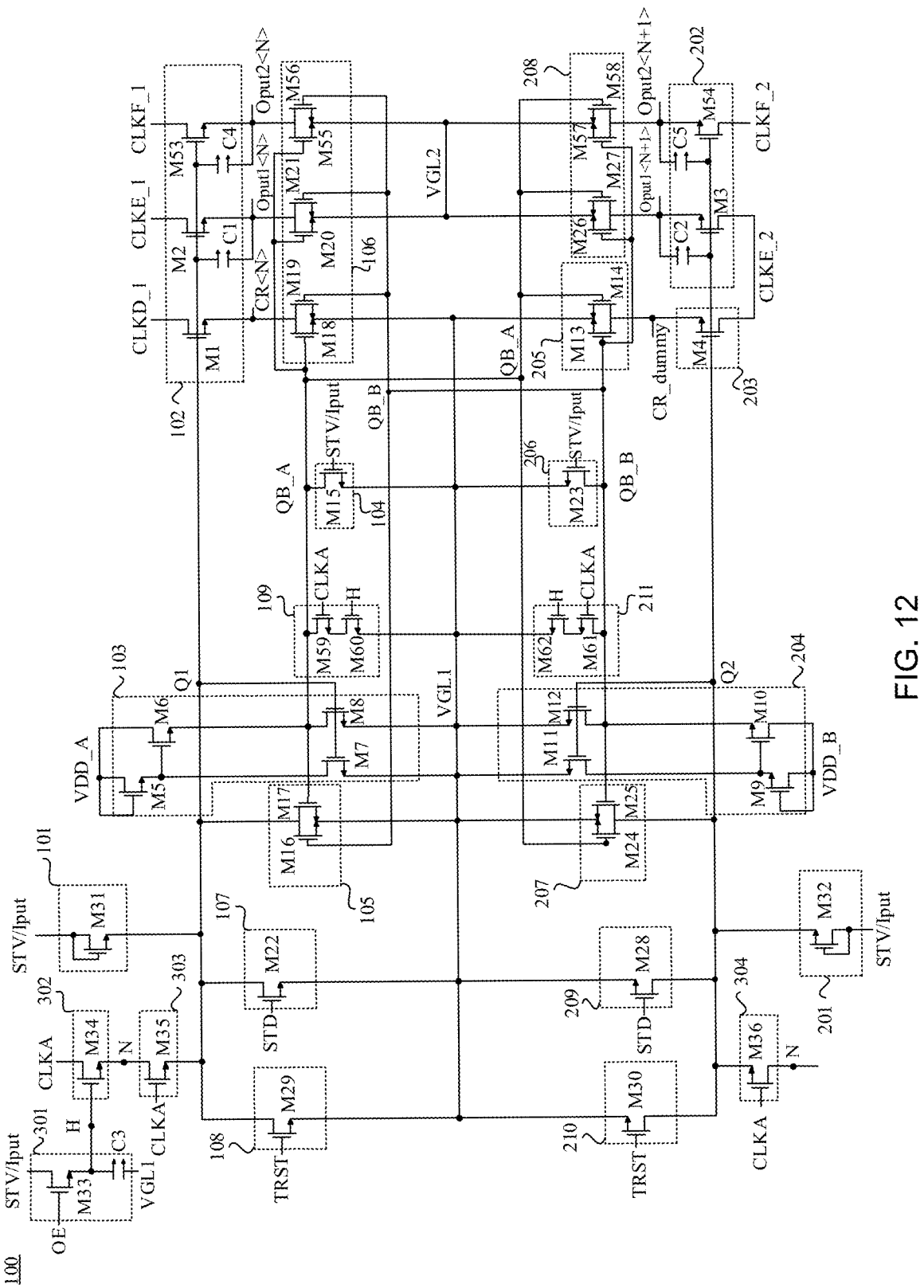
FIG. 12 is a circuit diagram of yet another shift register, in accordance with some embodiments of the present disclosure.
Figure 14:
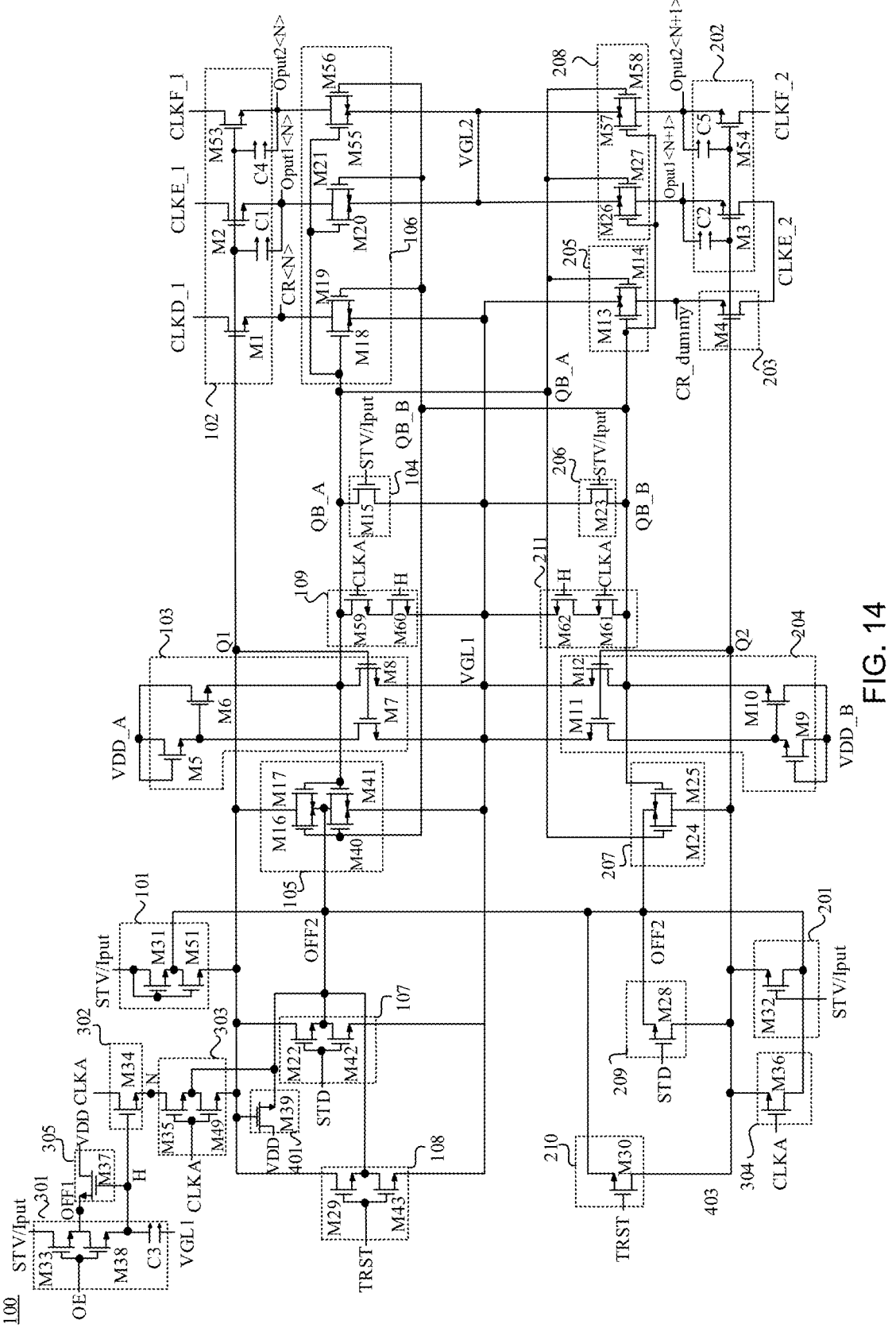
FIG. 14 is a circuit diagram of yet another shift register, in accordance with some embodiments of the present disclosure.
Figure 15:
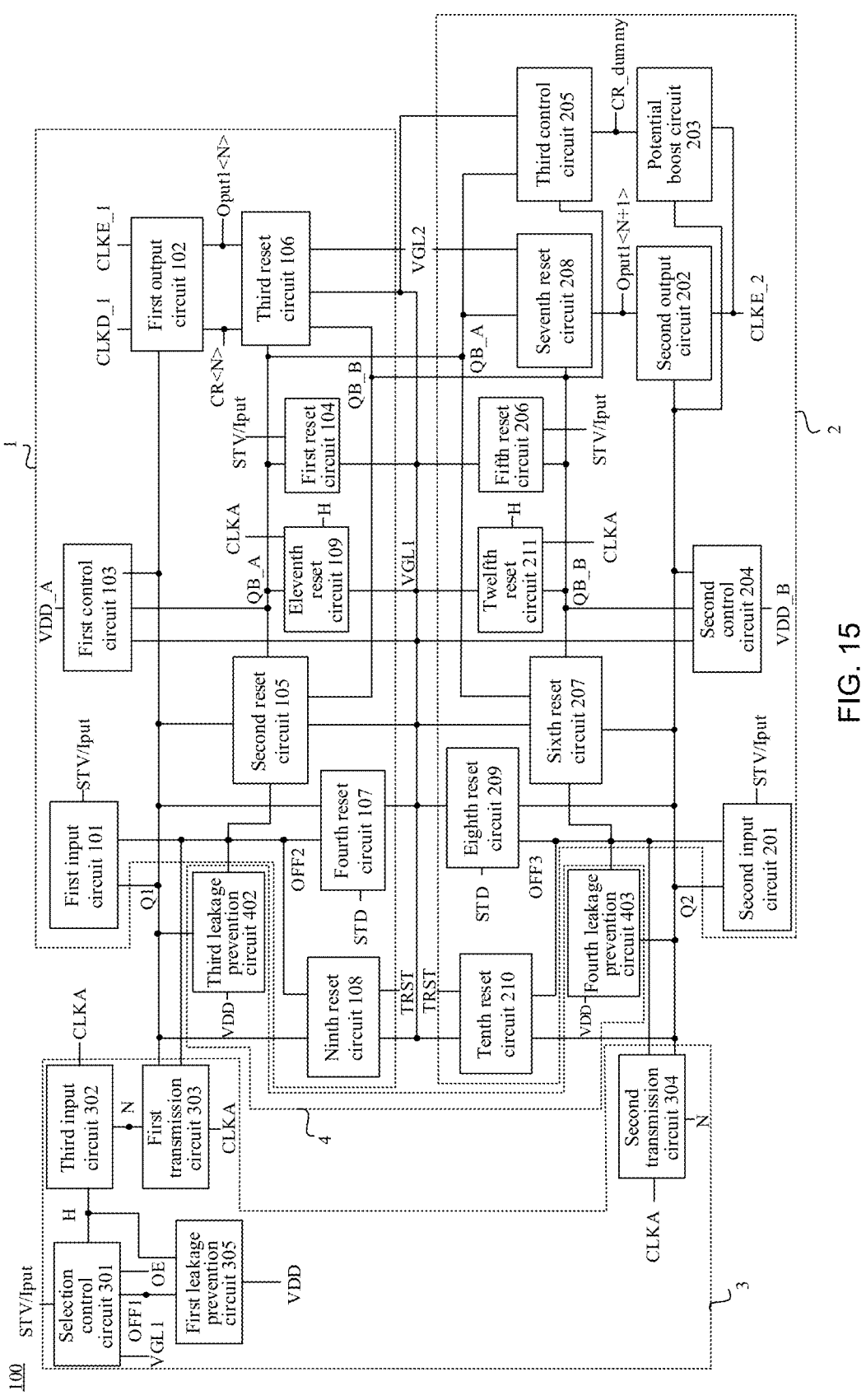
FIG. 15 is a structural diagram of yet another shift register, in accordance with some embodiments of the present disclosure.
Figure 21:
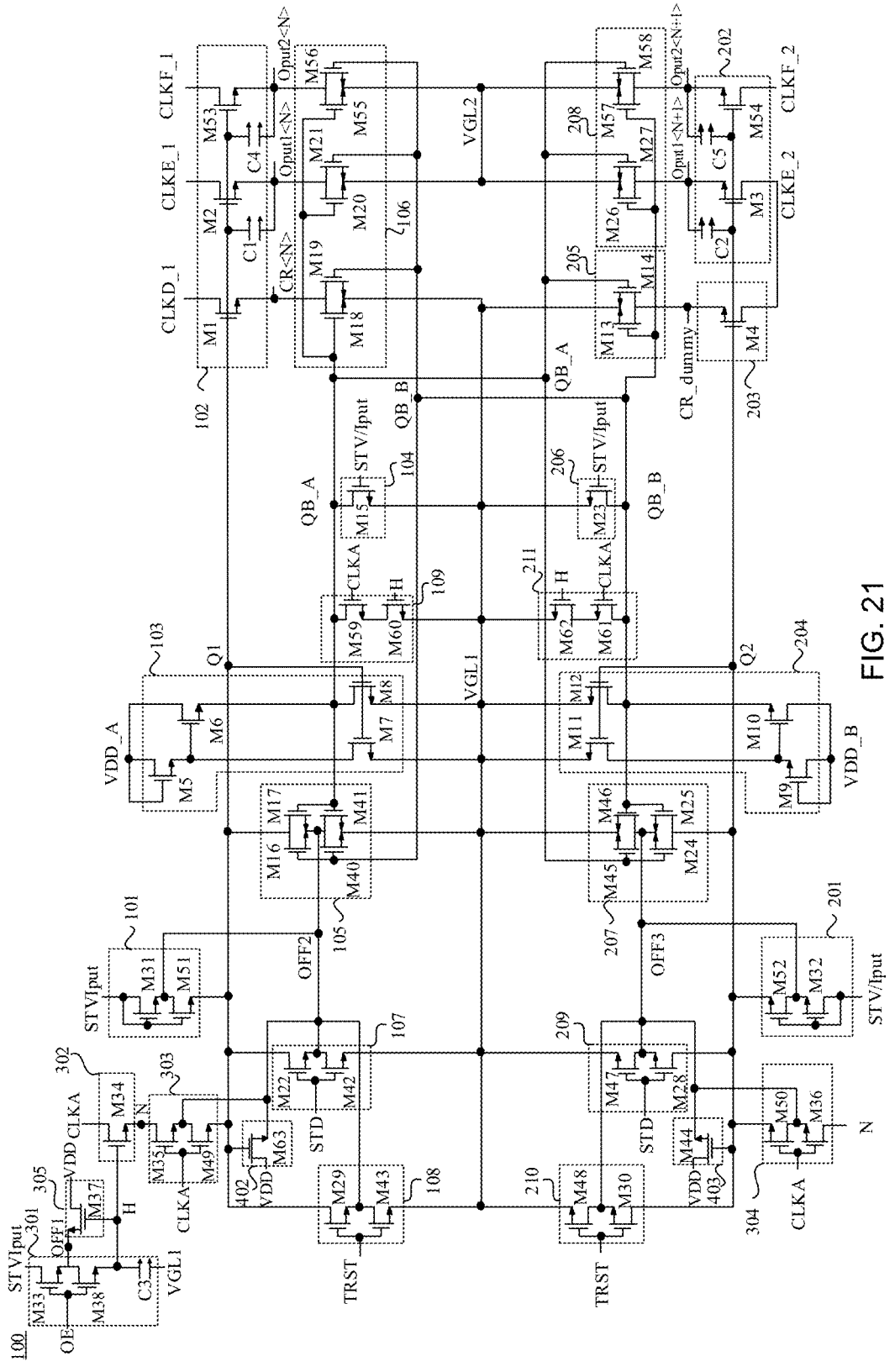
FIG. 21 is a circuit diagram of yet another shift register, in accordance with some embodiments of the present disclosure.

In some examples, as shown in FIGS. 12, 14 and 21, in a case where the first output circuit 102 is further electrically connected to the fifth clock signal terminal CLKF_1 and the first sensing signal terminal Oput2<N>, the first output circuit 102 further includes a fifty-third transistor M53 and a fourth capacitor C4.

For example, as shown in FIGS. 12, 14 and 21, a control electrode of the fifty-third transistor M53 is electrically connected to the first pull-up node Q1, a first electrode of the fifty-third transistor M53 is electrically connected to the fifth clock signal terminal CLKF_1, and a second electrode of the fifty-third transistor M53 is electrically connected to the first sensing signal terminal Oput2<N>. The fifty-third transistor M53 is configured to be turned on under the control of the voltage of the first pull-up node Q1, and to transmit the fifth clock signal received at the fifth clock signal terminal CLKF_1 to the first sensing signal terminal Oput2<N>, so that the first sensing signal is output from the first sensing signal terminal Oput2<N>.

For example, in a case where the first input circuit 101 or the blanking input unit 3 causes the voltage of the first pull-up node Q1 to be increased, the fifty-third transistor M53 may be turned on under the control of the high voltage of the first pull-up node Q1, so as to transmit the fifth clock signal to the first sensing signal terminal Oput2<N> and output the fifth clock signal as the first sensing signal from the first sensing signal terminal Oput2<N>.

For example, as shown in FIGS. 12, 14 and 21, a first terminal of the fourth capacitor C4 is electrically connected to the first pull-up node Q1, and a second terminal of the fourth capacitor C4 is electrically connected to the first sensing signal terminal Oput2<N>.

For example, in the case where the first input circuit 101 or the blanking input unit 3 causes the voltage of the first pull-up node Q1 to be increased, the fourth capacitor C4 may be charged synchronously. In this way, in a case where the first input circuit 101 or the blanking input unit 3 is turned off, the fourth capacitor C4 may be discharged, so that the voltage of the first pull-up node Q1 is maintained at a high level, and thus the fifty-third transistor M53 is maintained in an on state.

In some examples, as shown in FIGS. 12, 14 and 21, in a case where the second output circuit 202 is further electrically connected to the sixth clock signal terminal CLKF_2 and the second sensing signal terminal Oput2<N+1>, the second output circuit 202 further includes a fifty-fourth transistor M54 and a fifth capacitor C5.

For example, as shown in FIGS. 12, 14 and 21, a control electrode of the fifty-fourth transistor M54 is electrically connected to the second pull-up node Q2, a first electrode of the fifty-fourth transistor M54 is electrically connected to the sixth clock signal terminal CLKF_2, and a second electrode of the fifty-fourth transistor M54 is electrically connected to the second sensing signal terminal Oput2<N+1>. The fifty-fourth transistor M54 is configured to be turned on under the control of the voltage of the second pull-up node Q2, and to transmit the sixth clock signal received at the sixth clock signal terminal CLKF_2 to the second sensing signal terminal Oput2<N+1>, so that the second sensing signal is output from the second sensing signal terminal Oput2<N+1>.

For example, in a case where the second input circuit 201 or the blanking input unit 3 causes the voltage of the second pull-up node Q2 to be increased, the fifty-fourth transistor M54 may be turned on under the control of the high voltage of the second pull-up node Q2, so as to transmit the sixth clock signal to the second sensing signal terminal Oput2<N+1> and output the sixth clock signal as the second sensing signal from the second sensing signal terminal Oput2<N+1>.

For example, as shown in FIGS. 12, 14 and 21, a first terminal of the fifth capacitor C5 is electrically connected to the second pull-up node Q2, and a second terminal of the fifth capacitor C5 is electrically connected to the second sensing signal terminal Oput2<N+1>.

For example, in the case where the second input circuit 201 or the blanking input unit 3 causes the voltage of the second pull-up node Q2 to be increased, the fifth capacitor C5 may be charged synchronously. In this way, in a case where the second input circuit 201 or the blanking input unit 3 is turned off, the fifth capacitor C5 may be discharged, so that the voltage of the second pull-up node Q2 is maintained at a high level, and thus the fifty-fourth transistor M54 is maintained in an on state.

It can be known from the structures of the first output circuit 102, the second output circuit 202 and the potential boost circuit 203 that in a phase of outputting the first scan signal from the first scan signal terminal Oput1<N> and outputting the first sensing signal from the first sensing signal terminal Oput2<N>, the voltage of the first pull-up node Q1 may be increased due to bootstrap actions of the first transistor M1, the second transistor M2 and the fifty-third transistor M53. In a phase of outputting the second scan signal from the second scan signal terminal Oput1<N+1> and outputting the second sensing signal from the second sensing signal terminal Oput2<N+1>, the voltage of the second pull-up node Q2 may be increased due to bootstrap actions of the third transistor M3 and the fifty-fourth transistor M54, and may be further increased due to the bootstrap action of the fourth transistor M4.

Since the voltage of the first pull-up node Q1 and the voltage of the second pull-up node Q2 are each increased under bootstrap actions of three transistors, the difference between the first preset voltage of the first pull-up node Q1 and the second preset voltage of the second pull-up node Q2 may be reduced. Thus, the difference between the falling edge time Tf1 of the first scan signal output from the first scan signal terminal Oput1<N> and the falling edge time Tf2 of the second scan signal output from the second scan signal terminal Oput1<N+1> may be reduced, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row.

It will be noted that, the first transistor M1, the second transistor M2, the third transistor M3, the fourth transistor M4, the fifty-third transistor M53 and the fifty-fourth transistor M54 may be arranged in various manners, and may be selectively arranged according to actual needs.

In some embodiments, a sum of a width-to-length ratio of the first transistor M1 and a width-to-length ratio of the second transistor M2 is equal to or approximately equal to a sum of a width-to-length ratio of the third transistor M3 and a width-to-length ratio of the fourth transistor M4.

In this way, the bootstrap actions of the first transistor M1 and the second transistor M2 on the first pull-up node Q1 may be same or approximately same as the bootstrap actions of the third transistor M3 and the fourth transistor M4 on the second pull-up node Q2. Therefore, the voltage of the first pull-up node Q1 in the phase of outputting the first scan signal from the first scan signal terminal Oput1<N> and the voltage of the second pull-up node Q2 in the phase of outputting the second scan signal from the second scan signal terminal Oput1<N+1> may be equal or approximately equal. Thus, the falling edge time Tf1 of the first scan signal output from the first scan signal terminal Oput1<N> and the falling edge time Tf2 of the second scan signal output from the second scan signal terminal Oput1<N+1> may be equal or approximately equal, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row, so that the display device 2000 to which the shift register 100 is applied has a good display effect.

Here, in a case where the first output circuit 102 further includes the fifty-third transistor M53, and the second output circuit 202 further includes the fifty-fourth transistor M54, a sum of the width-to-length ratio of the first transistor M1, the width-to-length ratio of the second transistor M2, and a width-to-length ratio of the fifty-third transistor M53 is equal to or approximately equal to a sum of the width-to-length ratio of the third transistor M3, the width-to-length ratio of the fourth transistor M4, and a width-to-length ratio of the fifty-fourth transistor M54. In this way, the bootstrap actions of the first transistor M1, the second transistor M2 and the fifty-third transistor M53 on the first pull-up node Q1 may be same or approximately same as the bootstrap actions of the third transistor M3, the fourth transistor M4 and the fifty-fourth transistor M54 on the second pull-up node Q2. Therefore, the voltage of the first pull-up node Q1 in the phase of outputting the first scan signal from the first scan signal terminal Oput1<N> and the voltage of the second pull-up node Q2 in the phase of outputting the second scan signal from the second scan signal terminal Oput1<N+1> may be equal or approximately equal. Thus, the falling edge time Tf1 of the first scan signal and the falling edge time Tf2 of the second scan signal may be equal or approximately equal, so as to improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row, so that the display device 2000 to which the shift register 100 is applied has a good display effect.

In some examples, the width-to-length ratio of the first transistor M1 is equal to or approximately equal to one of the width-to-length ratio of the third transistor M3 and the width-to-length ratio of the fourth transistor M4. The width-to-length ratio of the second transistor M2 is equal to or approximately equal to another one of the width-to-length ratio of the third transistor M3 and the width-to-length ratio of the fourth transistor M4.

For example, the width-to-length ratio of the first transistor M1 is equal to or approximately equal to the width-to-length ratio of the third transistor M3, and the width-to-length ratio of the second transistor M2 is equal to or approximately equal to the width-to-length ratio of the fourth transistor M4.

For another example, the width-to-length ratio of the first transistor M1 is equal to or approximately equal to the width-to-length ratio of fourth transistor M4, and the widthto-length ratio of the second transistor M2 is equal to or approximately equal to the width-to-length ratio of the third transistor M3.

Here, in the case where the first output circuit 102 further includes the fifty-third transistor M53, and the second output circuit 202 further includes the fifty-fourth transistor M54, the width-to-length ratio of the first transistor M1 is equal to or approximately equal to one of the width-to-length ratio of the third transistor M3, the width-to-length ratio of the fourth transistor M4 and the width-to-length ratio of the fifty-fourth transistor M54. The width-to-length ratio of the second transistor M2 is equal to or approximately equal to another one of the width-to-length ratio of the third transistor M3, the width-to-length ratio of the fourth transistor M4 and the width-to-length ratio of the fifty-fourth transistor M54. The width-to-length ratio of the fifty-third transistor M53 is equal to or approximately equal to yet another one of the width-to-length ratio of the third transistor M3, the width-to-length ratio of the fourth transistor M4 and the width-to-length ratio of the fifty-fourth transistor M54.

For example, the width-to-length ratio of the first transistor M1 is equal to or approximately equal to the width-to-length ratio of the third transistor M3, the width-to-length ratio of the second transistor M2 is equal to or approximately equal to the width-to-length ratio of the fourth transistor M4, and the width-to-length ratio of the fifty-third transistor M53 is equal to or approximately equal to the width-to-length ratio of the fifty-fourth transistor M54.

For another example, the width-to-length ratio of the first transistor M1 is equal to or approximately equal to the width-to-length ratio of the fifty-fourth transistor M54, the width-to-length ratio of the second transistor M2 is equal to or approximately equal to the width-to-length ratio of the third transistor M3, and the width-to-length ratio of the fifty-third transistor M53 is equal to or approximately equal to the width-to-length ratio of the fourth transistor M4.

This facilitates the design of the width-to-length ratio of the first transistor M1, the width-to-length ratio of the second transistor M2, the width-to-length ratio of the third transistor M3, the width-to-length ratio of the fourth transistor M4, the width-to-length ratio of the fifty-third transistor M53 and the width-to-length ratio of the fifty-fourth transistor M54, ensuring that the sum of the width-to-length ratio of the first transistor M1 and the width-to-length ratio of the second transistor M2 is equal to or approximately equal to the sum of the width-to-length ratio of the third transistor M3 and the width-to-length ratio of the fourth transistor M4, or ensuring that the sum of the width-to-length ratio of the first transistor M1, the width-to-length ratio of the second transistor M2 and the width-to-length ratio of the fifty-third transistor M53 is equal to or approximately equal to the sum of the width-to-length ratio of the third transistor M3, the width-to-length ratio of the four transistor M4 and the width-to-length ratio of the fifty-fourth transistor M54. Thus, it is ensured that the falling edge time Tf1 of the first scan signal output from the first scan signal terminal Oput1<N> is equal to or approximately equal to the falling edge time Tf2 of the second scan signal output from the second scan signal terminal Oput1<N+1>, so as to effectively improve or even eliminate the cross striation phenomenon due to the fact that the falling edge time of the first scan signal input to the gate line GL in the odd-numbered row is inconsistent with the falling edge time of the second scan signal input to the gate line GL in the even-numbered row.

Further, the width-to-length ratio of the first transistor M1, the width-to-length ratio of the second transistor M2, the width-to-length ratio of the third transistor M3, and the width-to-length ratio of the fourth transistor M4 are equal or approximately equal.

In the case where the first output circuit 102 further includes the fifty-third transistor M53, and the second output circuit 202 further includes the fifty-fourth transistor M54, the width-to-length ratio of the first transistor M1, the width-to-length ratio of the second transistor M2, the width-to-length ratio of the third transistor M3, the width-to-length ratio of the fourth transistor M4, the width-to-length ratio of the fifty-third transistor M53 and the width-to-length ratio of the fifty-fourth transistor M54 are equal or approximately equal.

This may not only ensure the improvement effect of the cross striation phenomenon, but also facilitate the simplification of the design of the width-to-length ratio of the first transistor M1, the width-to-length ratio of the second transistor M2, the width-to-length ratio of the third transistor M3, the width-to-length ratio of the fourth transistor M4, the width-to-length ratio of the fifty-third transistor M53 and the width-to-length ratio of the fifty-fourth transistor M54, and the simplification of manufacturing processes of the first transistor M1, the second transistor M2, the third transistor M3, the fourth transistor M4, the thirteenth transistor M53 and the fifth transistor M54.

In some examples, the width-to-length ratio of the first transistor M1 may be in a range of 50:6 to 300:6. The width-to-length ratio of the second transistor M2 may be in a range of 300:6 to 3000:6. The width-to-length ratio of the third transistor M3 may be in a range of 300:6 to 3000:6. The width-to-length ratio of the fourth transistor M4 may be in a range of 50:6 to 300:6.

In the case where the first output circuit 102 further includes the fifty-third transistor M53, and the second output circuit 202 further includes the fifty-fourth transistor M54, the width-to-length ratio of the fifty-third transistor M53 may be in a range of 300:6 to 3000:6, and the width-to-length ratio of the fifty-fourth transistor M54 may be in a range of 300:6 to 3000:6.

For example, the width-to-length ratio of the second transistor M2 or the width-to-length ratio of the third transistor M3 may be greater than the width-to-length ratio of the first transistor M1 or the width-to-length ratio of the fourth transistor M4. Of course, the width-to-length ratios of the first transistor M1, the second transistor M2, the third transistor M3 and the fourth transistor M4 may also be equal, and in this case, the width-to-length may be 300:6.

The width-to-length ratio of the second transistor M2 or the width-to-length ratio of the third transistor M3 may be greater than the width-to-length ratio of the first transistor M1, the width-to-length ratio of the fourth transistor M4, the width-to-length ratio of the fifty-third transistor M53 or the width-to-length ratio of the fifty-fourth transistor M54. Of course, the width-to-length ratios of the first transistor M1, the second transistor M2, the third transistor M3, the fourth transistor M4, the fifty-third transistor M53 and the fifty-fourth transistor M54 may also be equal, and in this case, the width-to-length may be 300:6.

For example, the width-to-length ratio of the first transistor M1 may be 50:6, 100:6, 150:6, 250:6, or 300:6. The width-to-length ratio of the second transistor M2 may be 300:6, 500:6, 850:6, 2000:6, or 3000:6. The width-to-length ratio of the third transistor M3 may be 300:6, 700:6, 1000:6, 2300:6, or 3000:6. The width-to-length ratio of the fourth transistor M4 may be 50:6, 110:6, 190:6, 260:6, or 300:6. The width-to-length ratio of the fifty-third transistor M53 may be 300:6, 900:6, 1500:6, 2400:6, or 3000:6. The widthto-length ratio of the fifty-fourth transistor M54 may be 300:6, 980:6, 1700:6, 2700:6, or 3000:6.

In some embodiments, as shown in FIGS. 7 to 16, 20 and 21, the first scan unit 1 may further include a first control circuit 103, and the second scan unit 2 may further include a second control circuit 204.

In some examples, as shown in FIGS. 7 to 16, 20 and 21, the first control circuit 103 is electrically connected to the first pull-up node Q1, a first voltage signal terminal VDD_A, a first pull-down node QB_A, and a second voltage signal terminal VGL1. The first control circuit 103 is configured to control a voltage of the first pull-down node QB_A under a control of the voltage of the first pull-up node Q1 and a first voltage signal transmitted by the first voltage signal terminal VDD_A or a control of the voltage of the first pull-up node Q1 and a second voltage signal transmitted by the second voltage signal terminal VGL1.

In some examples, as shown in FIGS. 7 to 16, 20 and 21, the second control circuit 204 is electrically connected to the second pull-up node Q2, a third voltage signal terminal VDD_B, a second pull-down node QB_B, and the second voltage signal terminal VGL1. The second control circuit 204 is configured to control a voltage of the second pull-down node QB_B under a control of the voltage of the second pull-up node Q2 and a third voltage signal transmitted by the third voltage signal terminal VDD_B or a control of the voltage of the second pull-up node Q2 and the second voltage signal transmitted by the second voltage signal terminal VGL1.

It will be noted that the second voltage signal terminal VGL1 is configured to transmit a second voltage signal that is a direct current low level signal (e.g., lower than or equal to a low level section of a clock signal). For example, a low level voltage of the second voltage signal is-10 V. In the display phase of the frame, the first voltage signal transmitted by the first voltage signal terminal VDD_A and the third voltage signal transmitted by the third voltage signal terminal VDD_B are unchanged. Moreover, in a case where the first voltage signal is a high level signal, the third voltage signal is a low level signal, and in a case where the first voltage signal is a low level signal, the third voltage signal is a high level signal.

A high level voltage and a low level voltage in the embodiments of the present disclosure are relative values. For example, the high level voltage is 15 V and the low level voltage is 5 V, but the low level voltage is not limited to a voltage less than or equal to 0 V.

Based on this, for example, in the case where the voltage of the first pull-up node Q1 is increased, the first control circuit 103 may transmit the second voltage signal transmitted by the second voltage signal terminal VGL1 to the first pull-down node QB_A, so as to pull down the voltage of the first pull-down node QB_A to be at a low level. In a case where the voltage of the first pull-up node Q1 is at a low level, the first control circuit 103 may transmit the first voltage signal transmitted by the first voltage signal terminal VDD_A to the first pull-down node QB_A, so as to pull the voltage of the first pull-down node QB_A up to be at a high level.

For example, in the case where the voltage of the second pull-up node Q2 is increased, the second control circuit 204 may transmit the second voltage signal transmitted by the second voltage signal terminal VGL1 to the second pull-down node QB_B, so as to pull down the voltage of the second pull-down node QB_B to be at a low level. In a case where the voltage of the second pull-up node Q2 is at a low level, the second control circuit 204 may transmit the third voltage signal transmitted by the third voltage signal terminal VDD_B to the second pull-down node QB_B, so as to pull the voltage of the second pull-down node QB_B up to be at a high level.

In some embodiments, as shown in FIGS. 7 to 16, 20 and 21, the second scan unit 2 may further include a third control circuit 205.

In some examples, as shown in FIGS. 7 to 16, 20 and 21, the third control circuit 205 is electrically connected to the first pull-down node QB_A, the second pull-down node QB_B, the second voltage signal terminal VGL1, and the dummy shift signal terminal CR_dummy. The third control circuit 205 is configured to, under a control of the voltage of the first pull-down node QB_A or the voltage of the second pull-down node QB_B, transmit the second voltage signal transmitted by the second voltage signal terminal VGL1 to the dummy shift signal terminal CR_dummy to control a voltage of the dummy shift signal terminal CR_dummy.

For example, in a case where the voltage of the first pull-down node QB_A is at a high level, the third control circuit 205 may be turned on under the control of the voltage of the first pull-down node QB_A, and transmit the second voltage signal transmitted by the second voltage signal terminal VGL1 to the dummy shift signal terminal CR_dummy, so as to pull down the voltage of the dummy shift signal terminal CR_dummy to be at a low level. In a case where the voltage of the second pull-down node QB_B is at a high level, the third control circuit 205 may be turned on under the control of the voltage of the second pull-down node QB_B, and transmit the second voltage signal transmitted by the second voltage signal terminal VGL1 to the dummy shift signal terminal CR_dummy, so as to pull down the voltage of the dummy shift signal terminal CR_dummy to be at a low level.

By providing the third control circuit 205, the dummy shift signal terminal CR_dummy may be prevented from being in a floating state, and thus the dummy shift signal terminal CR_dummy may have a high stability. In a case where the voltage of the second pull-up node Q2 is further increased by using the potential boost circuit 203, a stability of the voltage of the second pull-up node Q2 may be ensured.

Structures of the first control circuit 103 included in the first scan unit 1, and both the second control circuit 204 and the third control circuit 205 included in the second scan unit 2 will be schematically described below.

In some examples, as shown in FIGS. 8, 10, 12, 14, 16 and 21, the first control circuit 103 includes a fifth transistor M5, a sixth transistor M6, a seventh transistor M7 and an eighth transistor M8.

For example, as shown in FIGS. 8, 10, 12, 14, 16 and 21, a control electrode of the fifth transistor M5 is electrically connected to the first voltage signal terminal VDD_A, a first electrode of the fifth transistor M5 is electrically connected to the first voltage signal terminal VDD_A, and a second electrode of the fifth transistor M5 is electrically connected to a control electrode of the sixth transistor M6 and a first electrode of the seventh transistor M7.

For example, in a case where a level of the first voltage signal transmitted by the first voltage signal terminal VDD_A is a high level, the fifth transistor M5 may be turned on due to an action of the first voltage signal, receive the first voltage signal, and transmit the first voltage signal to the control electrode of the sixth transistor M6 and the first electrode of the seventh transistor M7.

For example, as shown in FIGS. 8, 10, 12, 14, 16 and 21, a first electrode of the sixth transistor M6 is electrically connected to the first voltage signal terminal VDD_A, and a second electrode of the sixth transistor M6 is electrically connected to the first pull-down node QB_A and a first electrode of the eighth transistor M8.

For example, after the fifth transistor M5 transmits the first voltage signal to the control electrode of the sixth transistor M6, the sixth transistor M6 may be turned on due to the action of the first voltage signal, receive the first voltage signal, and transmit the first voltage signal to the first pull-down node QB_A and the first electrode of the eighth transistor M8.

For example, as shown in FIGS. 8, 10, 12, 14, 16 and 21, a control electrode of the seventh transistor M7 is electrically connected to the first pull-up node Q1, and a second electrode of the seventh transistor M7 is electrically connected to the second voltage signal terminal VGL1. A control electrode of the eighth transistor M8 is electrically connected to the first pull-up node Q1, and a second electrode of the eighth transistor M8 is electrically connected to the second voltage signal terminal VGL1.

For example, in the case where the voltage of the first pull-up node Q1 is at a high level, the seventh transistor M7 and the eighth transistor M8 may be turned on under the control of the voltage of the first pull-up node Q1. The seventh transistor M7 may transmit the second voltage signal transmitted by the second voltage signal terminal VGL1 to the control electrode of the sixth transistor M6, so as to turn off the sixth transistor M6. The eighth transistor M8 may transmit the second voltage signal transmitted by the second voltage signal terminal VGL1 to the first pull-down node QB_A, so as to pull down the voltage of the first pull-down node QB_A to be at a low level.

In the case where the voltage of the first pull-up node Q1 is at a low level, the seventh transistor M7 and the eighth transistor M8 may be turned off under the control of the voltage of the first pull-up node Q1, and the sixth transistor M6 may transmit the received first voltage signal to the first pull-down node QB_A, so as to pull the voltage of the first pull-down node QB_A up to be at a high level.

Here, the seventh transistor M7 may also be electrically connected to a sixth voltage signal terminal. That is, the second voltage signal terminal VGL1 is replaced with the sixth voltage signal terminal. The sixth voltage signal terminal is configured to transmit a sixth voltage signal that is a direct current low level signal (e.g., lower than or equal to a low level section of a clock signal). For example, a low level voltage of the sixth voltage signal is −8 V or −6 V.

In some examples, as shown in FIGS. 8, 10, 12, 14, 16 and 21, the second control circuit 204 includes a ninth transistor M9, a tenth transistor M10, an eleventh transistor M11, and a twelfth transistor M12.

For example, as shown in FIGS. 8, 10, 12, 14, 16 and 21, a control electrode of the ninth transistor M9 is electrically connected to the third voltage signal terminal VDD_B, a first electrode of the ninth transistor M9 is electrically connected to the third voltage signal terminal VDD_B, and a second electrode of the ninth transistor M9 is electrically connected to a control electrode of the tenth transistor M10 and a first electrode of the eleventh transistor M11.

For example, in a case where a level of the third voltage signal transmitted by the third voltage signal terminal VDD_B is a high level, the ninth transistor M9 may be turned on due to an action of the third voltage signal, receive the third voltage signal, and transmit the third voltage signal to the control electrode of the tenth transistor M10 and the first electrode of the eleventh transistor M11.

For example, as shown in FIGS. 8, 10, 12, 14, 16 and 21, a first electrode of the tenth transistor M10 is electrically connected to the third voltage signal terminal VDD_B, and a second electrode of the tenth transistor M10 is electrically connected to the second pull-down node QB_B and a first electrode of the twelfth transistor M12.

For example, after the ninth transistor M9 transmits the third voltage signal to the control electrode of the tenth transistor M10, the tenth transistor M10 may be turned on due to the action of the third voltage signal, receive the third voltage signal, and transmit the third voltage signal to the second pull-down node QB_B and the first electrode of the twelfth transistor M12.

For example, as shown in FIGS. 8, 10, 12, 14, 16 and 21, a control electrode of the eleventh transistor M11 is electrically connected to the second pull-up node Q2, and a second electrode of the eleventh transistor M11 is electrically connected to the second voltage signal terminal VGL1. A control electrode of the twelfth transistor M12 is electrically connected to the second pull-up node Q2, and a second electrode of the twelfth transistor M12 is electrically connected to the second voltage signal terminal VGL1.

For example, in the case where the voltage of the second pull-up node Q2 is at a high level, the eleventh transistor M11 and the twelfth transistor M12 may be turned on under the control of the voltage of the second pull-up node Q2. The eleventh transistor M11 may transmit the second voltage signal transmitted by the second voltage signal terminal VGL1 to the control electrode of the tenth transistor M10, so that the tenth transistor M10 is turned off. The twelfth transistor M12 may transmit the second voltage signal transmitted by the second voltage signal terminal VGL1 to the second pull-down node QB_B to pull down the voltage of the second pull-down node QB_B to be at a low level.

In the case where the voltage of the second pull-up node Q2 is at a low level, the eleventh transistor M11 and the twelfth transistor M12 may be turned off under the control of the voltage of the second pull-up node Q2, and the tenth transistor M10 may transmit the received third voltage signal to the second pull-down node QB_B to pull the voltage of the second pull-down node QB_B up to be at a high level.

Here, the eleventh transistor M11 may also be electrically connected to the sixth voltage signal terminal. That is, the second voltage signal terminal VGL1 is replaced with the sixth voltage signal terminal.

In some examples, as shown in FIGS. 8, 10, 12, 14, 16 and 21, the third control circuit 205 includes a thirteenth transistor M13 and a fourteenth transistor M14.

For example, as shown in FIGS. 8, 10, 12, 14, 16 and 21, a control electrode of the thirteenth transistor M13 is electrically connected to the second pull-down node QB_B, a first electrode of the thirteenth transistor M13 is electrically connected to the dummy shift signal terminal CR_dummy, and a second electrode of the thirteenth transistor M13 is electrically connected to the second voltage signal terminal VGL1.

For example, in the case where the voltage of the second pull-down node QB_B is at a high level, the thirteenth transistor M13 may be turned on under the control of the voltage of the second pull-down node QB_B, and transmit the second voltage signal transmitted by the second voltage signal terminal VGL1 to the dummy shift signal terminal CR_dummy to pull down the voltage of the dummy shift signal terminal CR_dummy to be at a low level, so as to control the voltage of the dummy shift signal terminal CR_dummy.

For example, as shown in FIGS. 8, 10, 12, 14, 16 and 21, a control electrode of the fourteenth transistor M14 is electrically connected to the first pull-down node QB_A, a first electrode of the fourteenth transistor M14 is electrically connected to the dummy shift signal terminal CR_dummy, and a second electrode of the fourteenth transistor M14 is electrically connected to the second voltage signal terminal VGL1.

For example, in the case where the voltage of the first pull-down node QB_A is at a high level, the fourteenth transistor M14 may be turned on under the control of the voltage of the first pull-down node QB_A, and transmit the second voltage signal transmitted by the second voltage signal terminal VGL1 to the dummy shift signal terminal CR_dummy to pull down the voltage of the dummy shift signal terminal CR_dummy to be at a low level, so as to control the voltage of the dummy shift signal terminal CR_dummy.

Here, the thirteenth transistor M13 and the fourteenth transistor M14 may also be electrically connected to a fourth voltage signal terminal VGL2. That is, the second voltage signal terminal VGL1 is replaced with the fourth voltage signal terminal VGL2.

In some embodiments, as shown in FIGS. 7 to 16, 20 and 21, the first scan unit 1 further includes a first reset circuit 104, a second reset circuit 105, a third reset circuit 106 and a fourth reset circuit 107. The second scan unit 2 further includes a fifth reset circuit 206, a sixth reset circuit 207, a seventh reset circuit 208 and an eighth reset circuit 209.

In some examples, as shown in FIGS. 7 to 16, 20 and 21, the first reset circuit 104 is electrically connected to the input signal terminal Iput, the first pull-down node QB_A, and the second voltage signal terminal VGL1. The first reset circuit 104 is configured to reset the first pull-down node QB_A under the control of the input signal transmitted by the input signal terminal Iput.

For example, in a case where a level of the input signal is a high level, the first reset circuit 104 may be turned on due to the action of the input signal, and transmit the second voltage signal transmitted by the second voltage signal terminal VGL1 to the first pull-down node QB_A, so as to pull down the voltage of the first pull-down node QB_A to reset the first pull-down node QB_A.

For example, in a case where the plurality of shift registers 100 are cascaded to form the gate driving circuit 1000, the input signal terminal Iput in a certain stage shift register 100 may be electrically connected to the shift signal terminal CR<N> in other stage shift register 100, so that the certain stage shift register 100 may receive the shift signal output from the other stage shift register 100 as the input signal. For example, the input signal terminal Iput in an N-th stage shift register 100 may be electrically connected to the shift signal terminal CR<N> in an (N-2)-th stage shift register 100.

In some examples, as shown in FIGS. 7 to 16, 20 and 21, the second reset circuit 105 is electrically connected to the first pull-down node QB_A, the second pull-down node QB_B, the first pull-up node Q1, and the second voltage signal terminal VGL1. The second reset circuit 105 is configured to reset the first pull-up node Q1 under the control of the voltage of the first pull-down node QB_A or the voltage of the second pull-down node QB_B.

For example, in the case where the voltage of the first pull-down node QB_A is at a high level, the second reset circuit 105 may be turned on due to an action of the voltage of the first pull-down node QB_A, and transmit the second voltage signal transmitted by the second voltage signal terminal VGL1 to the first pull-up node Q1, so as to pull down the voltage of the first pull-up node Q1 to reset the first pull-up node Q1. In the case where the voltage of the second pull-down node QB_B is at a high level, the second reset circuit 105 may be turned on due to an action of the voltage of the second pull-down node QB_B, and transmit the second voltage signal transmitted by the second voltage signal terminal VGL1 to the first pull-up node Q1, so as to pull down the voltage of the first pull-up node Q1 to reset the first pull-up node Q1.

In some examples, as shown in FIGS. 7 to 16, 20 and 21, the third reset circuit 106 is electrically connected to the first pull-down node QB_A, the second pull-down node QB_B, the shift signal terminal CR<N>, the first scan signal terminal Oput1<N>, the second voltage signal terminal VGL1, and the fourth voltage signal terminal VGL2. The third reset circuit 106 is configured to reset the shift signal terminal CR<N> and the first scan signal terminal Oput1<N> under the control of the voltage of the first pull-down node QB_A or the voltage of the second pull-down node QB_B.

For example, in the case where the voltage of the first pull-down node QB_A is at a high level, the third reset circuit 106 may be turned on due to the action of the voltage of the first pull-down node QB_A, transmit the second voltage signal transmitted by the second voltage signal terminal VGL1 to the shift signal terminal CR<N> to pull down a voltage of the shift signal terminal CR<N> to reset the shift signal terminal CR<N>, and transmit a fourth voltage signal transmitted by the fourth voltage signal terminal VGL2 to the first scan signal terminal Oput1<N> to pull down a voltage of the first scan signal terminal Oput1<N> to reset the first scan signal terminal Oput1<N>. In the case where the voltage of the second pull-down node QB_B is at a high level, the third reset circuit 106 may be turned on due to the action of the voltage of the second pull-down node QB_B, transmit the second voltage signal transmitted by the second voltage signal terminal VGL1 to the shift signal terminal CR<N> to pull down the voltage of the shift signal terminal CR<N> to reset the shift signal terminal CR<N>, and transmit the fourth voltage signal transmitted by the fourth voltage signal terminal VGL2 to the first scan signal terminal Oput1<N> to pull down the voltage of the first scan signal terminal Oput1<N> to reset the first scan signal terminal Oput1<N>.

Here, the fourth voltage signal terminal VGL2 is configured to transmit the fourth voltage signal that is a direct current low level signal (e.g., lower than or equal to a low level section of a clock signal). For example, a low level voltage of the fourth voltage signal may be −6 V.

In some examples, as shown in FIGS. 11 to 14, 20 and 21, in the case where the first output circuit 102 is further electrically connected to the fifth clock signal terminal CLKF_1 and the first sensing signal terminal Oput2<N>, the third reset circuit 106 is further electrically connected to the first sensing signal terminal Oput2<N>. The third reset circuit 106 is further configured to reset the first sensing signal terminal Oput2<N> under the control of the voltage of the first pull-down node QB_A or the voltage of the second pull-down node QB_B.

For example, in the case where the voltage of the first pull-down node QB_A is at a high level, the third reset circuit 106 may be turned on due to the action of the voltage of the first pull-down node QB_A, and transmit the second voltage signal transmitted by the second voltage signal terminal VGL1 to the first sensing signal terminal Oput2<N>, so as to pull down a voltage of the first sensing signal terminal Oput2<N> to reset the first sensing signal terminal Oput2<N>. In the case where the voltage of the second pull-down node QB_B is at a high level, the third reset circuit 106 may be turned on due to the action of the voltage of the second pull-down node QB_B, and transmit the second voltage signal transmitted by the second voltage signal terminal VGL1 to the first sensing signal terminal Oput2<N>, so as to pull down the voltage of the first sensing signal terminal Oput2<N> to reset the first sensing signal terminal Oput2<N>.

In some examples, as shown in FIGS. 7 to 16, 20 and 21, the fourth reset circuit 107 is electrically connected to a display reset signal terminal STD, the first pull-up node Q1 and the second voltage signal terminal VGL1. The fourth reset circuit 107 is configured to reset the first pull-up node Q1 under a control of a display reset signal transmitted by the display reset signal terminal STD.

For example, in a case where a level of the display reset signal is a high level, the fourth reset circuit 107 may be turned on due to an action of the display reset signal, and transmit the second voltage signal transmitted by the second voltage signal terminal VGL1 to the first pull-up node Q1, so as to pull down the voltage of the first pull-up node Q1 to reset the first pull-up node Q1.

For example, in the case where the plurality of shift registers 100 are cascaded to form the gate driving circuit 1000, the display reset signal terminal STD in a certain stage shift register 100 may be electrically connected to the shift signal terminal CR<N> in other stage shift register 100, so that the certain stage shift register 100 may receive the shift signal output from the other stage shift register 100 as the display reset signal. For example, the display reset signal terminal STD in the N-th stage shift register 100 may be electrically connected to the shift signal terminal CR<N> in an (N+4)-th stage shift register 100.

In some examples, as shown in FIGS. 7 to 16, 20 and 21, the fifth reset circuit 206 is electrically connected to the input signal terminal Iput, the second pull-down node QB_B, and the second voltage signal terminal VGL1. The fifth reset circuit 206 is configured to reset the second pull-down node QB_B under the control of the input signal transmitted by the input signal terminal Iput.

For example, in the case where the level of the input signal is a high level, the fifth reset circuit 206 may be turned on due to the action of the input signal, and transmit the second voltage signal transmitted by the second voltage signal terminal VGL1 to the second pull-down node QB_B, so as to pull down the voltage of the second pull-down node QB_B to reset the second pull-down node QB_B.

In some examples, as shown in FIGS. 7 to 16, 20 and 21, the sixth reset circuit 207 is electrically connected to the first pull-down node QB_A, the second pull-down node QB_B, the second pull-up node Q2, and the second voltage signal terminal VGL1. The sixth reset circuit 207 is configured to reset the second pull-up node Q2 under the control of the voltage of the first pull-down node QB_A or the voltage of the second pull-down node QB_B.

For example, in the case where the voltage of the first pull-down node QB_A is at a high level, the sixth reset circuit 207 may be turned on due to the action of the voltage of the first pull-down node QB_A, and transmit the second voltage signal transmitted by the second voltage signal terminal VGL1 to the second pull-up node Q2, so as to pull down the voltage of the second pull-up node Q2 to reset the second pull-up node Q2. In the case where the voltage of the second pull-down node QB_B is at a high level, the sixth reset circuit 207 may be turned on due to the action of the voltage of the second pull-down node QB_B, and transmit the second voltage signal transmitted by the second voltage signal terminal VGL1 to the second pull-up node Q2, so as to pull down the voltage of the second pull-up node Q2 to reset the second pull-up node Q2.

In some examples, as shown in FIGS. 7 to 16, 20 and 21, the seventh reset circuit 208 is electrically connected to the first pull-down node QB_A, the second pull-down node QB_B, the second scan signal terminal Oput1<N+1>, and the fourth voltage signal terminal VGL2. The seventh reset circuit 208 is configured to reset the second scan signal terminal Oput1<N+1>under the control of the voltage of the first pull-down node QB_A or the voltage of the second pull-down node QB_B.

For example, in the case where the voltage of the first pull-down node QB_A is at a high level, the seventh reset circuit 208 may be turned on due to the action of the voltage of the first pull-down node QB_A, and transmit the fourth voltage signal transmitted by the fourth voltage signal terminal VGL2 to the second scan signal terminal Oput1<N+1>, so as to pull down a voltage of the second scan signal terminal Oput1<N+1> to reset the second scan signal terminal Oput1<N+1>. In the case where the voltage of the second pull-down node QB_B is at a high level, the seventh reset circuit 208 may be turned on due to the action of the voltage of the second pull-down node QB_B, and transmit the fourth voltage signal transmitted by the fourth voltage signal terminal VGL2 to the second scan signal terminal Oput1<N+1>, so as to pull down the voltage of the second scan signal terminal Oput1<N+1> to reset the second scan signal terminal Oput1<N+1>.

In some examples, as shown in FIGS. 11 to 14, 20 and 21, in the case where the second output circuit 202 is further electrically connected to the sixth clock signal terminal CLKF_2 and the second sensing signal terminal Oput2<N+1>, the seventh reset circuit 208 is further electrically connected to the second sensing signal terminal Oput2<N+1>. The seventh reset circuit 208 is further configured to reset the second sensing signal terminal Oput2<N+1>under the control of the voltage of the first pull-down node QB_A or the voltage of the second pull-down node QB_B.

For example, in the case where the voltage of the first pull-down node QB_A is at a high level, the seventh reset circuit 208 may be turned on due to the action of the voltage of the first pull-down node QB_A, and transmit the fourth voltage signal transmitted by the fourth voltage signal terminal VGL2 to the second sensing signal terminal Oput2<N+1>, so as to pull down a voltage of the second sensing signal terminal Oput2<N+1> to reset the second sensing signal terminal Oput2<N+1>. In the case where the voltage of the second pull-down node QB_B is at a high level, the seventh reset circuit 208 may be turned on due to the action of the voltage of the second pull-down node QB_B, and transmit the fourth voltage signal transmitted by the fourth voltage signal terminal VGL2 to the second sensing signal terminal Oput2<N+1>, so as to pull down the voltage of the second sensing signal terminal Oput2<N+1> to reset the second sensing signal terminal Oput2<N+1>.

In some examples, as shown in FIGS. 7 to 16, 20 and 21, the eighth reset circuit 209 is electrically connected to the display reset signal terminal STD, the second pull-up node Q2, and the second voltage signal terminal VGL1. The eighth reset circuit 209 is configured to reset the second pull-up node Q2 under the control of the display reset signal transmitted by the display reset signal terminal STD.

For example, in the case where the level of the display reset signal is a high level, the eighth reset circuit 209 may be turned on due to the action of the display reset signal, and transmit the second voltage signal transmitted by the second voltage signal terminal VGL1 to the second pull-up node Q2, so as to pull down the voltage of the second pull-up node Q2 to reset the second pull-up node Q2.

Structures of the first reset circuit 104, the second reset circuit 105, the third reset circuit 106 and the fourth reset circuit 107 that are included in the first scan unit 1, and the fifth reset circuit 206, the sixth reset circuit 207, the seventh reset circuit 208 and the eighth reset circuit 209 that are included in the second scan unit 2 will be schematically described below.

In some examples, as shown in FIGS. 8, 10, 12, 14, 16 and 21, the first reset circuit 104 includes a fifteenth transistor M15.

For example, as shown in FIGS. 8, 10, 12, 14, 16 and 21, a control electrode of the fifteenth transistor M15 is electrically connected to the input signal terminal Iput, a first electrode of the fifteenth transistor M15 is electrically connected to the first pull-down node QB_A, and a second electrode of the fifteenth transistor M15 is electrically connected to the second voltage signal terminal VGL1.

For example, in the case where the level of the input signal is a high level, the fifteenth transistor M15 may be turned on due to the action of the input signal, and transmit the second voltage signal transmitted by the second voltage signal terminal VGL1 to the first pull-down node QB_A.

In some examples, as shown in FIGS. 8, 10, 12, 14, 16 and 21, the second reset circuit 105 includes a sixteenth transistor M16 and a seventeenth transistor M17.

For example, as shown in FIGS. 8, 10, 12, 14, 16 and 21, a control electrode of the sixteenth transistor M16 is electrically connected to the second pull-down node QB_B, a first electrode of the sixteenth transistor M16 is electrically connected to the first pull-up node Q1, and a second electrode of the sixteenth transistor M16 is electrically connected to the second voltage signal terminal VGL1. A control electrode of the seventeenth transistor M17 is electrically connected to the first pull-down node QB_A, a first electrode of the seventeenth transistor M17 is electrically connected to the first pull-up node Q1, and a second electrode of the seventeenth transistor M17 is electrically connected to the second voltage signal terminal VGL1.

For example, in the case where the voltage of the second pull-down node QB_B is at a high level, the sixteenth transistor M16 may be turned on due to the action of the voltage of the second pull-down node QB_B, and transmit the second voltage signal transmitted by the second voltage signal terminal VGL1 to the first pull-up node Q1. In the case where the voltage of the first pull-down node QB_A is at a high level, the seventeenth transistor M17 may be turned on due to the action of the voltage of the first pull-down node QB_A, and transmit the second voltage signal transmitted by the second voltage signal terminal VGL1 to the first pull-up node Q1.

In some examples, as shown in FIGS. 8, 10, 12, 14, 16 and 21, the third reset circuit 106 includes an eighteenth transistor M18, a nineteenth transistor M19, a twentieth transistor M20 and a twenty-first transistor M21.

For example, as shown in FIGS. 8, 10, 12, 14, 16 and 21, a control electrode of the eighteenth transistor M18 is electrically connected to the first pull-down node QB_A, a first electrode of the eighteenth transistor M18 is electrically connected to the shift signal terminal CR<N>, and a second electrode of the eighteenth transistor M18 is electrically connected to the second voltage signal terminal VGL1. A control electrode of the nineteenth transistor M19 is electrically connected to the second pull-down node QB_B, a first electrode of the nineteenth transistor M19 is electrically connected to the shift signal terminal CR<N>, and a second electrode of the nineteenth transistor M19 is electrically connected to the second voltage signal terminal VGL1.

For example, in the case where the voltage of the first pull-down node QB_A is at a high level, the eighteenth transistor M18 may be turned on due to the action of the voltage of the first pull-down node QB_A, and transmit the second voltage signal transmitted by the second voltage signal terminal VGL1 to the shift signal terminal CR<N>. In the case where the voltage of the second pull-down node QB_B is at a high level, the nineteenth transistor M19 may be turned on due to the action of the voltage of the second pull-down node QB_B, and transmit the second voltage signal transmitted by the second voltage signal terminal VGL1 to the shift signal terminal CR<N>.

For example, as shown in FIGS. 8, 10, 12, 14, 16 and 21, a control electrode of the twentieth transistor M20 is electrically connected to the first pull-down node QB_A, a first electrode of the twentieth transistor M20 is electrically connected to the first scan signal terminal Oput1<N>, and a second electrode of the twentieth transistor M20 is electrically connected to the fourth voltage signal terminal VGL2. A control electrode of the twenty-first transistor M21 is electrically connected to the second pull-down node QB_B, a first electrode of the twenty-first transistor M21 is electrically connected to the first scan signal terminal Oput1<N>, and a second electrode of the twenty-first transistor M21 is electrically connected to the fourth voltage signal terminal VGL2.

For example, in the case where the voltage of the first pull-down node QB_A is at a high level, the twentieth transistor M20 may be turned on due to the action of the voltage of the first pull-down node QB_A, and transmit the fourth voltage signal transmitted by the fourth voltage signal terminal VGL2 to the first scan signal terminal Oput1<N>. In the case where the voltage of the second pull-down node QB_B is at a high level, the twenty-first transistor M21 may be turned on due to the action of the voltage of the second pull-down node QB_B, and transmit the fourth voltage signal transmitted by the fourth voltage signal terminal VGL2 to the first scan signal terminal Oput1<N>.

In some examples, as shown in FIGS. 12, 14 and 21, in the case where the first output circuit 102 is further electrically connected to the fifth clock signal terminal CLKF_1 and the first sensing signal terminal Oput2<N>, the third reset circuit 106 further includes a fifty-fifth transistor M55 and a fifty-sixth transistor M56.

For example, as shown in FIGS. 12, 14 and 21, a control electrode of the fifty-fifth transistor M55 is electrically connected to the first pull-down node QB_A, a first electrode of the fifty-fifth transistor M55 is electrically connected to the first sensing signal terminal Oput2<N>, and a second electrode of the fifty-fifth transistor M55 is electrically connected to the fourth voltage signal terminal VGL2. A control electrode of the fifty-sixth transistor M56 is electrically connected to the second pull-down node QB_B, a first electrode of the fifty-sixth transistor M56 is electrically connected to the first sensing signal terminal Oput2<N>, and a second electrode of the fifty-sixth transistor M56 is electrically connected to the fourth voltage signal terminal VGL2.

For example, in the case where the voltage of the first pull-down node QB_A is at a high level, the fifty-fifth transistor M55 may be turned on due to the action of the voltage of the first pull-down node QB_A, and transmit the fourth voltage signal transmitted by the fourth voltage signal terminal VGL2 to the first sensing signal terminal Oput2<N>. In the case where the voltage of the second pull-down node QB_B is at a high level, the fifty-sixth transistor M56 may be turned on due to the action of the voltage of the second pull-down node QB_B, and transmit the fourth voltage signal transmitted by the fourth voltage signal terminal VGL2 to the first sensing signal terminal Oput2<N>.

In some examples, as shown in FIGS. 8, 10, 12, 14, 16 and 21, the fourth reset circuit 107 includes a twenty-second transistor M22.

For example, as shown in FIGS. 8, 10, 12, 14, 16 and 21, a control electrode of the twenty-second transistor M22 is electrically connected to the display reset signal terminal STD, a first electrode of the twenty-second transistor M22 is electrically connected to the first pull-up node Q1, and a second electrode of the twenty-second transistor M22 is electrically connected to the second voltage signal terminal VGL1.

For example, in the case where the level of the display reset signal is a high level, the twenty-second transistor M22 may be turned on due to the action of the display reset signal, and transmit the second voltage signal transmitted by the second voltage signal terminal VGL1 to the first pull-up node Q1.

In some examples, as shown in FIGS. 8, 10, 12, 14, 16 and 21, the fifth reset circuit 206 includes a twenty-third transistor M23.

For example, as shown in FIGS. 8, 10, 12, 14, 16 and 21, a control electrode of the twenty-third transistor M23 is electrically connected to the input signal terminal Iput, a first electrode of the twenty-third transistor M23 is electrically connected to the second pull-down node QB_B, and a second electrode of the twenty-third transistor M23 is electrically connected to the second voltage signal terminal VGL1.

For example, in the case where the level of the input signal is a high level, the twenty-third transistor M23 may be turned on due to the action of the input signal, and transmit the second voltage signal transmitted by the second voltage signal terminal VGL1 to the second pull-down node QB_B.

In some examples, as shown in FIGS. 8, 10, 12, 14, 16 and 21, the sixth reset circuit 207 includes a twenty-fourth transistor M24 and a twenty-fifth transistor M25.

For example, as shown in FIGS. 8, 10, 12, 14, 16 and 21, a control electrode of the twenty-fourth transistor M24 is electrically connected to the first pull-down node QB_A, a first electrode of the twenty-fourth transistor M24 is electrically connected to the second pull-up node Q2, and a second electrode of the twenty-fourth transistor M24 is electrically connected to the second voltage signal terminal VGL1. A control electrode of the twenty-fifth transistor M25 is electrically connected to the second pull-down node QB_B, a first electrode of the twenty-fifth transistor M25 is electrically connected to the second pull-up node Q2, and a second electrode of the twenty-fifth transistor M25 is electrically connected to the second voltage signal terminal VGL1.

For example, in the case where the voltage of the first pull-down node QB_A is at a high level, the twenty-fourth transistor M24 may be turned on due to the action of the voltage of the first pull-down node QB_A, and transmit the second voltage signal transmitted by the second voltage signal terminal VGL1 to the second pull-up node Q2. In the case where the voltage of the second pull-down node QB_B is at a high level, the twenty-fifth transistor M25 may be turned on due to the action of the voltage of the second pull-down node QB_B, and transmit the second voltage signal transmitted by the second voltage signal terminal VGL1 to the second pull-up node Q2.

In some examples, as shown in FIGS. 8, 10, 12, 14, 16 and 21, the seventh reset circuit 208 includes a twenty-sixth transistor M26 and a twenty-seventh transistor M27.

For example, as shown in FIGS. 8, 10, 12, 14, 16 and 21, a control electrode of the twenty-sixth transistor M26 is electrically connected to the second pull-down node QB_B, a first electrode of the twenty-sixth transistor M26 is electrically connected to the second scan signal terminal Oput1<N+1>, and a second electrode of the twenty-sixth transistor M26 is electrically connected to the fourth voltage signal terminal VGL2. A control electrode of the twenty-seventh transistor M27 is electrically connected to the first pull-down node QB_A, a first electrode of the twenty-seventh transistor M27 is electrically connected to the second scan signal terminal Oput1<N+1>, and a second electrode of the twenty-seventh transistor M27 is electrically connected to the fourth voltage signal terminal VGL2.

For example, in the case where the voltage of the second pull-down node QB_B is at a high level, the twenty-sixth transistor M26 may be turned on due to the action of the voltage of the second pull-down node QB_B, and transmit the fourth voltage signal transmitted by the fourth voltage signal terminal VGL2 to the second scan signal terminal Oput1<N+1>. In the case where the voltage of the first pull-down node QB_A is at a high level, the twenty-seventh transistor M27 may be turned on due to the action of the voltage of the first pull-down node QB_A, and transmit the fourth voltage signal transmitted by the fourth voltage signal terminal VGL2 to the second scan signal terminal Oput1<N+1>.

In some examples, as shown in FIGS. 12, 14 and 21, in the case where the second output circuit 202 is further electrically connected to the sixth clock signal terminal CLKF_2 and the second sensing signal terminal Oput2<N+1>, the seventh reset circuit 208 further includes a fifty-seventh transistor M57 and a fifty-eighth transistor M58.

For example, as shown in FIGS. 12, 14 and 21, a control electrode of the fifty-seventh transistor M57 is electrically connected to the second pull-down node QB_B, a first electrode of the fifty-seventh transistor M57 is electrically connected to the second sensing signal terminal Oput2<N+1>, and a second electrode of the fifty-seventh transistor M57 is electrically connected to the fourth voltage signal terminal VGL2. A control electrode of the fifty-eighth transistor M58 is electrically connected to the first pull-down node QB_A, a first electrode of the fifty-eighth transistor M58 is electrically connected to the second sensing signal terminal Oput2<N+1>, and a second electrode of the fifty-eighth transistor M58 is electrically connected to the fourth voltage signal terminal VGL2.

For example, in the case where the voltage of the second pull-down node QB_B is at a high level, the fifty-seventh transistor M57 may be turned on due to the action of the voltage of the second pull-down node QB_B, and transmit the fourth voltage signal transmitted by the fourth voltage signal terminal VGL2 to the second sensing signal terminal Oput2<N+1>. In the case where the voltage of the first pull-down node QB_A is at a high level, the fifty-eighth transistor M58 may be turned on due to the action of the voltage of the first pull-down node QB_A, and transmit the fourth voltage signal transmitted by the fourth voltage signal terminal VGL2 to the second sensing signal terminal Oput2<N+1>.

In some examples, as shown in FIGS. 8, 10, 12, 14, 16 and 21, the eighth reset circuit 209 includes a twenty-eighth transistor M28.

For example, as shown in FIGS. 8, 10, 12, 14, 16 and 21, a control electrode of the twenty-eighth transistor M28 is electrically connected to the display reset signal terminal STD, a first electrode of the twenty-eighth transistor M28 is electrically connected to the second pull-up node Q2, and a second electrode of the twenty-eighth transistor M28 is electrically connected to the second voltage signal terminal VGL1.

For example, in the case where the level of the display reset signal is a high level, the twenty-eighth transistor M28 may be turned on due to the action of the display reset signal, and transmit the second voltage signal transmitted by the second voltage signal terminal VGL1 to the second pull-up node Q2.

In some embodiments, as shown in FIGS. 7 to 16, 20 and 21, the first scan unit 1 further includes a ninth reset circuit 108, and the second scan unit 2 further includes a tenth reset circuit 210.

In some examples, as shown in FIGS. 7 to 16, 20 and 21, the ninth reset circuit 108 is electrically connected to a global reset signal terminal TRST, the first pull-up node Q1, and the second voltage signal terminal VGL1. The ninth reset circuit 108 is configured to reset the first pull-up node Q1 under a control of a global reset signal transmitted by the global reset signal terminal TRST.

For example, in a case where a level of the global reset signal is a high level, the ninth reset circuit 108 may be turned on due to an action of the global reset signal, and transmit the second voltage signal transmitted by the second voltage signal terminal VGL1 to the first pull-up node Q1, so as to pull down the voltage of the first pull-up node Q1 to reset the first pull-up node Q1.

In some examples, as shown in FIGS. 7 to 16, 20 and 21, the tenth reset circuit 210 is electrically connected to the global reset signal terminal TRST, the second pull-up node Q2, and the second voltage signal terminal VGL1. The tenth reset circuit 210 is configured to reset the second pull-up node Q2 under the control of the global reset signal transmitted by the global reset signal terminal TRST.

For example, in the case where the level of the global reset signal is a high level, the tenth reset circuit 210 may be turned on due to the action of the global reset signal, and transmit the second voltage signal transmitted by the second voltage signal terminal VGL1 to the second pull-up node Q2, so as to pull down the voltage of the second pull-up node Q2 to reset the second pull-up node Q2.

For example, before the display phase of the frame, in response to the global reset signal transmitted by the global reset signal terminal TRST, the ninth reset circuit 108 and the tenth reset circuit 210 in each stage of shift register 100 may be turned on, so as to respectively pull down the voltages of the first pull-up node Q1 and the second pull-up node Q2 to reset the first pull-up node Q1 and the second pull-up node Q2.

Structures of the ninth reset circuit 108 included in the first scan unit 1 and the tenth reset circuit 210 included in the second scan unit 2 will be schematically described below.

In some examples, as shown in FIGS. 8, 10, 12, 14, 16 and 21, the ninth reset circuit 108 includes a twenty-ninth transistor M29.

For example, as shown in FIGS. 8, 10, 12, 14, 16 and 21, a control electrode of the twenty-ninth transistor M29 is electrically connected to the global reset signal terminal TRST, a first electrode of the twenty-ninth transistor M29 is electrically connected to the first pull-up node Q1, and a second electrode of the twenty-ninth transistor M29 is electrically connected to the second voltage signal terminal VGL1.

For example, in the case where the level of the global reset signal is a high level, the twenty-ninth transistor M29 may be turned on due to the action of the global reset signal, and transmit the second voltage signal transmitted by the second voltage signal terminal VGL1 to the first pull-up node Q1.

In some examples, as shown in FIGS. 8, 10, 12, 14, 16 and 21, the tenth reset circuit 210 includes a thirtieth transistor M30.

For example, as shown in FIGS. 8, 10, 12, 14, 16 and 21, a control electrode of the thirtieth transistor M30 is electrically connected to the global reset signal terminal TRST, a first electrode of the thirtieth transistor M30 is electrically connected to the second pull-up node Q2, and a second electrode of the thirtieth transistor M30 is electrically connected to the second voltage signal terminal VGL1.

For example, in the case where the level of the global reset signal is a high level, the thirtieth transistor M30 may be turned on due to the action of the global reset signal, and transmit the second voltage signal transmitted by the second voltage signal terminal VGL1 to the second pull-up node Q2.

It will be noted that a plurality of scan units may be included in the shift register 100. For example, the number of scan units may be three, four or more. Structure(s) of the remaining scan unit(s) included in the shift register 100 may be, for example, same as the structure of the first scan unit 1, or may be same as the structure of the second scan unit 2.

In some embodiments, there are various manners to compensate the sub-pixel in the display panel PNL, which may be selectively set according to actual needs.

For example, a pixel compensation circuit may be provided in the sub-pixel to internally compensate the sub-pixel by using the pixel compensation circuit. For another example, a sensing transistor may be provided in the sub-pixel to externally compensate the sub-pixel by using the sensing transistor.

As an example, an external compensation is used in the embodiments of the present disclosure. As shown in FIG. 5, a pixel driving circuit in each sub-pixel in the display panel PNL may be, for example, of a 3T1C structure ("T" represents a transistor, and "C" represents a storage capacitor). Each pixel driving circuit may include a switching transistor T1, a driving transistor T2, a sensing transistor T3 and a storage capacitor Cst.

Here, in the shift register 100, in a case where the first output circuit 102 in the first scan unit 1 is not electrically connected to the first sensing signal terminal Oput2<N>, the first scan signal terminal Oput1<N> may be electrically connected to a gate line GL, and the first scan signal may be transmitted to a control electrode of a corresponding switching transistor T1 through the gate line GL. Moreover, the first scan signal may be transmitted as a first sensing signal to a control electrode of a corresponding sensing transistor T3 through the gate line GL. In a case where the second output circuit 202 in the second scan unit 2 is not electrically connected to the second sensing signal terminal Oput2<N+1>, the second scan signal terminal Oput1<N+1> may be electrically connected to a gate line GL, and the second scan signal may be transmitted to a control electrode of a corresponding switching transistor T1 through the gate line GL. Moreover, the second scan signal may be transmitted as a second sensing signal to a control electrode of a corresponding sensing transistor T3 through the gate line GL.

In the shift register 100, in a case where the first output circuit 102 in the first scan unit 1 is electrically connected to the first sensing signal terminal Oput2<N>, the first scan signal terminal Oput1<N> may be electrically connected to a gate line GL, and transmit the first scan signal to a control electrode of a corresponding switching transistor T1 through the gate line GL. Moreover, the first sensing signal terminal Oput2<N> may be electrically connected to another gate line GL, and transmit the first sensing signal to a control electrode of a corresponding sensing transistor T3 through the gate line GL. In a case where the second output circuit 202 in the second scan unit 2 is electrically connected to the second sensing signal terminal Oput2<N+1>, the second scan signal terminal Oput1<N+1> may be electrically connected to a gate line GL, and transmit the second scan signal to a control electrode of a corresponding switching transistor T1 through the gate line GL. Moreover, the second sensing signal terminal Oput2<N+1> may be electrically connected to another gate line GL, and transmit the second sensing signal to a control electrode of a corresponding sensing transistor T3 through the gate line GL.

From the foregoing, the display phase of the frame may include the display period and the blanking period that are sequentially performed. In the display period, the shift register 100 may drive corresponding sub-pixels in the display panel PNL to display image(s). In the blanking period, the shift register 100 may drive corresponding sub-pixels in the display panel PNL to be externally compensated.

Based on this, in some embodiments, as shown in FIGS. 9 to 16, 20 and 21, the shift register 100 may further include the blanking input unit 3.

In some examples, as shown in FIGS. 9 to 16, 20 and 21, the blanking input unit 3 is electrically connected to a selection control signal terminal OE, the input signal terminal Iput, the second voltage signal terminal VGL1, a fourth clock signal terminal CLKA, the first pull-up node Q1, and the second pull-up node Q2. The blanking input unit 3 is configured to transmit a fourth clock signal received at the fourth clock signal terminal CLKA to the first pull-up node Q1 and the second pull-up node Q2 under a control of a selection control signal transmitted by the selection control signal terminal OE.

For example, in the blanking period in the display phase of the frame, in a case where a level of the selection control signal transmitted by the selection control signal terminal OE is a high level, the selection control signal may cooperate with the input signal received at the input signal terminal Iput, so that the blanking input unit 3 transmits the fourth clock signal received at the fourth clock signal terminal CLKA to the first pull-up node Q1 and the second pull-up node Q2, so as to charge the first pull-up node Q1 and the second pull-up node Q2.

After the voltage of the first pull-up node Q1 is increased, the first output circuit 102 may be turned on under the control of the voltage of the first pull-up node Q1. If the first output circuit 102 is not electrically connected to the first sensing signal terminal Oput2<N>, the first output circuit 102 may output the second clock signal received at the second clock signal terminal CLKE_1 as both the first scan signal and a first sensing signal from the first scan signal terminal Oput1<N>. If the first output circuit 102 is electrically connected to the first sensing signal terminal Oput2<N>, the first output circuit 102 may output the fifth clock signal received at the fifth clock signal terminal CLKF_1 as the first sensing signal from the first sensing signal terminal Oput2<N>.

After the voltage of the second pull-up node Q2 is increased, the second output circuit 202 may be turned on under the control of the voltage of the second pull-up node Q2. If the second output circuit 202 is not electrically connected to the second sensing signal terminal Oput2<N+1>, the second output circuit 202 may output the third clock signal received at the third clock signal terminal CLKE_2 as both the second scan signal and a second sensing signal from the second scan signal terminal Oput1<N+1>. If the second output circuit 202 is electrically connected to the second sensing signal terminal Oput2<N+1>, the second output circuit 202 may output the sixth clock signal received at the sixth clock signal terminal CLKF_2 as the second sensing signal from the second sensing signal terminal Oput2<N+1>.

In some embodiments, as shown in FIGS. 9 to 16, 20 and 21, the blanking input circuit 3 includes a selection control circuit 301, a third input circuit 302, a first transmission circuit 303, and a second transmission circuit 304.

In some examples, as shown in FIGS. 9 to 16, 20 and 21, the selection control circuit 301 is electrically connected to the selection control signal terminal OE, the input signal terminal Iput, the second voltage signal terminal VGL1, and a first blanking node H. The selection control circuit 301 is configured to transmit the input signal received at the input signal terminal Iput to the first blanking node H under the control of the selection control signal.

For example, in the case where the level of the selection control signal is a high level, the selection control circuit 301 may be turned on under the control of the selection control signal, and transmit the received input signal to the first blanking node H, so that a voltage of the first blanking node H is increased.

For example, when the shift register 100 is required to output the first sensing signal and/or the second sensing signal, a waveform and a timing of the selection control signal may be same as a waveform and a timing of the input signal, respectively, so that the selection control circuit 301 is turned on.

In some examples, as shown in FIGS. 9 to 16, 20 and 21, the third input circuit 302 is electrically connected to the first blanking node H, the fourth clock signal terminal CLKA, and a second blanking node N. The third input circuit 302 is configured to transmit the fourth clock signal received at the fourth clock signal terminal CLKA to the second blanking node N under a control of the voltage of the first blanking node H.

For example, in a case where the selection control circuit 301 is turned on and the voltage of the first blanking node H is increased, the third input circuit 302 may be turned on under the control of the voltage of the first blanking node H, receive the fourth clock signal transmitted by the fourth clock signal terminal CLKA, and transmit the fourth clock signal to the second blanking node N.

In some examples, as shown in FIGS. 9 to 16, 20 and 21, the first transmission circuit 303 is electrically connected to the fourth clock signal terminal CLKA, the second blanking node N, and the first pull-up node Q1. The first transmission circuit 303 is configured to transmit the fourth clock signal received at the second blanking node N to the first pull-up node Q1 under a control of the fourth clock signal transmitted by the fourth clock signal terminal CLKA.

For example, in a case where a level of the fourth clock signal transmitted by the fourth clock signal terminal CLKA is a high level, the first transmission circuit 303 may be turned on under the control of the fourth clock signal, receive the fourth clock signal at the second blanking node N, and transmit the received fourth clock signal to the first pull-up node Q1, so that the voltage of the first pull-up node Q1 is increased.

In some examples, as shown in FIGS. 9 to 16, 20 and 21, the second transmission circuit 304 is electrically connected to the fourth clock signal terminal CLKA, the second blanking node N, and the second pull-up node Q2. The second transmission circuit 304 is configured to transmit the fourth clock signal received at the second blanking node N to the second pull-up node Q2 under the control of the fourth clock signal transmitted by the fourth clock signal terminal CLKA.

For example, in the case where the level of the fourth clock signal transmitted by the fourth clock signal terminal CLKA is a high level, the second transmission circuit 304 may be turned on under the control of the fourth clock signal, receive the fourth clock signal at the second blanking node N, and transmit the received fourth clock signal to the second pull-up node Q2, so that the voltage of the second pull-up node Q2 is increased.

Structures of the selection control circuit 301, the third input circuit 302, the first transmission circuit 303 and the second transmission circuit 304 will be schematically described below.

In some examples, as shown in FIGS. 10, 12, 14, 16 and 21, the selection control circuit 301 includes a thirty-third transistor M33 and a third capacitor C3.

For example, as shown in FIGS. 10, 12, 14, 16 and 21, a control electrode of the thirty-third transistor M33 is electrically connected to the selection control signal terminal OE, a first electrode of the thirty-third transistor M33 is electrically connected to the input signal terminal Iput, and a second electrode of the thirty-third transistor M33 is electrically connected to the first blanking node H.

For example, in the case where the level of the selection control signal transmitted by the selection control signal terminal OE is a high level, the thirty-third transistor M33 may be turned on due to an action of the selection control signal, and transmit the input signal transmitted by the input signal terminal Iput to the first blanking node H, so as to charge the first blanking node H.

It will be noted that the "electrical connection" herein may be a direct electrical connection or an indirect electrical connection, and may be arranged according to the structure of the shift register 100.

Figure 10:
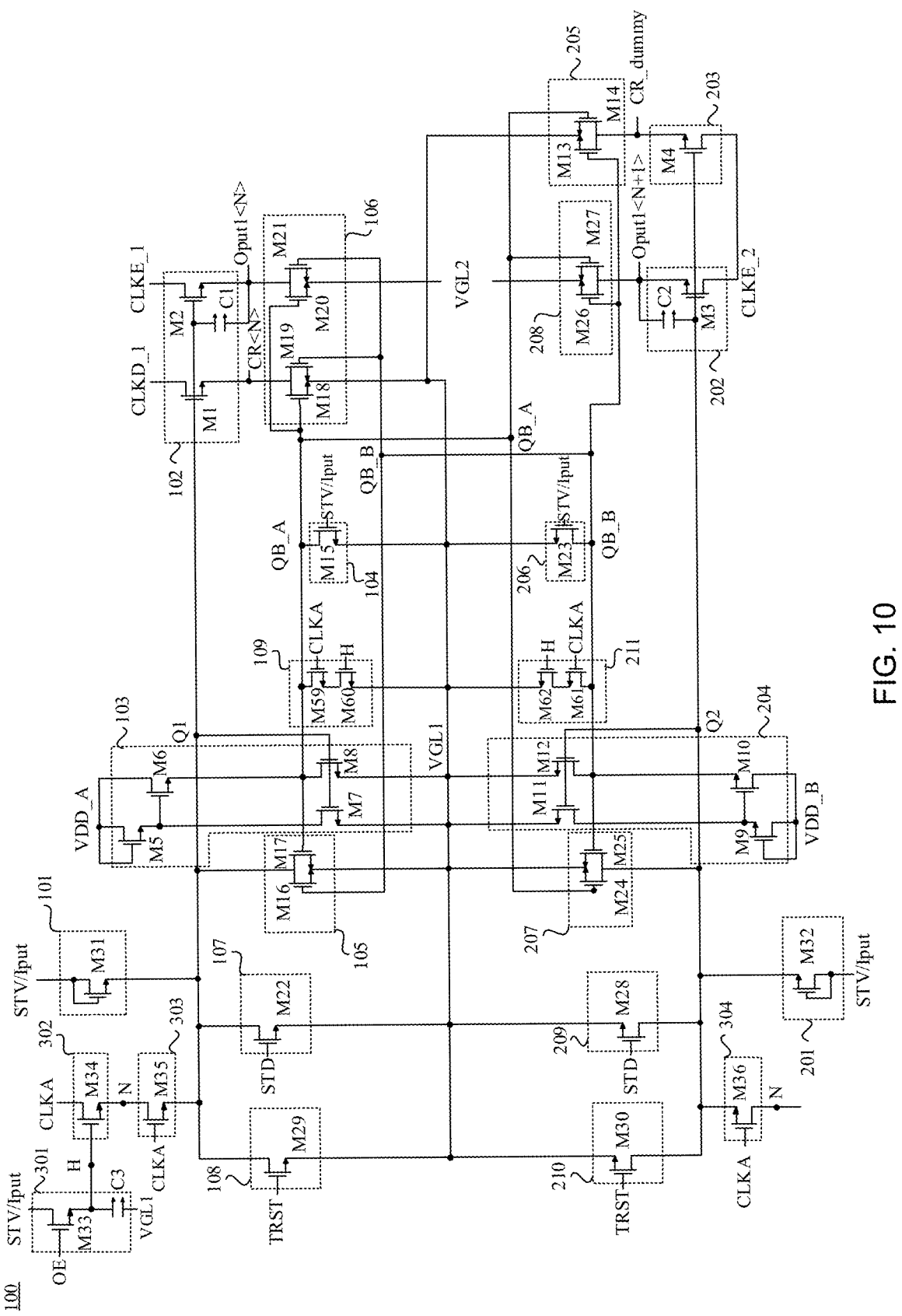
FIG. 10 is a circuit diagram of another shift register, in accordance with some embodiments of the present disclosure.
Figure 11:
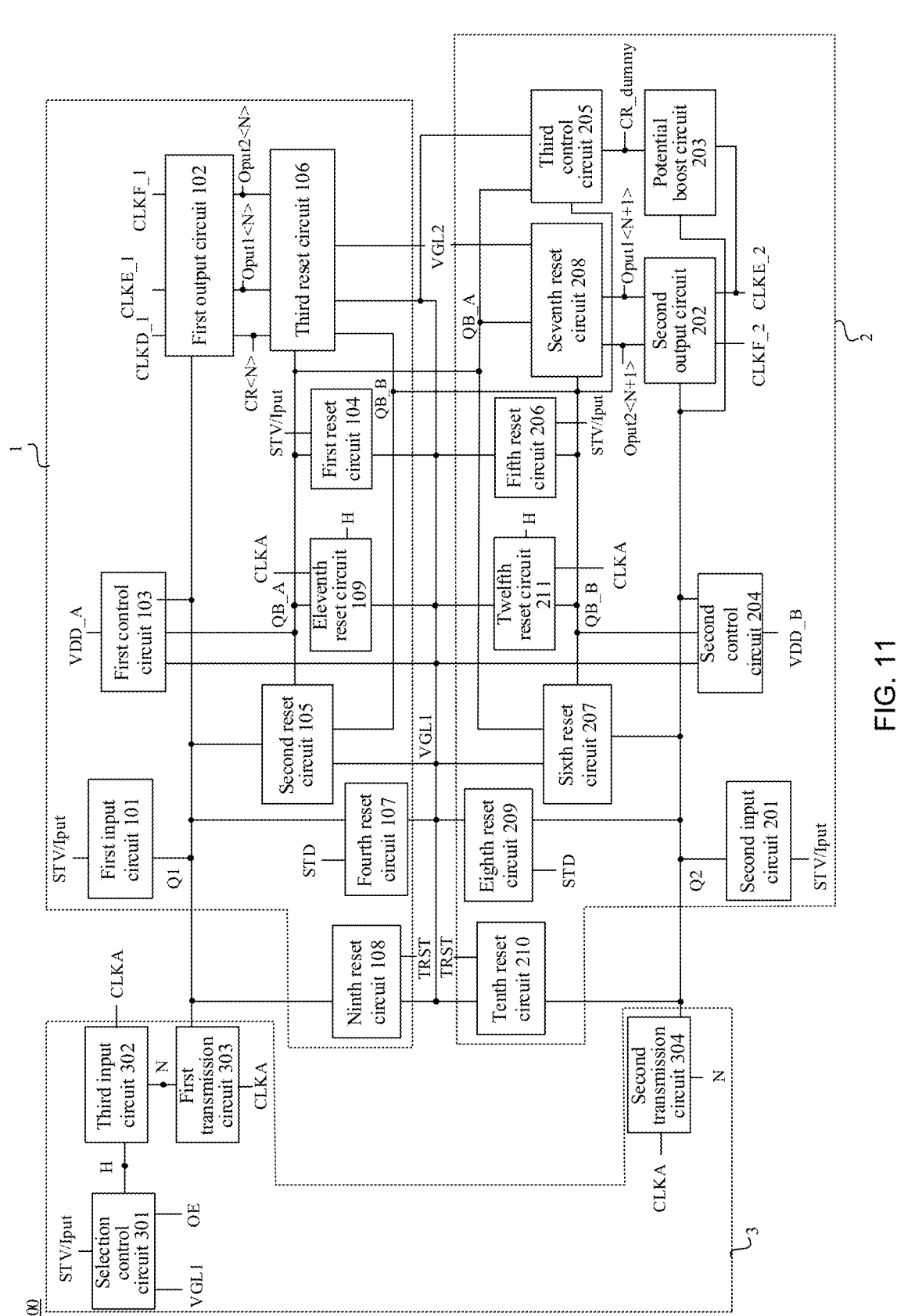
FIG. 11 is a structural diagram of yet another shift register, in accordance with some embodiments of the present disclosure.
Figure 16:
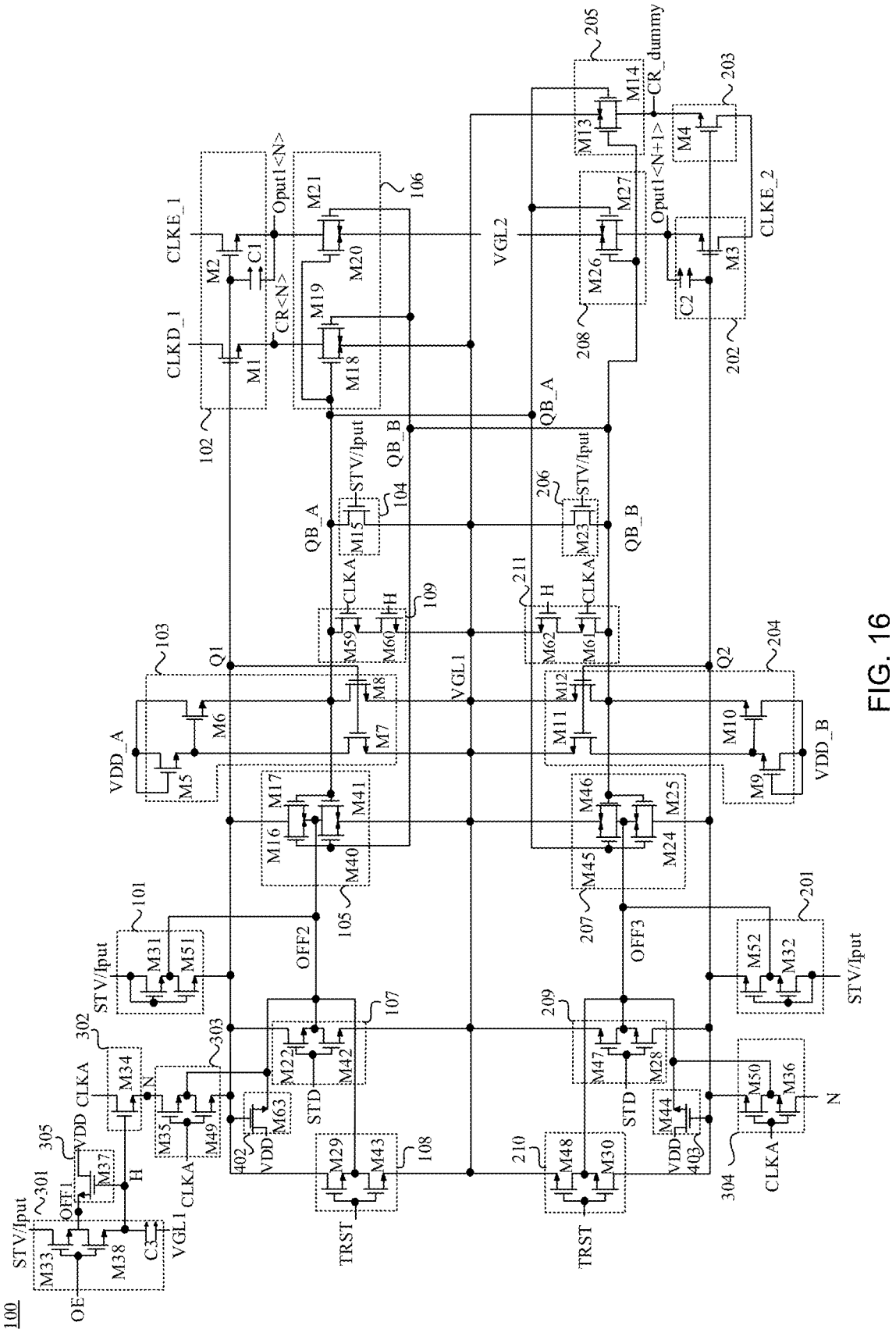
FIG. 16 is a circuit diagram of yet another shift register, in accordance with some embodiments of the present disclosure.

For example, as shown in FIGS. 10 and 12, the second electrode of the thirty-third transistor M33 may be directly electrically connected to the first blanking node H, and no other circuit structure is provided between the second electrode of the thirty-third transistor M33 and the first blanking node H. As shown in FIGS. 14, 16 and 21, the second electrode of the thirty-third transistor M33 may be indirectly electrically connected to the first blanking node H, and a thirty-eighth transistor M38 is provided between the second electrode of the thirty-third transistor M33 and the first blanking node H.

For example, as shown in FIGS. 10, 12, 14, 16 and 21, a first terminal of the third capacitor C3 is electrically connected to the first blanking node H, and a second terminal of the third capacitor C3 is electrically connected to the second voltage signal terminal VGL1.

For example, in a process of charging the first blanking node H by the selection control circuit 301, the third capacitor C3 is also charged. In this way, in a case where the selection control circuit 301 is turned off, the third capacitor C3 may be discharged, so that the voltage of the first blanking node H is maintained at a high level.

In some examples, as shown in FIGS. 10, 12, 14, 16 and 21, the third input circuit 302 includes a thirty-fourth transistor M34.

For example, as shown in FIGS. 10, 12, 14, 16 and 21, a control electrode of the thirty-fourth transistor M34 is electrically connected to the first blanking node H, a first electrode of the thirty-fourth transistor M34 is electrically connected to the fourth clock signal terminal CLKA, and a second electrode of the thirty-fourth transistor M34 is electrically connected to the second blanking node N.

For example, in a case where the voltage of the first blanking node H is at a high level, the thirty-fourth transistor M34 may be turned on under the control of the voltage of the first blanking node H, and transmit the fourth clock signal received at the fourth clock signal terminal CLKA to the second blanking node N.

In some examples, as shown in FIGS. 10, 12, 14, 16 and 21, the first transmission circuit 303 includes a thirty-fifth transistor M35.

For example, as shown in FIGS. 10, 12, 14, 16 and 21, a control electrode of the thirty-fifth transistor M35 is electrically connected to the fourth clock signal terminal CLKA, a first electrode of the thirty-fifth transistor M35 is electrically connected to the second blanking node N, and a second electrode of the thirty-fifth transistor M35 is electrically connected to the first pull-up node Q1.

For example, in the case where the level of the fourth clock signal transmitted by the fourth clock signal terminal CLKA is a high level, the thirty-fifth transistor M35 may be turned on due to an action of the fourth clock signal, and transmit the fourth clock signal from the second blanking node N to the first pull-up node Q1, so as to charge the first pull-up node Q1.

In some examples, as shown in FIGS. 10, 12, 14, 16 and 21, the second transmission circuit 304 includes a thirty-sixth transistor M36.

For example, as shown in FIGS. 10, 12, 14, 16 and 21, a control electrode of the thirty-sixth transistor M36 is electrically connected to the fourth clock signal terminal CLKA, a first electrode of the thirty-sixth transistor M36 is electrically connected to the second blanking node N, and a second electrode of the thirty-sixth transistor M36 is electrically connected to the second pull-up node Q2.

For example, in the case where the level of the fourth clock signal transmitted by the fourth clock signal terminal CLKA is a high level, the thirty-sixth transistor M36 may be turned on due to the action of the fourth clock signal, and transmit the fourth clock signal from the second blanking node N to the second pull-up node Q2, so as to charge the second pull-up node Q2.

In some embodiments, as shown in FIGS. 9 to 16, 20 and 21, in a case where the shift register 100 further includes the blanking input unit 3, the first scan unit 1 further includes an eleventh reset circuit 109, and the second scan unit 2 further includes a twelfth reset circuit 211.

In some examples, as shown in FIGS. 9 to 16, 20 and 21, the eleventh reset circuit 109 is electrically connected to the fourth clock signal terminal CLKA, the first blanking node H, the first pull-down node QB_A, and the second voltage signal terminal VGL1. The eleventh reset circuit 109 is configured to reset the first pull-down node QB_A under a control of the fourth clock signal transmitted by the fourth clock signal terminal CLKA and the voltage of the first blanking node H.

For example, in the case where the level of the fourth clock signal is a high level and the voltage of the first blanking node H is at a high level, the eleventh reset circuit 109 may be turned on under a combined action of the fourth clock signal and the voltage of the first blanking node H, and transmit the second voltage signal transmitted by the second voltage signal terminal VGL1 to the first pull-down node QB_A, so as to pull down the voltage of the first pull-down node QB_A to reset the first pull-down node QB_A.

In some examples, as shown in FIGS. 9 to 16, 20 and 21, the twelfth reset circuit 211 is electrically connected to the fourth clock signal terminal CLKA, the first blanking node H, the second pull-down node QB_B, and the second voltage signal terminal VGL1. The twelfth reset circuit 211 is configured to reset the second pull-down node QB_B under a control of the fourth clock signal transmitted by the fourth clock signal terminal CLKA and the voltage of the first blanking node H.

For example, in the case where the level of the fourth clock signal is a high level and the voltage of the first blanking node H is at a high level, the twelfth reset circuit 211 may be turned on under the combined action of the fourth clock signal and the voltage of the first blanking node H, and transmit the second voltage signal transmitted by the second voltage signal terminal VGL1 to the second pull-down node QB_B, so as to pull down the voltage of the second pull-down node QB_B to reset the second pull-down node QB_B.

Structures of the eleventh reset circuit 109 included in the first scan unit 1 and the twelfth reset circuit 211 included in the second scan unit 2 will be schematically described below.

In some examples, as shown in FIGS. 10, 12, 14, 16 and 21, the eleventh reset circuit 109 includes a fifty-ninth transistor M59 and a sixtieth transistor M60.

For example, as shown in FIGS. 10, 12, 14, 16 and 21, a control electrode of the fifty-ninth transistor M59 is electrically connected to the fourth clock signal terminal CLKA, a first electrode of the fifty-ninth transistor M59 is electrically connected to the first pull-down node QB_A, and a second electrode of the fifty-ninth transistor M59 is electrically connected to a first electrode of the sixtieth transistor M60. A control electrode of the sixtieth transistor M60 is electrically connected to the first blanking node H, and a second electrode of the sixtieth transistor M60 is electrically connected to the second voltage signal terminal VGL1.

For example, in the case where the level of the fourth clock signal is a high level and the voltage of the first blanking node H is at a high level, the sixtieth transistor M60 may be turned on under the control of the voltage of the first blanking node H, receive and transmit the second voltage signal to the second electrode of the fifty-ninth transistor M59. The fifty-ninth transistor M59 may be turned on due to the action of the fourth clock signal, and transmit the second voltage signal to the first pull-down node QB_A, so as to pull down the voltage of the first pull-down node QB_A to reset the first pull-down node QB_A.

In some examples, as shown in FIGS. 10, 12, 14, 16 and 21, the twelfth reset circuit 211 includes a sixty-first transistor M61 and a sixty-second transistor M62. For example, as shown in FIGS. 10, 12, 14, 16 and 21, a control electrode of the sixty-first transistor M61 is electrically connected to the fourth clock signal terminal CLKA, a first electrode of the sixty-first transistor M61 is electrically connected to the second pull-down node QB_B, and a second electrode of the sixty-first transistor M61 is electrically connected to a first electrode of the sixty-second transistor M62. A control electrode of the sixty-second transistor M62 is electrically connected to the first blanking node H, and a second electrode of the sixty-second transistor M62 is electrically connected to the second voltage signal terminal VGL1.

For example, in the case where the level of the fourth clock signal is a high level and the voltage of the first blanking node H is at a high level, the sixty-second transistor M62 may be turned on under the control of the voltage of the first blanking node H, and receive and transmit the second voltage signal to the second electrode of the sixty-first transistor M61. The sixty-first transistor M61 may be turned on due to the action of the fourth clock signal, and transmit the second voltage signal to the second pull-down node QB_B, so as to pull down the voltage of the second pull-down node QB_B to reset the second pull-down node QB_B.

In some embodiments, as shown in FIGS. 13 to 16, 20 and 21, the blanking input unit 3 further includes a first leakage prevention circuit 305.

In some examples, as shown in FIGS. 13 to 16, 20 and 21, the first leakage prevention circuit 305 is electrically connected to the first blanking node H, a fifth voltage signal terminal VDD, and a first leakage prevention node OFF1. The first leakage prevention circuit 305 is configured to transmit a fifth voltage signal received at the fifth voltage signal terminal VDD to the first leakage prevention node OFF1 under the control of the voltage of the first blanking node H.

For example, in the case where the selection control circuit 301 is turned on and the voltage of the first blanking node H is increased, the first leakage prevention circuit 305 may be turned on under the control of the voltage of the first blanking node H, and receive and transmit the fifth voltage signal to the first leakage prevention node OFF1, so that a voltage of the first leakage prevention node OFF1 is increased.

Here, the selection control circuit 301 is further electrically connected to the first leakage prevention node OFF1.

In a case where the voltage of the first blanking node H is increased and the selection control circuit 301 is inoperative, the first blanking node H is easy to generate an electric leakage through the selection control circuit 301, which results in a difficulty of maintaining the first blanking node H at a high and stable voltage, and thus, easily results in a deviation in the signal output from the selection control circuit 301.

By electrically connecting the selection control circuit 301 to the first leakage prevention node OFF1, the electric leakage of the first blanking node H through the selection control circuit 301 may be avoided, so that the first blanking node H is able to be maintained at a high and stable voltage, so as to avoid affecting an on state of the third input circuit 302.

For example, the fifth voltage signal terminal VDD is configured to transmit a direct current high level signal.

A structure of the first leakage prevention circuit 305 will be schematically described below.

In some examples, as shown in FIGS. 14, 16 and 21, the first leakage prevention circuit 305 includes a thirty-seventh transistor M37.

For example, as shown in FIGS. 14, 16 and 21, a control electrode of the thirty-seventh transistor M37 is electrically connected to the first blanking node H, a first electrode of the thirty-seventh transistor M37 is electrically connected to the fifth voltage signal terminal VDD, and a second electrode of the thirty-seventh transistor M37 is electrically connected to the first leakage prevention node OFF1.

For example, in the case where the voltage of the first blanking node H is at a high level, the thirty-seventh transistor M37 may be turned on under the control of the voltage of the first blanking node H, and transmit the fifth voltage signal transmitted by the fifth voltage signal terminal VDD to the first leakage prevention node OFF1, so that the voltage of the first leakage prevention node OFF1 is increased.

On this basis, as shown in FIGS. 14, 16 and 21, the selection control circuit 301 further includes the thirty-eighth transistor M38.

For example, as shown in FIGS. 14, 16 and 21, a control electrode of the thirty-eighth transistor M38 is electrically connected to the selection control signal terminal OE, a first electrode of the thirty-eighth transistor M38 is electrically connected to the first leakage prevention node OFF1, and a second electrode of the thirty-eighth transistor M38 is electrically connected to the first blanking node H. The second electrode of the thirty-third transistor M33 is electrically connected to the first leakage prevention node OFF1, and is electrically connected to the first blanking node H through the thirty-eighth transistor M38.

For example, in the case where the level of the selection control signal transmitted by the selection control signal terminal OE is a high level, the thirty-third transistor M33 and the thirty-eighth transistor M38 may be turned on synchronously due to the action of the selection control signal. The thirty-third transistor M33 may transmit the input signal transmitted by the input signal terminal Iput to the first leakage prevention node OFF1, and the thirty-eighth transistor M38 may transmit the input signal from the first leakage prevention node OFF1 to the first blanking node H, so as to charge the first blanking node H.

Here, in the case where the voltage of the first blanking node H is at a high level and the selection control circuit 301 is inoperative, the thirty-seventh transistor M37 in the first leakage prevention circuit 305 may transmit the fifth voltage signal to the first leakage prevention node OFF1 to reduce a voltage difference between the first leakage prevention node OFF1 and the first blanking node H, so that a voltage difference between the control electrode and the first electrode of the thirty-eighth transistor M38 is less than zero, ensuring that the thirty-eighth transistor M38 is completely or relatively completely turned off. In this way, the electric leakage of the first blanking node H through the selection control circuit 301 may be avoided, so that the first blanking node H is able to be maintained at a high and stable voltage.

In some embodiments, as shown in FIGS. 13 to 16, 20 and 21, the shift register 100 further includes a leakage prevention unit 4.

In some examples, as shown in FIGS. 13 to 16, 20 and 21, the leakage prevention unit 4 is electrically connected to the first pull-up node Q1, a second leakage prevention node OFF2, and the fifth voltage signal terminal VDD. The leakage prevention unit 4 is configured to transmit the fifth voltage signal received at the fifth voltage signal terminal VDD to the second leakage prevention node OFF2 under the control of the voltage of the first pull-up node Q1.

For example, in the case where the voltage of the first pull-up node Q1 is at a high level, the leakage prevention unit 4 may be turned on under the control of the voltage of the first pull-up node Q1, and receive and transmit the fifth voltage signal to the second leakage prevention node OFF2, so that a voltage of the second leakage prevention node OFF2 is increased (the voltage of the second leakage prevention node OFF2 is, for example, less than or equal to the voltage of the first pull-up node Q1).

Figure 13:
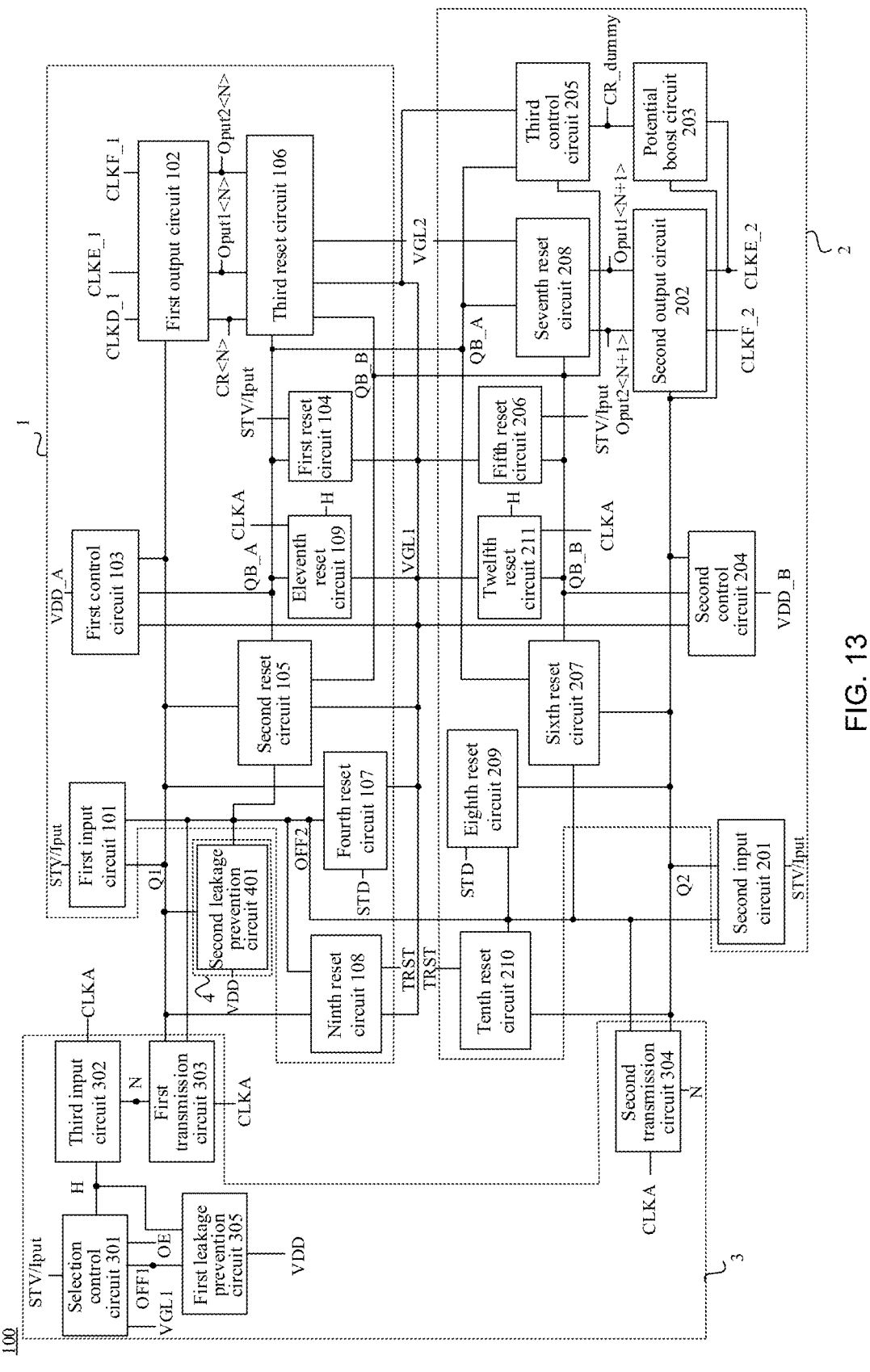
FIG. 13 is a structural diagram of yet another shift register, in accordance with some embodiments of the present disclosure.

In some embodiments, as shown in FIGS. 13 and 14, the leakage prevention unit 4 includes a second leakage prevention circuit 401.

In some examples, as shown in FIGS. 13 and 14, the second leakage prevention circuit 401 is electrically connected to the first pull-up node Q1, the second leakage prevention node OFF2, and the fifth voltage signal terminal VDD. The second leakage prevention circuit 401 is configured to transmit the fifth voltage signal received at the fifth voltage signal terminal VDD to the second leakage prevention node OFF2 under the control of the voltage of the first pull-up node Q1.

For example, in the case where the voltage of the first pull-up node Q1 is at a high level, the second leakage prevention circuit 401 may be turned on under the control of the voltage of the first pull-up node Q1, and receive and transmit the fifth voltage signal to the second leakage prevention node OFF2, so that the voltage of the second leakage prevention node OFF2 is increased.

Here, in a case where the first scan unit 1 further includes the second reset circuit 105, the second reset circuit 105 is further electrically connected to the second leakage prevention node OFF2.

In a case where the voltage of the first pull-up node Q1 is at a high level and the second reset circuit 105 is inoperative, the first pull-up node Q1 is easy to generate an electric leakage through the second reset circuit 105, which results in a difficulty of maintaining the first pull-up node Q1 at a high and stable voltage, and thus, easily results in a deviation in the first scan signal or the first sensing signal output from the first output circuit 102.

By electrically connecting the second reset circuit 105 to the second leakage prevention node OFF2, the electric leakage of the first pull-up node Q1 through the second reset circuit 105 may be avoided, so that the first pull-up node Q1 may be maintained at a high and stable voltage, so as to avoid affecting an accuracy of the first scan signal or the first sensing signal output from the first output circuit 102.

In a case where the first scan unit 1 further includes the fourth reset circuit 107, the fourth reset circuit 107 is further electrically connected to the second leakage prevention node OFF2.

In a case where the voltage of the first pull-up node Q1 is at a high level and the fourth reset circuit 107 is inoperative, the first pull-up node Q1 is easy to generate an electric leakage through the fourth reset circuit 107, which results in the difficulty of maintaining the first pull-up node Q1 at a high and stable voltage, and thus, easily results in the deviation in the first scan signal or the first sensing signal output from the first output circuit 102.

By electrically connecting the fourth reset circuit 107 to the second leakage prevention node OFF2, the electric leakage of the first pull-up node Q1 through the fourth reset circuit 107 may be avoided, so that the first pull-up node Q1 is able to be maintained at a high and stable voltage, so as to avoid affecting the accuracy of the first scan signal or the first sensing signal output from the first output circuit 102.

In a case where the first scan unit 1 further includes the ninth reset circuit 108, the ninth reset circuit 108 is further electrically connected to the second leakage prevention node OFF2.

In a case where the voltage of the first pull-up node Q1 is at a high level and the ninth reset circuit 108 is inoperative, the first pull-up node Q1 is easy to generate an electric leakage through the ninth reset circuit 108, which results in the difficulty of maintaining the first pull-up node Q1 at a high and stable voltage, and thus, easily results in the deviation in the first scan signal or the first sensing signal output from the first output circuit 102.

By electrically connecting the ninth reset circuit 108 to the second leakage prevention node OFF2, the electric leakage of the first pull-up node Q1 through the ninth reset circuit 108 may be avoided, so that the first pull-up node Q1 is able to be maintained at a high and stable voltage, so as to avoid affecting the accuracy of the first scan signal or the first sensing signal output from the first output circuit 102.

In a case where the second scan unit 2 further includes the sixth reset circuit 207, the sixth reset circuit 207 is further electrically connected to the second leakage prevention node OFF2.

In a case where the voltage of the second pull-up node Q2 is at a high level and the sixth reset circuit 207 is inoperative, the second pull-up node Q2 is easy to generate an electric leakage through the sixth reset circuit 207, which results in a difficulty of maintaining the second pull-up node Q2 at a high and stable voltage, and thus, easily results in a deviation in the second scan signal or the second sensing signal output from the second output circuit 202.

By electrically connecting the sixth reset circuit 207 to the second leakage prevention node OFF2, the electric leakage of the second pull-up node Q2 through the sixth reset circuit 207 may be avoided, so that the second pull-up node Q2 is able to be maintained at a high and stable voltage, so as to avoid affecting an accuracy of the second scan signal or the second sensing signal output from the second output circuit 202.

In a case where the second scan unit 2 further includes the eighth reset circuit 209, the eighth reset circuit 209 is further electrically connected to the second leakage prevention node OFF2.

In a case where the voltage of the second pull-up node Q2 is at a high level and the eighth reset circuit 209 is inoperative, the second pull-up node Q2 is easy to generate an electric leakage through the eighth reset circuit 209, which results in a difficulty of maintaining the second pull-up node Q2 at a high and stable voltage, and thus, easily results in the deviation in the second scan signal or the second sensing signal output from the second output circuit 202.

By electrically connecting the eighth reset circuit 209 to the second leakage prevention node OFF2, the electric leakage of the second pull-up node Q2 through the eighth reset circuit 209 may be avoided, so that the second pull-up node Q2 is able to be maintained at a high and stable voltage, so as to avoid affecting the accuracy of the second scan signal or the second sensing signal output from the second output circuit 202.

In a case where the second scan unit 2 further includes the tenth reset circuit 210, the tenth reset circuit 210 is further electrically connected to the second leakage prevention node OFF2.

In a case where the voltage of the second pull-up node Q2 is at a high level and the tenth reset circuit 210 is inoperative, the second pull-up node Q2 is easy to generate an electric leakage through the tenth reset circuit 210, which results in a difficulty of maintaining the second pull-up node Q2 at a high and stable voltage, and thus, easily results in the deviation in the second scan signal or the second sensing signal output from the second output circuit 202.

By electrically connecting the tenth reset circuit 210 to the second leakage prevention node OFF2, the electric leakage of the second pull-up node Q2 through the tenth reset circuit 210 may be avoided, so that the second pull-up node Q2 is able to be maintained at a high and stable voltage, so as to avoid affecting the accuracy of the second scan signal or the second sensing signal output from the second output circuit 202.

In a case where the shift register 100 further includes the blanking input unit 3, and the blanking input unit 3 includes the first transmission circuit 303 and the second transmission circuit 304, the first transmission circuit 303 is further electrically connected to the second leakage prevention node OFF2, and the second transmission circuit 304 is further electrically connected to the second leakage prevention node OFF2.

In a case where the voltage of the first pull-up node Q1 is at a high level and the first transmission circuit 303 is inoperative, the first pull-up node Q1 is easy to generate an electric leakage through the first transmission circuit 303, which results in a difficulty of maintaining the first pull-up node Q1 at a high and stable voltage, and thus, easily results in the deviation in the first scan signal or the first sensing signal output from the first output circuit 102.

By electrically connecting the first transmission circuit 303 to the second leakage prevention node OFF2, the electric leakage of the first pull-up node Q1 through the first transmission circuit 303 may be avoided, so that the first pull-up node Q1 is able to be maintained at a high and stable voltage, so as to avoid affecting the accuracy of the first scan signal or the first sensing signal output from the first output circuit 102.

In a case where the voltage of the second pull-up node Q2 is at a high level and the second transmission circuit 304 is inoperative, the second pull-up node Q2 is easy to generate an electric leakage through the second transmission circuit 304, which results in a difficulty of maintaining the second pull-up node Q2 at a high and stable voltage, and thus, easily results in the deviation in the second scan signal or the second sensing signal output from the second output circuit 202.

By electrically connecting the second transmission circuit 304 to the second leakage prevention node OFF2, the electric leakage of the second pull-up node Q2 through the second transmission circuit 304 may be avoided, so that the second pull-up node Q2 is able to be maintained at a high and stable voltage, so as to avoid affecting the accuracy of the second scan signal or the second sensing signal output from the second output circuit 202.

It can be seen from the above that the plurality of reset circuits in the shift register 100 may share the second leakage prevention circuit 401.

Structures of the second leakage prevention circuit 401 included in the leakage prevention unit 4, the second reset circuit 105, the fourth reset circuit 107 and the ninth reset circuit 108 that are included in the first scan unit 1, the sixth reset circuit 207, the eighth reset circuit 209 and the tenth reset circuit 210 that are included in the second scan unit 2, and the first transmission circuit 303 and the second transmission circuit 304 that are included in the blanking input unit 3 will be schematically described below.

In some examples, as shown in FIG. 14, the second leakage prevention circuit 401 includes a thirty-ninth transistor M39.

For example, as shown in FIG. 14, a control electrode of the thirty-ninth transistor M39 is electrically connected to the first pull-up node Q1, a first electrode of the thirty-ninth transistor M39 is electrically connected to the fifth voltage signal terminal VDD, and a second electrode of the thirty-ninth transistor M39 is electrically connected to the second leakage prevention node OFF2.

For example, in the case where the voltage of the first pull-up node Q1 is at a high level, the thirty-ninth transistor M39 may be turned on under the control of the voltage of the first pull-up node Q1, and transmit the fifth voltage signal transmitted by the fifth voltage signal terminal VDD to the second leakage prevention node OFF2, so that the voltage of the second leakage prevention node OFF2 is increased.

On this basis, in some examples, as shown in FIG. 14, the second reset circuit 105 further includes a fortieth transistor M40 and a forty-first transistor M41.

For example, as shown in FIG. 14, a control electrode of the fortieth transistor M40 is electrically connected to the second pull-down node QB_B, a first electrode of the fortieth transistor M40 is electrically connected to the second leakage prevention node OFF2, and a second electrode of the fortieth transistor M40 is electrically connected to the second voltage signal terminal VGL1. The second electrode of the sixteenth transistor M16 is electrically connected to the second leakage prevention node OFF2, and is electrically connected to the second voltage signal terminal VGL1 through the fortieth transistor M40.

For example, in the case where the voltage of the second pull-down node QB_B is at a high level, the sixteenth transistor M16 and the fortieth transistor M40 may be turned on synchronously due to the action of the voltage of the second pull-down node QB_B, the fortieth transistor M40 may transmit the second voltage signal transmitted by the second voltage signal terminal VGL1 to the second leakage prevention node OFF2, and the sixteenth transistor M16 may transmit the second voltage signal from the second leakage prevention node OFF2 to the first pull-up node Q1.

Here, in the case where the voltage of the first pull-up node Q1 is at a high level and the second reset circuit 105 is inoperative, the thirty-ninth transistor M39 in the second leakage prevention circuit 401 may transmit the fifth voltage signal to the second leakage prevention node OFF2 to reduce a voltage difference between the second leakage prevention node OFF2 and the first pull-up node Q1, so that a voltage difference between the control electrode and the second electrode of the sixteenth transistor M16 is less than zero, ensuring that the sixteenth transistor M16 is completely or relatively completely turned off. In this way, the electric leakage of the first pull-up node Q1 through the second reset circuit 105 may be avoided, so that the first pull-up node Q1 is able to be maintained at a high and stable voltage.

For example, as shown in FIG. 14, a control electrode of the forty-first transistor M41 is electrically connected to the first pull-down node QB_A, and a first electrode of the forty-first transistor M41 is electrically connected to the second leakage prevention node OFF2, and a second electrode of the forty-first transistor M41 is electrically connected to the second voltage signal terminal VGL1. The second electrode of the seventeenth transistor M17 is electrically connected to the second leakage prevention node OFF2, and is electrically connected to the second voltage signal terminal VGL1 through the forty-first transistor M41.

For example, in the case where the voltage of the first pull-down node QB_A is at a high level, the seventeenth transistor M17 and the forty-first transistor M41 may be turned on synchronously due to the action of the voltage of the first pull-down node QB_A, the forty-first transistor M41 may transmit the second voltage signal transmitted by the second voltage signal terminal VGL1 to the second leakage prevention node OFF2, and the seventeenth transistor M17 may transmit the second voltage signal from the second leakage prevention node OFF2 to the first pull-up node Q1.

Here, in the case where the voltage of the first pull-up node Q1 is at a high level and the second reset circuit 105 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the first pull-up node Q1, so that a voltage difference between the control electrode and the second electrode of the seventeenth transistor M17 is less than zero, ensuring that the seventeenth transistor M17 is completely or relatively completely turned off. In this way, the electric leakage of the first pull-up node Q1 through the second reset circuit 105 may be avoided, so that the first pull-up node Q1 is able to be maintained at a high and stable voltage.

In some examples, as shown in FIG. 14, the fourth reset circuit 107 further includes a forty-second transistor M42.

For example, as shown in FIG. 14, a control electrode of the forty-second transistor M42 is electrically connected to the display reset signal terminal STD, and a first electrode of the forty-second transistor M42 is electrically connected to the second leakage prevention node OFF2, and a second electrode of the forty-second transistor M42 is electrically connected to the second voltage signal terminal VGL1. The second electrode of the twenty-second transistor M22 is electrically connected to the second leakage prevention node OFF2, and is electrically connected to the second voltage signal terminal VGL1 through the forty-second transistor M42.

For example, in the case where the level of the display reset signal is a high level, the twenty-second transistor M22 and the forty-second transistor M42 may be turned on synchronously due to the action of the display reset signal, the forty-second transistor M42 may transmit the second voltage signal transmitted by the second voltage signal terminal VGL1 to the second leakage prevention node OFF2, and the twenty-second transistor M22 may transmit the second voltage signal from the second leakage prevention node OFF2 to the first pull-up node Q1.

Here, in the case where the voltage of the first pull-up node Q1 is at a high level and the fourth reset circuit 107 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the first pull-up node Q1, so that a voltage difference between the control electrode and the second electrode of the twenty-second transistor M22 is less than zero, ensuring that the twenty-second transistor M22 is completely or relatively completely turned off. In this way, the electric leakage of the first pull-up node Q1 through the fourth reset circuit 107 may be avoided, so that the first pull-up node Q1 is able to be maintained at a high and stable voltage.

In some examples, as shown in FIG. 14, the ninth reset circuit 108 further includes a forty-third transistor M43.

For example, as shown in FIG. 14, a control electrode of the forty-third transistor M43 is electrically connected to the global reset signal terminal TRST, a first electrode of the forty-third transistor M43 is electrically connected to the second leakage prevention node OFF2, and a second electrode of the forty-third transistor M43 is electrically connected to the second voltage signal terminal VGL1. The second electrode of the twenty-ninth transistor M29 is electrically connected to the second leakage prevention node OFF2, and is electrically connected to the second voltage signal terminal VGL1 through the forty-third transistor M43.

For example, in the case where the level of the global reset signal is a high level, the twenty-ninth transistor M29 and the forty-third transistor M43 may be turned on synchronously due to the action of the global reset signal, the forty-third transistor M43 may transmit the second voltage signal transmitted by the second voltage signal terminal VGL1 to the second leakage prevention node OFF2, and the twenty-ninth transistor M29 may transmit the second voltage signal from the second leakage prevention node OFF2 to the first pull-up node Q1.

Here, in the case where the voltage of the first pull-up node Q1 is at a high level and the ninth reset circuit 108 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the first pull-up node Q1, so that a voltage difference between the control electrode and the second electrode of the twenty-ninth transistor M29 is less than zero, ensuring that the twenty-ninth transistor M29 is completely or relatively completely turned off. In this way, the electric leakage of the first pull-up node Q1 through the ninth reset circuit 108 may be avoided, so that the first pull-up node Q1 is able to be maintained at a high and stable voltage.

In addition, in some examples, as shown in FIG. 14, the first input circuit 101 further includes a fifty-first transistor M51.

For example, as shown in FIG. 14, a control electrode of the fifty-first transistor M51 is electrically connected to the input signal terminal Iput, a first electrode of the fifty-first transistor M51 is electrically connected to the second leakage prevention node OFF2, and a second electrode of the fifty-first transistor M51 is electrically connected to the first pull-up node Q1. The second electrode of the thirty-first transistor M31 is electrically connected to the second leakage prevention node OFF2, and is electrically connected to the first pull-up node Q1 through the fifty-first transistor M51.

For example, in the case where the level of the input signal is a high level, the thirty-first transistor M31 and the fifty-first transistor M51 may be turned on synchronously due to the action of the input signal, the thirty-first transistor M31 may receive and transmit the input signal to the second leakage prevention node OFF2, and the fifty-first transistor M51 may transmit the input signal from the second leakage prevention node OFF2 to the first pull-up node Q1.

Here, in a case where the voltage of the first pull-up node Q1 is at a high level and the first input circuit 101 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the first pull-up node Q1, so that a voltage difference between the control electrode and the first electrode of the fifty-first transistor M51 is less than zero, ensuring that the fifty-first transistor M51 is completely or relatively completely turned off. In this way, an electric leakage of the first pull-up node Q1 through the first input circuit 101 may be avoided, so that the first pull-up node Q1 is able to be maintained at a high and stable voltage.

In some examples, as shown in FIG. 14, in the sixth reset circuit 207, the second electrode of the twenty-fourth transistor M24 is electrically connected to the second leakage prevention node OFF2, and is electrically connected to the second voltage signal terminal VGL1 through the forty-first transistor M41.

For example, in the case where the voltage of the first pull-down node QB_A is at a high level, the twenty-fourth transistor M24 and the forty-first transistor M41 may be turned on due to the action of the voltage of the first pull-down node QB_A, the forty-first transistor M41 may transmit the second voltage signal transmitted by the second voltage signal terminal VGL1 to the second leakage prevention node OFF2, and the twenty-fourth transistor M24 may transmit the second voltage signal from the second leakage prevention node OFF2 to the second pull-up node Q2.

Here, in the case where the voltage of the second pull-up node Q2 is at a high level and the sixth reset circuit 207 is inoperative, the thirty-ninth transistor M39 in the second leakage prevention circuit 401 may transmit the fifth voltage signal to the second leakage prevention node OFF2 to reduce a voltage difference between the second leakage prevention node OFF2 and the second pull-up node Q2, so that a voltage difference between the control electrode and the second electrode of the twenty-fourth transistor M24 is less than zero, ensuring that the twenty-fourth transistor M24 is completely or relatively completely turned off. In this way, the electric leakage of the second pull-up node Q2 through the sixth reset circuit 207 may be avoided, so that the second pull-up node Q2 is able to be maintained at a high and stable voltage.

For example, as shown in FIG. 14, in the sixth reset circuit 207, the second electrode of the twenty-fifth transistor M25 is electrically connected to the second leakage prevention node OFF2, and is electrically connected to the second voltage signal terminal VGL1 through the fortieth transistor M40.

For example, in the case where the voltage of the second pull-down node QB_B is at a high level, the sixteenth transistor M16 and the fortieth transistor M40 may be turned on synchronously due to the action of the voltage of the second pull-down node QB_B, the fortieth transistor M40 may transmit the second voltage signal transmitted by the second voltage signal terminal VGL1 to the second leakage prevention node OFF2, and the twenty-fifth transistor M25 may transmit the second voltage signal from the second leakage prevention node OFF2 to the second pull-up node Q2.

Here, in the case where the voltage of the second pull-up node Q2 is at a high level and the sixth reset circuit 207 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the second pull-up node Q2, so that a voltage difference between the control electrode and the second electrode of the twenty-fifth transistor M25 is less than zero, ensuring that the twenty-fifth transistor M25 is completely or relatively completely turned off. In this way, the electric leakage of the second pull-up node Q2 through the sixth reset circuit 207 may be avoided, so that the second pull-up node Q2 is able to be maintained at a high and stable voltage.

In some examples, as shown in FIG. 14, in the eighth reset circuit 209, the second electrode of the twenty-eighth transistor M28 is electrically connected to the second leakage prevention node OFF2, and is electrically connected to the second voltage signal terminal VGL1 through the forty-second transistor M42.

For example, in the case where the level of the display reset signal is a high level, the twenty-eighth transistor M28 and the forty-second transistor M42 may be turned on synchronously due to the action of the display reset signal, the forty-second transistor M42 may transmit the second voltage signal transmitted by the second voltage signal terminal VGL1 to the second leakage prevention node OFF2, and the twenty-eighth transistor M28 may transmit the second voltage signal from the second leakage prevention node OFF2 to the second pull-up node Q2.

Here, in a case where the voltage of the second pull-up node Q2 is at a high level and the eighth reset circuit 209 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the second pull-up node Q2, so that a voltage difference between the control electrode and the second electrode of the twenty-eighth transistor M28 is less than zero, ensuring that the twenty-eighth transistor M28 is completely or relatively completely turned off. In this way, the electric leakage of the second pull-up node Q2 through the eighth reset circuit 209 may be avoided, so that the second pull-up node Q2 is able to be maintained at a high and stable voltage.

In some examples, as shown in FIG. 14, in the tenth reset circuit 210, the second electrode of the thirtieth transistor M30 is electrically connected to the second leakage prevention node OFF2, and is electrically connected to the second voltage signal terminal VGL1 through the forty-third transistor M43.

For example, in the case where the level of the global reset signal is a high level, the thirtieth transistor M30 and the forty-third transistor M43 may be turned on synchronously due to the action of the global reset signal, the forty-third transistor M43 may transmit the second voltage signal transmitted by the second voltage signal terminal VGL1 to the second leakage prevention node OFF2, and the thirtieth transistor M30 may transmit the second voltage signal from the second leakage prevention node OFF2 to the second pull-up node Q2.

Here, in the case where the voltage of the second pull-up node Q2 is at a high level and the tenth reset circuit 210 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the second pull-up node Q2, so that a voltage difference between the control electrode and the second electrode of the thirtieth transistor M30 is less than zero, ensuring that the thirtieth transistor M30 is completely or relatively completely turned off. In this way, the electric leakage of the second pull-up node Q2 through the tenth reset circuit 210 may be avoided, so that the second pull-up node Q2 is able to be maintained at a high and stable voltage.

In addition, in some examples, as shown in FIG. 14, in the second input circuit 201, the first electrode of the thirty-second transistor M32 is electrically connected to the second leakage prevention node OFF2.

For example, in the case where the level of the input signal is a high level, the thirty-first transistor M31 and the thirty-second transistor M32 may be turned on due to the action of the input signal, the thirty-first transistor M31 may receive and transmit the input signal to the second leakage prevention node OFF2, and the thirty-second transistor M32 may transmit the input signal from the second leakage prevention node OFF2 to the second pull-up node Q2.

Here, in a case where the voltage of the second pull-up node Q2 is at a high level and the second input circuit 201 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the second pull-up node Q2, so that a voltage difference between the control electrode and the first electrode of the thirty-second transistor M32 is less than zero, ensuring that the thirty-second transistor M32 is completely or relatively completely turned off. In this way, an electric leakage of the second pull-up node Q2 through the second input circuit 201 may be avoided, so that the second pull-up node Q2 is able to be maintained at a high and stable voltage.

In some examples, as shown in FIG. 14, the first transmission circuit 303 further includes a forty-ninth transistor M49.

For example, as shown in FIG. 14, a control electrode of the forty-ninth transistor M49 is electrically connected to the fourth clock signal terminal CLKA, a first electrode of the forty-ninth transistor M49 is electrically connected to the second leakage prevention node OFF2, and a second electrode of the forty-ninth transistor M49 is electrically connected to the first pull-up node Q1. The second electrode of the thirty-fifth transistor M35 is electrically connected to the second leakage prevention node OFF2, and is electrically connected to the first pull-up node Q1 through the forty-ninth transistor M49.

For example, in the case where the level of the fourth clock signal transmitted by the fourth clock signal terminal CLKA is a high level, the thirty-fifth transistor M35 and the forty-ninth transistor M49 may be turned on synchronously due to the action of the fourth clock signal, the thirty-fifth transistor M35 may transmit the fourth clock signal from the second blanking node N to the second leakage prevention node OFF2, and the forty-ninth transistor M49 may transmit the fourth clock signal from the second leakage prevention node OFF2 to the first pull-up node Q1, so as to charge the first pull-up node Q1.

Here, in the case where the voltage of the first pull-up node Q1 is at a high level and the first transmission circuit 303 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the first pull-up node Q1, so that a voltage difference between the control electrode and the first electrode of the thirty-fifth transistor M35 is less than zero, ensuring that the thirty-fifth transistor M35 is completely or relatively completely turned off. In this way, the electric leakage of the first pull-up node Q1 through the first transmission circuit 303 may be avoided, so that the first pull-up node Q1 is able to be maintained at a high and stable voltage.

In some examples, as shown in FIG. 14, in the second transmission circuit 304, the first electrode of the thirty-sixth transistor M36 is electrically connected to the second leakage prevention node OFF2, and is electrically connected to the second blanking node N through the thirty-fifth transistor M35.

For example, in the case where the level of the fourth clock signal transmitted by the fourth clock signal terminal CLKA is a high level, the thirty-sixth transistor M36 and the thirty-fifth transistor M35 may be turned on synchronously due to the action of the fourth clock signal, the thirty-fifth transistor M35 may transmit the fourth clock signal from the second blanking node N to the second leakage prevention node OFF2, and the thirty-sixth transistor M36 may transmit the fourth clock signal from the second leakage prevention node OFF2 to the second pull-up node Q2, so as to charge the second pull-up node Q2.

Here, in the case where the voltage of the second pull-up node Q2 is at a high level and the second transmission circuit 304 is inoperative, the thirty-ninth transistor M39 in the second leakage prevention circuit 401 may transmit the fifth voltage signal to the second leakage prevention node OFF2 to reduce the voltage difference between the second leakage prevention node OFF2 and the second pull-up node Q2, so that a voltage difference between the control electrode and the first electrode of the thirty-sixth transistor M36 is less than zero, ensuring that the thirty-sixth transistor M36 is completely or relatively completely turned off. In this way, the electric leakage of the second pull-up node Q2 through the second transmission circuit 304 may be avoided, so that the second pull-up node Q2 is able to be maintained at a high and stable voltage.

In some embodiments, as shown in FIGS. 15, 16, 20, and 21, the leakage prevention unit 4 is further electrically connected to the second pull-up node Q2 and a third leakage prevention node OFF3. The leakage prevention unit 4 is further configured to transmit the fifth voltage signal received at the fifth voltage signal terminal VDD to the third leakage prevention node OFF3 under the control of the voltage of the second pull-up node Q2.

For example, in the case where the voltage of the second pull-up node Q2 is at a high level, the leakage prevention unit 4 may be turned on under the control of the voltage of the second pull-up node Q2, and receive and transmit the fifth voltage signal to the third leakage prevention node OFF3, so that a voltage of the third leakage prevention node OFF3 is increased (the voltage of the third leakage prevention node OFF3 is, for example, less than or equal to the voltage of the second pull-up node Q2).

In some embodiments, as shown in FIGS. 15, 16, 20 and 21, the leakage prevention unit 4 includes a third leakage prevention circuit 402 and a fourth leakage prevention circuit 403.

In some examples, as shown in FIGS. 15, 16, 20 and 21, the third leakage prevention circuit 402 is electrically connected to the first pull-up node Q1, the second leakage prevention node OFF2, and the fifth voltage signal terminal VDD. The third leakage prevention circuit 402 is configured to transmit the fifth voltage signal received at the fifth voltage signal terminal VDD to the second leakage prevention node OFF2 under the control of the voltage of the first pull-up node Q1.

For example, in the case where the voltage of the first pull-up node Q1 is at a high level, the third leakage prevention circuit 402 may be turned on under the control of the voltage of the first pull-up node Q1, and receive and transmit the fifth voltage signal to the second leakage prevention node OFF2, so that the voltage of the second leakage prevention node OFF2 is increased.

In some examples, as shown in FIGS. 15, 16, 20 and 21, the fourth leakage prevention circuit 403 is electrically connected to the second pull-up node Q2, the third leakage prevention node OFF3, and the fifth voltage signal terminal VDD. The fourth leakage prevention circuit 403 is configured to transmit the fifth voltage signal received at the fifth voltage signal terminal VDD to the third leakage prevention node OFF3 under the control of the voltage of the second pull-up node Q2.

For example, in the case where the voltage of the second pull-up node Q2 is at a high level, the fourth leakage prevention circuit 403 may be turned on under the control of the voltage of the second pull-up node Q2, and receive and transmit the fifth voltage signal to the third leakage prevention node OFF3, so that the voltage of the third leakage prevention node OFF3 is increased.

Here, in the case where the first scan unit 1 further includes the second reset circuit 105, the second reset circuit 105 is further electrically connected to the second leakage prevention node OFF2.

By electrically connecting the second reset circuit 105 to the second leakage prevention node OFF2, the electric leakage of the first pull-up node Q1 through the second reset circuit 105 may be avoided, so that the first pull-up node Q1 is able to be maintained at a high and stable voltage, so as to avoid affecting the accuracy of the first scan signal or the first sensing signal output from the first output circuit 102.

In the case where the first scan unit 1 further includes the fourth reset circuit 107, the fourth reset circuit 107 is further electrically connected to the second leakage prevention node OFF2.

By electrically connecting the fourth reset circuit 107 to the second leakage prevention node OFF2, the electric leakage of the first pull-up node Q1 through the fourth reset circuit 107 may be avoided, so that the first pull-up node Q1 is able to be maintained at a high and stable voltage, so as to avoid affecting the accuracy of the first scan signal or the first sensing signal output from the first output circuit 102.

In the case where the first scan unit 1 further includes the ninth reset circuit 108, the ninth reset circuit 108 is further electrically connected to the second leakage prevention node OFF2.

By electrically connecting the ninth reset circuit 108 to the second leakage prevention node OFF2, the electric leakage of the first pull-up node Q1 through the ninth reset circuit 108 may be avoided, so that the first pull-up node Q1 is able to be maintained at a high and stable voltage, so as to avoid affecting the accuracy of the first scan signal or the first sensing signal output from the first output circuit 102.

In the case where the second scan unit 2 further includes the sixth reset circuit 207, the sixth reset circuit 207 is further electrically connected to the third leakage prevention node OFF3.

By electrically connecting the sixth reset circuit 207 to the third leakage prevention node OFF3, the electric leakage of the second pull-up node Q2 through the sixth reset circuit 207 may be avoided, so that the second pull-up node Q2 is able to be maintained at a high and stable voltage, so as to avoid affecting the accuracy of the second scan signal or the second sensing signal output from the second output circuit 202.

In the case where the second scan unit 2 further includes the eighth reset circuit 209, the eighth reset circuit 209 is further electrically connected to the third leakage prevention node OFF3.

By electrically connecting the eighth reset circuit 209 to the third leakage prevention node OFF3, the electric leakage of the second pull-up node Q2 through the eighth reset circuit 209 may be avoided, so that the second pull-up node Q2 is able to be maintained at a high and stable voltage, so as to avoid affecting the accuracy of the second scan signal or the second sensing signal output from the second output circuit 202.

In the case where the second scan unit 2 further includes the tenth reset circuit 210, the tenth reset circuit 210 is further electrically connected to the third leakage prevention node OFF3.

By electrically connecting the tenth reset circuit 210 to the third leakage prevention node OFF3, the electric leakage of the second pull-up node Q2 through the tenth reset circuit 210 may be avoided, so that the second pull-up node Q2 is able to be maintained at a high and stable voltage, so as to avoid affecting the accuracy of the second scan signal or the second sensing signal output from the second output circuit 202.

In the case where the shift register 100 further includes the blanking input unit 3, and the blanking input unit 3 includes the first transmission circuit 303 and the second transmission circuit 304, the first transmission circuit 303 is further electrically connected to the second leakage prevention node OFF2, and the second transmission circuit 304 is further electrically connected to the third leakage prevention node OFF3.

By electrically connecting the first transmission circuit 303 to the second leakage prevention node OFF2, the electric leakage of the first pull-up node Q1 through the first transmission circuit 303 may be avoided, so that the first pull-up node Q1 is able to be maintained at a high and stable voltage, so as to avoid affecting the accuracy of the first scan signal or the first sensing signal output from the first output circuit 102.

By electrically connecting the second transmission circuit 304 to the third leakage prevention node OFF3, the electric leakage of the second pull-up node Q2 through the second transmission circuit 304 may be avoided, so that the second pull-up node Q2 is able to be maintained at a high and stable voltage, so as to avoid affecting the accuracy of the second scan signal or the second sensing signal output from the second output circuit 202.

Structures of the third leakage prevention circuit 402 and the fourth leakage prevention circuit 403 that are included in the leakage prevention unit 4, the second reset circuit 105, the fourth reset circuit 107 and the ninth reset circuit 108 that are included in the first scan unit 1, the sixth reset circuit 207, the eighth reset circuit 209 and the tenth reset circuit 210 that are included in the second scan unit 2, and the first transmission circuit 303 and the second transmission circuit 304 that are included in the blanking input unit 3 will be schematically described below.

In some examples, as shown in FIGS. 16 and 21, the third leakage prevention circuit 402 includes a sixty-third transistor M63.

For example, as shown in FIGS. 16 and 21, a control electrode of the sixty-third transistor M63 is electrically connected to the first pull-up node Q1, a first electrode of the sixty-third transistor M63 is electrically connected to the fifth voltage signal terminal VDD, and a second electrode of the sixty-third transistor M63 is electrically connected to the second leakage prevention node OFF2.

For example, in the case where the voltage of the first pull-up node Q1 is at a high level, the sixty-third transistor M63 may be turned on under the control of the voltage of the first pull-up node Q1, and transmit the fifth voltage signal transmitted by the fifth voltage signal terminal VDD to the second leakage prevention node OFF2, so that the voltage of the second leakage prevention node OFF2 is increased.

On this basis, in some examples, as shown in FIGS. 16 and 21, the second reset circuit 105 further includes the fortieth transistor M40 and the forty-first transistor M41.

The structures and functions of the fortieth transistor M40 and the forty-first transistor M41 may refer to the above description in some examples, and will not be repeated here.

In some examples, as shown in FIGS. 16 and 21, the fourth reset circuit 107 further includes the forty-second transistor M42.

The structure and the function of the forty-second transistor M42 may refer to the above description in some examples, and will not be repeated here.

In some examples, as shown in FIGS. 16 and 21, the ninth reset circuit 108 further includes the forty-third transistor M43.

The structure and function of the forty-third transistor M43 may refer to the above description in some examples, and will not be repeated here.

In addition, in some examples, as shown in FIGS. 16 and 21, the first input circuit 101 further includes the fifty-first transistor M51.

The structure and function of the fifty-first transistor M51 may refer to the above description in some examples, and will not be repeated here.

In some examples, as shown in FIGS. 16 and 21, the fourth leakage prevention circuit 403 includes a forty-fourth transistor M44.

For example, as shown in FIGS. 16 and 21, a control electrode of the forty-fourth transistor M44 is electrically connected to the second pull-up node Q2, a first electrode of the forty-fourth transistor M44 is electrically connected to the fifth voltage signal terminal VDD, and a second electrode of the forty-fourth transistor M44 is electrically connected to the third leakage prevention node OFF3.

For example, in the case where the voltage of the second pull-up node Q2 is at a high level, the forty-fourth transistor M44 may be turned on under the control of the voltage of the second pull-up node Q2, and transmit the fifth voltage signal transmitted by the fifth voltage signal terminal VDD to the third leakage prevention node OFF3, so that the voltage of the third leakage prevention node OFF3 is increased.

On this basis, in some examples, as shown in FIGS. 16 and 21, the sixth reset circuit 207 further includes a forty-fifth transistor M45 and a forty-sixth transistor M46.

For example, as shown in FIGS. 16 and 21, a control electrode of the forty-fifth transistor M45 is electrically connected to the first pull-down node QB_A, a first electrode of the forty-fifth transistor M45 is electrically connected to the third leakage prevention node OFF3, and a second electrode of the forty-fifth transistor M45 is electrically connected to the second voltage signal terminal VGL1. The second electrode of the twenty-fourth transistor M24 is electrically connected to the third leakage prevention node OFF3, and is electrically connected to the second voltage signal terminal VGL1 through the forty-fifth transistor M45.

For example, in the case where the voltage of the first pull-down node QB_A is at a high level, the twenty-fourth transistor M24 and the forty-fifth transistor M45 may be turned on synchronously due to the action of the voltage of the first pull-down node QB_A, the forty-fifth transistor M45 may transmit the second voltage signal transmitted by the second voltage signal terminal VGL1 to the third leakage prevention node OFF3, and twenty-fourth transistor M24 may transmit the second voltage signal from the third leakage prevention node OFF3 to the second pull-up node Q2.

Here, in the case where the voltage of the second pull-up node Q2 is at a high level and the sixth reset circuit 207 is inoperative, the forty-fourth transistor M44 in the fourth leakage prevention circuit 403 may transmit the fifth voltage signal to the third leakage prevention node OFF3 to reduce a voltage difference between the third leakage prevention node OFF3 and the second pull-up node Q2, so that the voltage difference between the control electrode and the second electrode of the twenty-fourth transistor M24 is less than zero, ensuring that the twenty-fourth transistor M24 is completely or relatively completely turned off. In this way, the electric leakage of the second pull-up node Q2 through the sixth reset circuit 207 may be avoided, so that the second pull-up node Q2 is able to be maintained at a high and stable voltage.

For example, as shown in FIGS. 16 and 21, a control electrode of the forty-sixth transistor M46 is electrically connected to the second pull-down node QB_B, a first electrode of the forty-sixth transistor M46 is electrically connected to the third leakage prevention node OFF3, and a second electrode of the forty-sixth transistor M46 is electrically connected to the second voltage signal terminal VGL1. The second electrode of the twenty-fifth transistor M25 is electrically connected to the third leakage prevention node OFF3, and is electrically connected to the second voltage signal terminal VGL1 through the forty-sixth transistor M46.

For example, in the case where the voltage of the second pull-down node QB_B is at a high level, the twenty-fifth transistor M25 and the forty-sixth transistor M46 may be turned on synchronously due to the action of the voltage of the second pull-down node QB_B, the forty-sixth transistor M46 may transmit the second voltage signal transmitted by the second voltage signal terminal VGL1 to the third leakage prevention node OFF3, and the twenty-fifth transistor M25 may transmit the second voltage signal from the third leakage prevention node OFF3 to the second pull-up node Q2.

Here, in the case where the voltage of the second pull-up node Q2 is at a high level and the sixth reset circuit 207 is inoperative, the forty-fourth transistor M44 in the fourth leakage prevention circuit 403 may transmit the fifth voltage signal to the third leakage prevention node OFF3 to reduce the voltage difference between the third leakage prevention node OFF3 and the second pull-up node Q2, so that the voltage difference between the control electrode and the second electrode of the twenty-fifth transistor M25 is less than zero, ensuring that the twenty-fifth transistor M25 is completely or relatively completely turned off. In this way, the electric leakage of the second pull-up node Q2 through the sixth reset circuit 207 may be avoided, so that the second pull-up node Q2 is able to be maintained at a high and stable voltage.

In some examples, as shown in FIGS. 16 and 21, the eighth reset circuit 209 further includes a forty-seventh transistor M47.

For example, as shown in FIGS. 16 and 21, a control electrode of the forty-seventh transistor M47 is electrically connected to the display reset signal terminal STD, a first electrode of the forty-seventh transistor M47 is electrically connected to the third leakage prevention node OFF3, and a second electrode of the forty-seventh transistor M47 is electrically connected to the second voltage signal terminal VGL1. The second electrode of the twenty-eighth transistor M28 is electrically connected to the third leakage prevention node OFF3, and is electrically connected to the second voltage signal terminal VGL1 through the forty-seventh transistor M47.

For example, in the case where the level of the display reset signal is a high level, the twenty-eighth transistor M28 and the forty-seventh transistor M47 may be turned on synchronously due to the action of the display reset signal, the forty-seventh transistor M47 may transmit the second voltage signal transmitted by the second voltage signal terminal VGL1 to the third leakage prevention node OFF3, and the twenty-eighth transistor M28 may transmit the second voltage signal from the third leakage prevention node OFF3 to the second pull-up node Q2.

Here, in the case where the voltage of the second pull-up node Q2 is at a high level and the eighth reset circuit 209 is inoperative, the forty-fourth transistor M44 in the fourth leakage prevention circuit 403 may transmit the fifth voltage signal to the third leakage prevention node OFF3 to reduce the voltage difference between the third leakage prevention node OFF3 and the second pull-up node Q2, so that the voltage difference between the control electrode and the second electrode of the twenty-eighth transistor M28 is less than zero, ensuring that the twenty-eighth transistor M28 is completely or relatively completely turned off. In this way, the electric leakage of the second pull-up node Q2 through the eighth reset circuit 209 may be avoided, so that the second pull-up node Q2 is able to be maintained at a high and stable voltage.

In some examples, as shown in FIGS. 16 and 21, the tenth reset circuit 210 further includes a forty-eighth transistor M48.

For example, as shown in FIGS. 16 and 21, a control electrode of the forty-eighth transistor M48 is electrically connected to the global reset signal terminal TRST, a first electrode of the forty-eighth transistor M48 is electrically connected to the third leakage prevention node OFF3, and a second electrode of the forty-eighth transistor M48 is electrically connected to the second voltage signal terminal VGL1. The second electrode of the thirtieth transistor M30 is electrically connected to the third leakage prevention node OFF3, and is electrically connected to the second voltage signal terminal VGL1 through the forty-eighth transistor M48.

For example, in the case where the level of the global reset signal is a high level, the thirtieth transistor M30 and the forty-eighth transistor M48 may be turned on synchronously due to the action of the global reset signal, the forty-eighth transistor M48 may transmit the second voltage signal transmitted by the second voltage signal terminal VGL1 to the third leakage prevention node OFF3, and the thirtieth transistor M30 may transmit the second voltage signal from the third leakage prevention node OFF3 to the second pull-up node Q2.

Here, in the case where the voltage of the second pull-up node Q2 is at a high level and the tenth reset circuit 210 is inoperative, the forty-fourth transistor M44 in the fourth leakage prevention circuit 403 may transmit the fifth voltage signal to the third leakage prevention node OFF3 to reduce the voltage difference between the third leakage prevention node OFF3 and the second pull-up node Q2, so that the voltage difference between the control electrode and the second electrode of the thirtieth transistor M30 is less than zero, ensuring that the thirtieth transistor M30 is completely or relatively completely turned off. In this way, the electric leakage of the second pull-up node Q2 through the tenth reset circuit 210 may be avoided, so that the second pull-up node Q2 is able to be maintained at a high and stable voltage.

In addition, in some examples, as shown in FIGS. 16 and 21, the second input circuit 201 further includes a fifty-second transistor M52.

For example, as shown in FIGS. 16 and 21, a control electrode of the fifty-second transistor M52 is electrically connected to the input signal terminal Iput, a first electrode of the fifty-second transistor M52 is electrically connected to the third leakage prevention node OFF3, and a second electrode of the fifty-second transistor M52 is electrically connected to the second pull-up node Q2. The second electrode of the thirty-second transistor M32 is electrically connected to the third leakage prevention node OFF3, and is electrically connected to the second pull-up node Q2 through the fifty-second transistor M52.

For example, in the case where the level of the input signal is a high level, the thirty-second transistor M32 and the fifty-second transistor M52 may be turned on synchronously due to the action of the input signal, the thirty-second transistor M32 may receive and transmit the input signal to the third leakage prevention node OFF3, and the fifty-second transistor M52 may transmit the input signal from the third leakage prevention node OFF3 to the second pull-up node Q2.

Here, in the case where the voltage of the second pull-up node Q2 is at a high level and the second input circuit 201 is inoperative, the forty-fourth transistor M44 in the fourth leakage prevention circuit 403 may transmit the fifth voltage signal to the third leakage prevention node OFF3 to reduce the voltage difference between the third leakage prevention node OFF3 and the second pull-up node Q2, so that a voltage difference between the control electrode and the first electrode of the fifty-second transistor M52 is less than zero, ensuring that the fifty-second transistor M52 is completely or relatively completely turned off. In this way, the electric leakage of the second pull-up node Q2 through the second input circuit 201 may be avoided, so that the second pull-up node Q2 is able to be maintained at a high and stable voltage.

In some examples, as shown in FIGS. 16 and 21, the first transmission circuit 303 further includes the forty-ninth transistor M49.

The structure and function of the forty-ninth transistor M49 may refer to the above description in some examples, and will not be repeated here.

In some examples, as shown in FIGS. 16 and 21, the second transmission circuit 304 further includes a fiftieth transistor M50.

For example, as shown in FIGS. 16 and 21, a control electrode of the fiftieth transistor M50 is electrically connected to the fourth clock signal terminal CLKA, a first electrode of the fiftieth transistor M50 is electrically connected to the third leakage prevention node OFF3, and a second electrode of the fiftieth transistor M50 is electrically connected to the second pull-up node Q2. The second electrode of the thirty-sixth transistor M36 is electrically connected to the third leakage prevention node OFF3, and is electrically connected to the second pull-up node Q2 through the fiftieth transistor M50.

For example, in the case where the level of the fourth clock signal transmitted by the fourth clock signal terminal CLKA is a high level, the thirty-sixth transistor M36 and the fiftieth transistor M50 may be turned on synchronously due to the action of the fourth clock signal, the thirty-sixth transistor M36 may transmit the fourth clock signal from the second blanking node N to the third leakage prevention node OFF3, and the fiftieth transistor M50 may transmit the fourth clock signal from the third leakage prevention node OFF3 to the second pull-up node Q2, so as to charge the second pull-up node Q2.

Here, in the case where the voltage of the second pull-up node Q2 is at a high level and the second transmission circuit 304 is inoperative, the forty-fourth transistor M44 in the fourth leakage prevention circuit 403 may transmit the fifth voltage signal to the third leakage prevention node OFF3 to reduce the voltage difference between the third leakage prevention node OFF3 and the second pull-up node Q2, so that the voltage difference between the control electrode and the first electrode of the thirty-sixth transistor M36 is less than zero, ensuring that the thirty-sixth transistor M36 is completely or relatively completely turned off. In this way, the electric leakage of the second pull-up node Q2 through the second transmission circuit 304 may be avoided, so that the second pull-up node Q2 is able to be maintained at a high and stable voltage.

For other reset circuit in the shift register 100 that is not electrically connected to a leakage prevention node, a leakage prevention may be arranged (e.g., electrically connected to a certain leakage prevention node) according to actual needs, and will not be repeated here.

Some embodiments of the present disclosure further provide the gate driving circuit 1000. The gate driving circuit may have a variety of structures, which may be selectively arranged according to actual needs.

Figure 17:
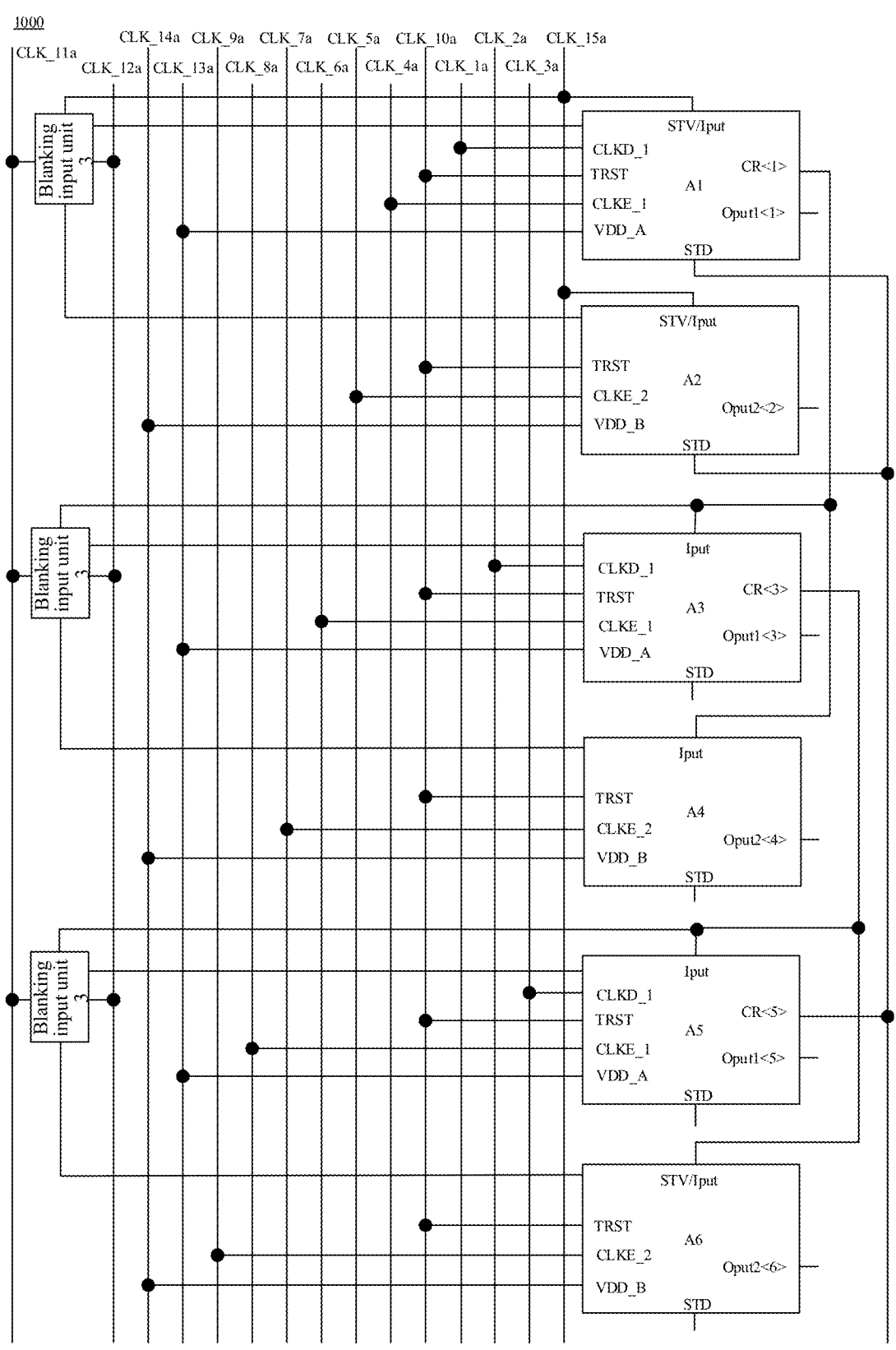
FIG. 17 is a structural diagram of a gate driving circuit, in accordance with some embodiments of the present disclosure.

In some embodiments, as shown in FIG. 17, the gate driving circuit 1000 includes a plurality of shift registers 100 that are cascaded. Each shift register 100 includes the first scan unit 1 and the second scan unit 2. The shift register 100 may have the structure as shown in FIG. 16.

A1, A2, A3 . . . . A6 shown in FIG. 17 respectively represent scan units in the shift register 100. For example, A1, A3 and A5 respectively represent the first scan units 1 in three shift registers 100, and A2, A4 and A6 respectively represent the second scan units 2 in the three shift registers 100.

In this case, the scan units in the gate driving circuit 1000 may be correspondingly electrically connected to the gate lines GL in the above display panel PNL. For example, A1 may be electrically connected to a gate line, A2 may be electrically connected to a gate line, A3 may be electrically connected to a gate line, A4 may be electrically connected to a gate line, A5 may be electrically connected to a gate line, and A6 may be electrically connected to a gate line, so as to respectively drive sub-pixels in a first row, sub-pixels in a second row, sub-pixels in a third row, sub-pixels in a fourth row, sub-pixels in a fifth row, and sub-pixels in a sixth row in the display panel PNL for display. Considering the structural diagram of the gate driving circuit 1000 as shown in FIG. 17 as an example, signal lines in the gate driving circuit 1000 will be schematically described below.

As shown in FIG. 17, the gate driving circuit 1000 includes a first clock signal line CLK_1a, a second clock signal line CLK_2a, and a third clock signal line CLK_3a.

The first clock signal terminal CLKD_1 in the first scan unit 1 in a (3N-2)-th stage shift register is electrically connected to the first clock signal line CLK_1a to receive the first clock signal. The first clock signal terminal CLKD_1 in the first scan unit 1 in a (3N-1)-th stage shift register is electrically connected to the second clock signal line CLK_2a to receive the first clock signal. The first clock signal terminal CLKD_1 in the first scan unit 1 in a 3N-th stage shift register is electrically connected to the third clock signal line CLK_3a to receive the first clock signal.

As shown in FIG. 17, the gate driving circuit 1000 further includes a fourth clock signal line CLK_4a, a fifth clock signal line CLK_5a, a sixth clock signal line CLK_6a, a seventh clock signal line CLK_7a, an eighth clock signal line CLK_8a, and a ninth clock signal line CLK_9a.

In the (3N-2)-th stage shift register, the second clock signal terminal CLKE_1 in the first scan unit 1 is electrically connected to the fourth clock signal line CLK_4a to receive the second clock signal, and the third clock signal terminal CLKE_2 in the second scan unit 2 is electrically connected to the fifth clock signal line CLK_5a to receive the third clock signal.

In the (3N-1)-th stage shift register, the second clock signal terminal CLKE_1 in the first scan unit 1 is electrically connected to the sixth clock signal line CLK_6a to receive the second clock signal, and the third clock signal terminal CLKE_2 in the second scan unit 2 is electrically connected to the seventh clock signal line CLK_7a to receive the third clock signal.

In the 3N-th stage shift register, the second clock signal terminal CLKE_1 in the first scan unit 1 is electrically connected to the eighth clock signal line CLK_8a to receive the second clock signal, and the third clock signal terminal CLKE_2 in the second scan unit 2 is electrically connected to the ninth clock signal line CLK_9a to receive the third clock signal.

As shown in FIG. 17, the gate driving circuit 1000 further includes a tenth signal line CLK_10a.

In each stage of shift register 100, both the global reset signal terminal TRST in the first scan unit 1 and the global reset signal terminal TRST in the second scan unit 2 are electrically connected to the tenth clock signal line CLK_10a to receive the global reset signal.

As shown in FIG. 17, the gate driving circuit 1000 further includes an eleventh clock signal line CLK_11a and a twelfth clock signal line CLK_12a.

The selection control signal terminal OE in the blanking input circuit 3 in each stage of shift register 100 is electrically connected to the eleventh clock signal line CLK_11a to receive the selection control signal.

The fourth clock signal terminal CLKA in the blanking input circuit 3 in each stage of shift register 100 is electrically connected to the twelfth clock signal line CLK_12a to receive the fourth clock signal.

As shown in FIG. 17, the gate driving circuit 1000 further includes a thirteenth clock signal line CLK_13a and a fourteenth clock signal line CLK_14a.

The first voltage signal terminal VDD_A in the first scan unit 1 in each stage of shift register 100 is electrically connected to the thirteenth clock signal line CLK_13a to receive the first voltage signal. The third voltage signal terminal VDD_B in the second scan unit 2 in each stage of shift register 100 is electrically connected to the fourteenth clock signal line CLK_14a to receive the third voltage signal.

As shown in FIG. 17, the gate driving circuit 1000 further includes a fifteenth clock signal line CLK_15a.

In a first stage shift register 100, both the input signal terminal Iput in the first scan unit 1 and the input signal terminal Iput in the second scan unit 2 are electrically connected to the fifteenth clock signal line CLK_15a to receive the start signal as the input signal.

As shown in FIG. 17, except for the first stage shift register 100, the input signal terminals Iput in the first scan unit 1 and the second scan unit 2 in other stage shift register 100 are electrically connected to the shift signal terminal CR<N> in the first scan unit 1 in a previous stage shift register 100. Except for last two stages of shift registers 100, the display reset signal terminals STD in the first scan unit 1 and the second scan unit 2 in other stage shift register 100 are electrically connected to the shift signal terminal CR<N> in the first scan unit 1 in a stage of shift register 100 after a next stage of shift register 100.

It will be noted that the cascade relationship shown in FIG. 17 is only an example, and other cascade methods may also be used according to actual situations.

Figure 19:
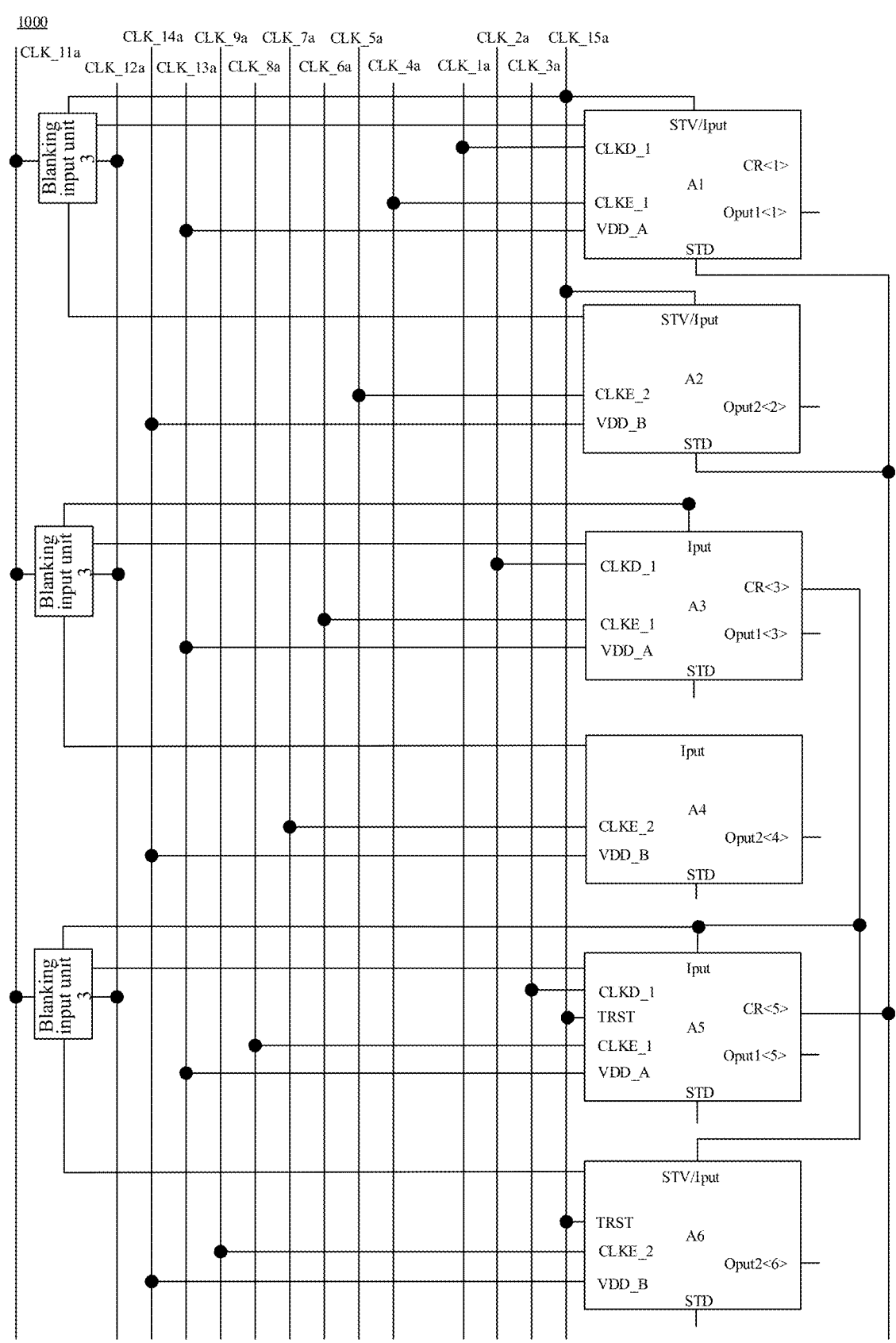
FIG. 19 is a structural diagram of another gate driving circuit, in accordance with some embodiments of the present disclosure.
Figure 20:
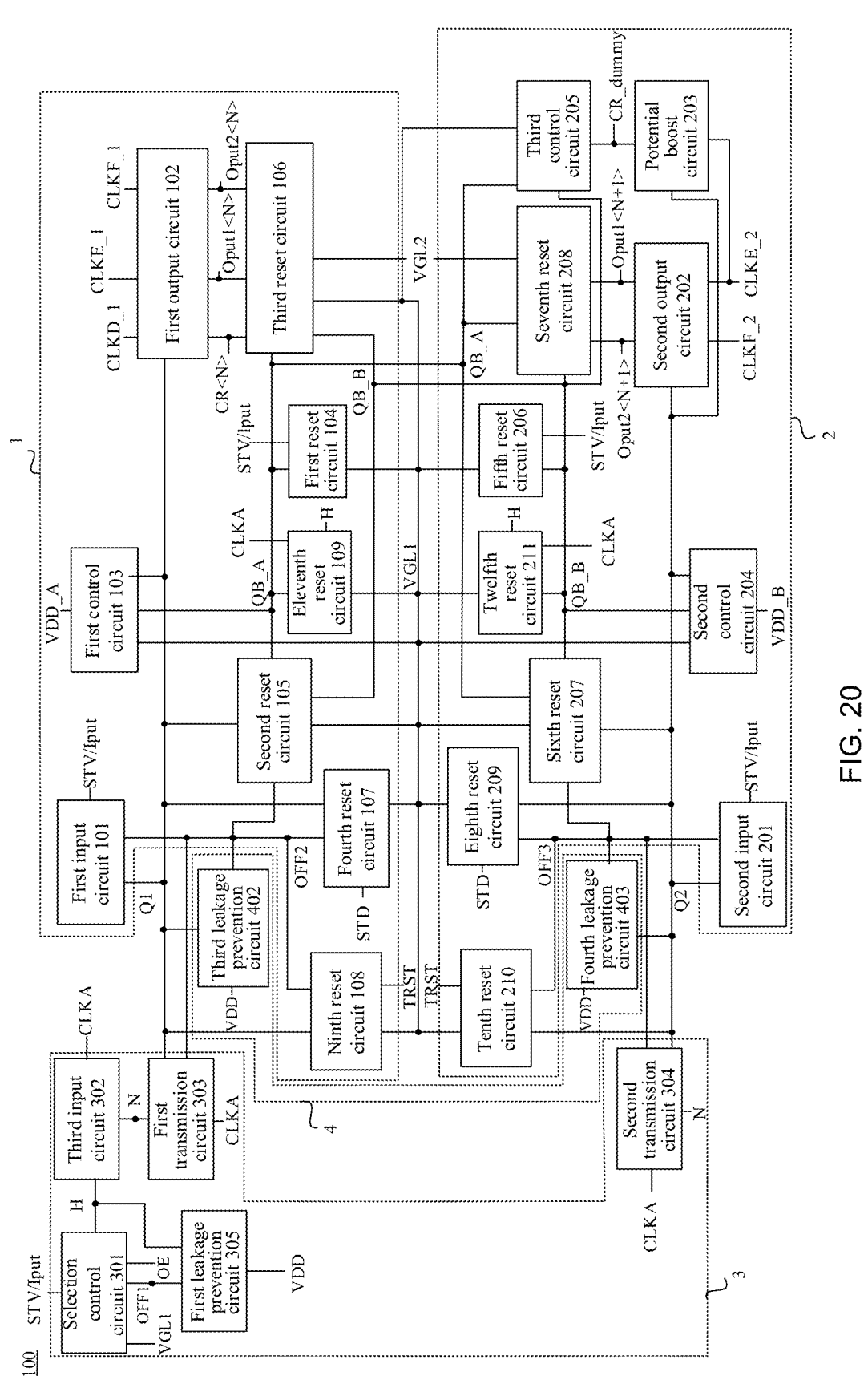
FIG. 20 is a structural diagram of yet another shift register, in accordance with some embodiments of the present disclosure.

For example, the cascade relationship may also be as shown in FIG. 19. Neither the first stage shift register 100 nor a second stage shift register 100 is electrically connected to a gate line GL. In a third stage shift register 100, the first scan unit 1 (i.e., A5) is electrically connected to the sub-pixels in the first row through a corresponding gate line GL, and the second scan unit 2 (i.e., A6) is electrically connected to the sub-pixels in the second row through a corresponding gate line GL.

FIG. 18 is a timing diagram showing the operation of the shift register 100 shown in FIG. 16. In FIGS. 18, Q1<5> and Q2<6>respectively represent the first pull-up node Q1 and the second pull-up node Q2 in the third stage shift register 100, and a number in parenthesis represents a row number of corresponding sub-pixels in the display panel PNL (the same below). Oput1<5> and Oput1<6>respectively represent the first scan signal output from the first scan signal terminal Oput1<N> and the second scan signal output from the second scan signal terminal Oput1<N+1> in the third stage shift register 100. CR<3> represents the shift signal output from the shift signal terminal CR<N> in the second stage shift register 100, and the shift signal may serve as the input signal of the third stage shift register 100. H<5>represents the first blanking node H in the third stage shift register 100. N<5>represents the second blanking node N in the third stage shift register 100. 1F represents a frame, Display represents the display period in the display phase of the frame, and Blank represents the blanking period in the display phase of the frame.

The method for driving the shift register 100 shown in FIG. 16 in the display phase of the frame will be schematically described below with reference to FIGS. 17 and 18.

Before the display phase of the frame, the tenth clock signal line CLK_10a may supply the global reset signal at a high level, so that the ninth reset circuit 108 (i.e., the twenty-ninth transistor M29 and the forty-third transistor M43) and the tenth reset circuit 210 (i.e., the thirtieth transistor M30 and the forty-eighth transistor M48) in each stage of shift register 100) are turned on, so as to reset the first pull-up node Q1 and the second pull-up node Q2 in each stage of shift register 100 to realize a global reset before the display phase of the frame.

In the display period in the display phase of the frame, an operating process of the third stage shift register 100 (i.e., corresponding to the sub-pixels in the fifth row and the sub-pixels in the sixth row in the display panel PNL) will be described as follows.

In a first phase 1 (including a first input phase and a second input phase), the shift signal CR<3> output from the first scan unit 1 in the second stage shift register 100 is at a high level. That is, the input signal transmitted to the input signal terminal Iput and transmitted by the input signal terminal Iput in the third stage shift register 100 is at a high level. The thirty-first transistor M31 and the fifty-first transistor M51 in the first input circuit 101 and the thirty-second transistor M32 and fifty-second transistor M52 in the second input circuit 201 are turned on due to the action of the input signal, and the input signal at the high level may charge the first pull-up node Q1<5> through the thirty-first transistor M31 and the fifty-first transistor M51, so as to pull the voltage of the first pull-up node Q1<5> up to be at a high level (i.e., the first input phase). The input signal at the high level may further charge the second pull-up node Q2<6> through the thirty-second transistor M32 and fifty-second transistor M52, so as to pull the voltage of the second pull-up node Q2<6> up to be at a high level (i.e., the second input phase).

The first transistor M1 in the first output circuit 102 is turned on under the control of the voltage of the first pull-up node Q1<5>. However, since a level of the first clock signal transmitted by the third clock signal line CLK_3a is a low level, in the first scan unit 1 in the third stage shift register 100, a level of the shift signal output from the shift signal terminal CR<N> is a low level. The second transistor M2 in the first output circuit 102 is turned on under the control of the voltage of the first pull-up node Q1<5>. However, since a level of the second clock signal supplied from the eighth clock signal line CLK_8a is a low level, in the first scan unit 1 in the third stage shift register 100, a level of the first scan signal Oput1<5> output from the first scan signal terminal Oput1<N> is a low level. The third transistor M3 in the second output circuit 202 and the fourth transistor M4 in the potential boost circuit 203 are turned on under the control of the voltage of the second pull-up node Q2<6>. However, since a level of the third clock signal supplied from the ninth clock signal line CLK_9a is a low level, in the second scan unit 2 in the third stage shift register 100, a level of the second scan signal Oput1<6> output from the second scan signal terminal Oput1<N+1> is a low level, and a level of the dummy shift signal output from the dummy shift signal terminal CR_dummy is a low level.

The selection control signal supplied from the eleventh clock signal line CLK_11a is the same as the input signal transmitted by the input signal terminal Iput. That is, the level of the selection control signal is a high level, and the thirty-third transistor M33 and the thirty-eighth transistor M38 in the selection control circuit 301 are turned on under the control of the selection control signal, and thus, the selection control signal at the high level is used for charging the first blanking node H<5>.

In this phase, the first pull-up node Q1<5>, the second pull-up node Q2<6> and the first blanking node H<5> in the third stage shift register 100 are precharged synchronously.

In a second phase 2 (including a first output phase), the level of the first clock signal supplied from the third clock signal line CLK_3a becomes a high level, and the level of the second clock signal supplied from the eighth clock signal line CLK_8a becomes a high level. The voltage of the first pull-up node Q1<5> is further pulled high (e.g., to VGH2) due to the bootstrap actions of the first transistor M1 and the second transistor M2, so that the first transistor M1 and the second transistor M2 are maintained in the on state. Thus, in the third stage shift register 100<N>, the level of the shift signal output from the shift signal terminal CR becomes a high level, and the level of the first scan signal Oput1<5> output from the first scan signal terminal Oput1<N> becomes a high level (i.e., the first output phase). However, since the level of the third clock signal supplied from the ninth clock signal line CLK_9a is still a low level, the second scan signal Oput1<6> output from the second scan signal terminal Oput1<N+1> in the second scan unit 2 in the third stage shift register 100 continues to be maintained at a low level.

In a third phase 3 (including the first output phase and a second output phase), the level of the third clock signal supplied from the ninth clock signal line CLK_9a becomes a high level. The voltage of the second pull-up node Q2<6> is further pulled high (e.g., to VGH2) due to the bootstrap actions of the third transistor M3 and the fourth transistor M4, so that the third transistor M3 is maintained in the on state, and thus, the level of the second scan signal Oput1<6> output from the second scan signal terminal Oput1<N+1> in the third stage shift register 100 becomes a high level (i.e., second output phase).

In a fourth phase 4 (including the second output phase), the voltage of the first pull-up node Q1<5> is still maintained at a high level due to a holding effect of the first capacitor C1, so that the second transistor M2 is maintained in the on state. However, since the level of the second clock signal supplied from the eighth clock signal line CLK_8a becomes a low level, the level of the first scan signal Oput1<5> output from the first scan signal terminal Oput1<N> in the third stage shift register 100 becomes a low level. Moreover, due to a bootstrap action of the first capacitor C1, the voltage of the first pull-up node Q1<5> is also decreased.

In a fifth phase 5, the voltage of the second pull-up node Q2<6> is still maintained at a high level due to a holding effect of the second capacitor C2, so that the third transistor M3 and the fourth transistor M4 are maintained in the on state. However, since the level of the third clock signal supplied from the ninth clock signal line CLK_9a becomes a low level, the level of the second scan signal Oput1<6> output from the second scan signal terminal Oput1<N+1> in the third stage shift register 100 becomes a low level. Moreover, due to a bootstrap action of the second capacitor C2, the voltage of the second pull-up node Q2<6> is also decreased.

In the first phase 1 to the fifth phase 5, since the voltage of the first pull-up node Q1<5> is always maintained at a high level, the sixty-third transistor M63 continuously transmits the fifth voltage signal to the second leakage prevention node OFF2. Since the voltage of the second pull-up node Q2<6> is always maintained at a high level, the forty-fourth transistor M44 continuously transmits the fifth voltage signal to the third leakage prevention node OFF3.

In a sixth phase 6, the clock signals of 6 clock signal lines are used in the embodiments of the present disclosure. Signals output from every three stages of shift registers 100 (each stage of shift register outputs the first scan signal and the second scan signal in sequence) are a cycle. Moreover, the third stage shift register 100 receives a shift signal CR<9> output from a fifth stage shift register 100 as the display reset signal. Therefore, in this phase, when the level of the first clock signal supplied from the second clock signal line CLK_2a becomes a high level, a level of the shift signal CR<9> output from the fifth stage shift register 100 is a high level, and a level of the display reset signal received by the third stage shift register 100 is also a high level. Thus, the twenty-second transistor M22 and the forty-second transistor M42 in the fourth reset circuit 107, and the twenty-eighth transistor M28 and the forty-seventh transistor M47 in the eighth reset circuit 209 are turned on to transmit the second voltage signal transmitted by the second voltage signal terminal VGL1 to the first pull-up node Q1<5> and the second pull-up node Q2<6>, so as to pull down the voltages of the first pull-up node Q1<5> and the second pull-up node Q2<6> to reset the first pull-up node Q1<5> and the second pull-up node Q2<6>.

After the third stage shift register 100 drives the sub-pixels in the fifth row and the sub-pixels in the sixth row in the display panel PNL for display, by analogy, the shift registers 100 such as a fourth stage shift register 100 and the fifth stage shift register 100 drive sub-pixels in the display panel PNL row by row to complete the display drive of the frame. At this point, the display period in the display phase of the frame ends.

In the blanking period in the display phase of the frame, an operating process of the third stage shift register 100 (i.e., corresponding to the sub-pixels in the fifth row and the sub-pixels in the sixth row in the display panel PNL) will be described as follows.

Here, in the first phase 1, after the first blanking node H<5> is charged such that the voltage of the first blanking node H<5> is increased, the third capacitor C3 may be discharged, so that the first blanking node H<5> is always maintained at a high voltage in the display period in the display phase of the frame.

In a seventh phase 7, the level of the fourth clock signal supplied from the twelfth clock signal line CLK_12a is a high level. Since the voltage of the first blanking node H<5> is maintained at a high level in this phase, the thirty-fourth transistor M34 in the third input circuit 302 may be turned on under the control of the voltage of the first blanking node H<5>, and transmit the fourth clock signal at the high level to the second blanking node N<5>, so that the voltage of the second blanking node N<5> becomes at a high level.

The thirty-fifth transistor M35 and the forty-ninth transistor M49 in the first transmission circuit 303, and the thirty-sixth transistor M36 and the fiftieth transistor M50 in the second transmission circuit 304 are turned on under the control of the fourth clock signal at the high level. The fourth clock signal at the high level may charge the first pull-up node Q1<5> and the second pull-up node Q2<6>, so that the voltages of the first pull-up node Q1<5> and the second pull-up node Q2<6> are pulled high.

Moreover, in the seventh phase 7, due to a bootstrap action of the thirty-fourth transistor M34, the voltage of the second blanking node N<5> changes from being at a low level to being at a high level, which pulls the voltage of the first blanking node H<5> up due to coupling, so that the first blanking node H<5> may be maintained at a high voltage, ensuring that the thirty-fourth transistor M34 is completely turned on.

Then, the level of the fourth clock signal supplied from the twelfth clock signal line CLK_12a changes from the high level to a low level, so that the voltage of the second blanking node N<5> becomes at a low level. Due to the bootstrap action of the thirty-fourth transistor M34, the voltage of the first blanking node H<5> is also decreased.

In this phase, the sixty-third transistor M63 may be turned on under the control of the voltage of the first pull-up node Q1<5>, and transmit the fifth voltage signal to the second leakage prevention node OFF2 to boost the voltage of the second leakage prevention node OFF2, thereby avoiding the electric leakage of the first pull-up node Q1<5>. The forty-fourth transistor M44 may be turned on under the control of the voltage of the second pull-up node Q2<6>, and transmit the fifth voltage signal to the third leakage prevention node OFF3 to boost the voltage of the third leakage prevention node OFF3, thereby avoiding the electric leakage of the second pull-up node Q2<6>.

In an eighth phase 8, the level of the second clock signal supplied from the eighth clock signal line CLK_8a becomes a high level, and the voltage of the first pull-up node Q1<5> is further increased due to the bootstrap actions of the first transistor M1 and the second transistor M2, so that the second transistor M2 is maintained in the on state, and the level of the first scan signal Oput1<5> (i.e., the first sensing signal) output from the first scan signal terminal Oput1<N> in the third stage shift register 100 becomes a high level.

Since the level of the third clock signal supplied from the ninth clock signal line CLK_9a is still the low level, the level of the second scan signal Oput1<6> (i.e., the second sensing signal) output from the second scan signal terminal Oput1<N+1> in the third stage shift register 100 is a low level.

Here, the first scan signal output in the eighth phase 8 may be used for driving the sensing transistors T3 in sub-pixels in a corresponding row in the display panel PNL, so as to realize the external compensation.

In a ninth phase 9, the voltage of the first pull-up node Q1<5> is still maintained at a high level due to the holding effect of the first capacitor C1, so that the second transistor M2 is maintained in the on state. Since the level of the second clock signal supplied from the eighth clock signal line CLK_8a becomes a low level, the level of the first scan signal Oput1<5> (i.e., the first sensing signal) output from the first scan signal terminal Oput1<N> in the third stage shift register 100 becomes a low level.

Moreover, due to the bootstrap action of the second capacitor C2, the voltage of the first pull-up node Q1<5> is also decreased.

In a tenth phase 10, the level of the global reset signal supplied from the tenth clock signal line CLK_10a is a high level. In each stage of shift register 100, the twenty-ninth transistor M29 and the forty-third transistor M43 in the ninth reset circuit 108, and the thirtieth transistor M30 and the forty-eighth transistor M48 in the tenth reset circuit 210 are turned on to transmit the second voltage signal transmitted by the second voltage signal terminal VGL1 to the first pull-up node Q1 and the second pull-up node Q2, so as to reset the first pull-up node Q1 and the second pull-up node Q2 in each stage of shift register 100.

The level of the selection control signal supplied from the eleventh clock signal line CLK_11a is a high level, and the thirty-third transistor M33 and the thirty-eighth transistor M38 in the selection control circuit 301 in each stage of shift register 100 are turned on. Since the level of the shift signal output from each stage of shift register 100 is a low level, the shift signal at the low level may be transmitted to the first blanking node H to reset the first blanking node H in each stage of shift register 100, thereby completing the global reset.

At this point, the blanking period in the display phase of the frame ends.

In a subsequent display phase of other frame, a process for driving the gate driving circuit 1000 may refer to the above description, and will not be repeated here.

Figure 22:
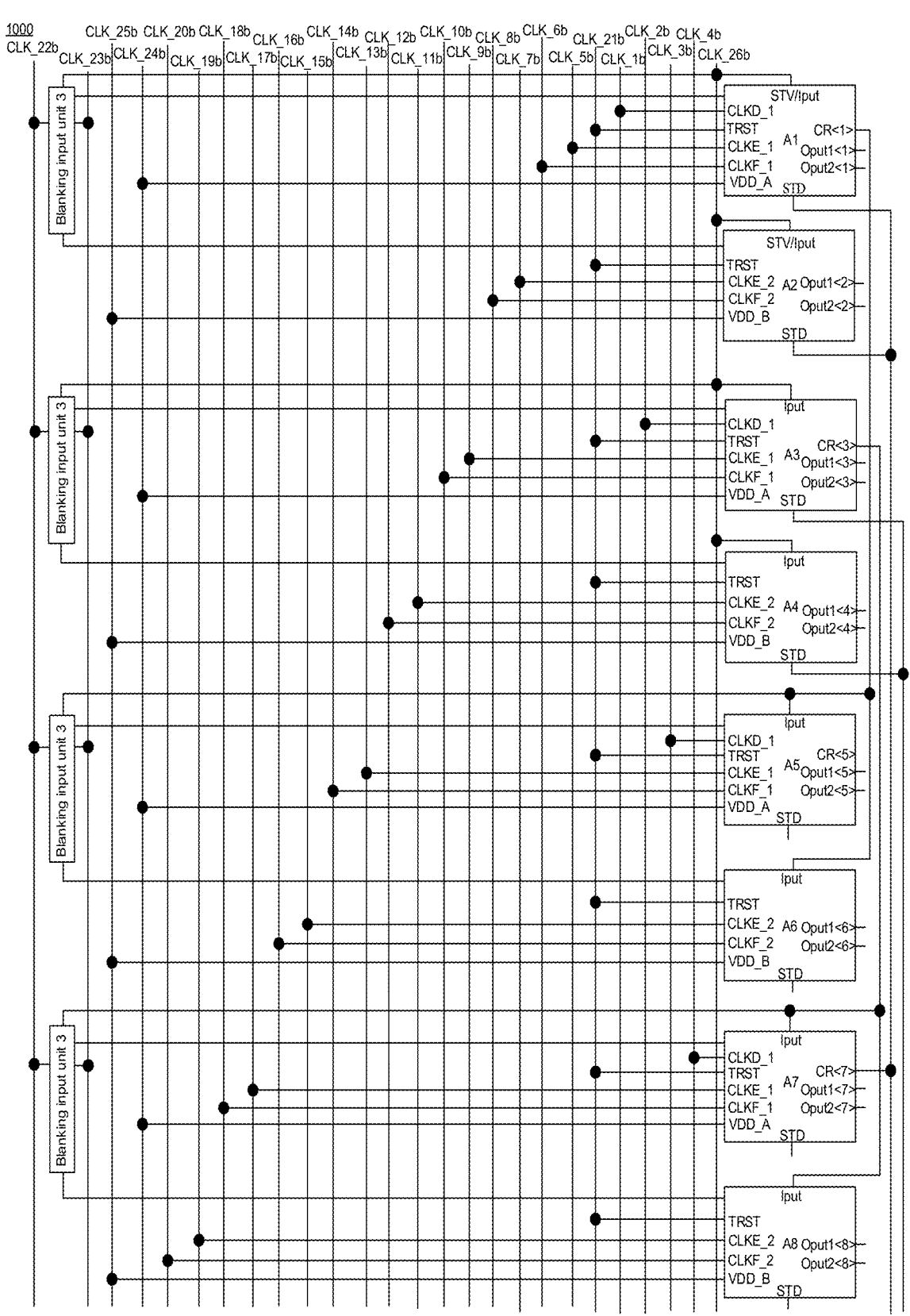
FIG. 22 is a structural diagram of yet another gate driving circuit, in accordance with some embodiments of the present disclosure.

In some other embodiments, as shown in FIG. 22, the gate driving circuit 1000 includes a plurality of shift registers 100 that are cascaded. Each shift register 100 includes the first scan unit 1 and the second scan unit 2. The shift register 100 may have the structure as shown in FIG. 21.

A1, A2, A3 . . . . A8 shown in FIG. 22 respectively represent scan units in the shift register 100. For example, A1, A3, A5 and A7 respectively represent the first scan units 1 in four shift registers 100, and A2, A4, A6 and A8 respectively represent the second scan units 2 in the four shift registers 100.

In this case, the scan units in the gate driving circuit 1000 may be correspondingly electrically connected to the gate lines GL in the above display panel PNL. For example, A1 may be electrically connected to a first gate line and a second gate line, A2 may be electrically connected to a third gate line and a fourth gate line, A3 may be electrically connected to a fifth gate line and a sixth gate line, A4 may be electrically connected to a seventh gate line and an eighth gate line, A5 may be electrically connected to a ninth gate line and a tenth gate line, A6 may be electrically connected to an eleventh gate line and a twelfth gate line, A7 may be electrically connected to a thirteenth gate line and a fourteenth gate line, and A8 may be electrically connected to a fifteenth gate line and a sixteenth gate line, so as to respectively drive the sub-pixels in the first row, the sub-pixels in the second row, the sub-pixels in the third row, the sub-pixels in the fourth row, the sub-pixels in the fifth row, the sub-pixels in the sixth row, sub-pixels in a seventh row, and sub-pixels in an eighth row in the display panel PNL for display.

Considering the structural diagram of the gate driving circuit 1000 as shown in FIG. 22 as an example, signal lines in the gate driving circuit 1000 will be schematically described below.

As shown in FIG. 22, the gate driving circuit 1000 includes a first clock signal line CLK_1b, a second clock signal line CLK_2b, a third clock signal line CLK_3b, and a fourth clock signal line CLK_4b.

The first clock signal terminal CLKD_1 in the first scan unit 1 in a (4N-3)-th stage shift register is electrically connected to the first clock signal line CLK_1b to receive the first clock signal. The first clock signal terminal CLKD_1 in the first scan unit 1 in a (4N-2)-th stage shift register is electrically connected to the second clock signal line CLK_2b to receive the first clock signal. The first clock signal terminal CLKD_1 in the first scan unit 1 in a (4N-1)-th stage shift register is electrically connected to the third clock signal line CLK_3b to receive the first clock signal. The first clock signal terminal CLKD_1 in the first scan unit 1 in a 4N-th stage shift register is electrically connected to the fourth clock signal line CLK_4b to receive the first clock signal.

As shown in FIG. 22, the gate driving circuit 1000 further includes a fifth clock signal line CLK_5b, a sixth clock signal line CLK_6b, a seventh clock signal line CLK_7b, an eighth clock signal line CLK_8b, a ninth clock signal line CLK_9b, a tenth clock signal line CLK_10b, an eleventh clock signal line CLK_11b, a twelfth clock signal line CLK_12b, a thirteenth clock signal line CLK_13b, a fourteenth clock signal line CLK_14b, a fifteenth clock signal line CLK_15b, a sixteenth clock signal line CLK_16b, a seventeenth clock signal line CLK_17b, an eighteenth clock signal line CLK_18b, a nineteenth clock signal line CLK_19b, and a twentieth clock signal line CLK_20b.

In the (4N-3)-th stage shift register, in the first scan unit 1, the second clock signal terminal CLKE_1 is electrically connected to the fifth clock signal line CLK_5b to receive the second clock signal, and the fifth clock signal terminal CLKF_1 is electrically connected to the sixth clock signal line CLK_6b to receive the fifth clock signal. In the second scan unit 2, the third clock signal terminal CLKE_2 is electrically connected to the seventh clock signal line CLK_7b to receive the third clock signal, and the sixth clock signal terminal CLKF_2 is electrically connected to the eighth clock signal line CLK_8b to receive the sixth clock signal.

In the (4N-2)-th stage shift register 100, in the first scan unit 1, the second clock signal terminal CLKE_1 is electrically connected to the ninth clock signal line CLK_9b to receive the second clock signal, and the fifth clock signal terminal CLKF_1 is electrically connected to the tenth clock signal line CLK_10b to receive the fifth clock signal. In the second scan unit 2, the third clock signal terminal CLKE_2 is electrically connected to the eleventh clock signal line CLK_11b to receive the third clock signal, and the sixth clock signal terminal CLKF_2 is electrically connected to the twelfth clock signal line CLK_12b to receive the sixth clock signal.

In the (4N-1)-th stage shift register 100, in the first scan unit 1, the second clock signal terminal CLKE_1 is electrically connected to the thirteenth clock signal line CLK_13b to receive the second clock signal, and the fifth clock signal terminal CLKF_1 is electrically connected to the fourteenth clock signal line CLK_14b to receive the fifth clock signal. In the second scan unit 2, the third clock signal terminal CLKE_2 is electrically connected to the fifteenth clock signal line CLK_15b to receive the third clock signal, and the sixth clock signal terminal CLKF_2 is electrically connected to the sixteenth clock signal line CLK_16b to receive the sixth clock signal.

In the 4N-th stage shift register 100, in the first scan unit 1, the second clock signal terminal CLKE_1 is electrically connected to the seventeenth clock signal line CLK_17b to receive the second clock signal, and the fifth clock signal terminal CLKF_1 is connected to the eighteenth clock signal to receive the fifth clock signal. In the second scan unit 2, the third clock signal terminal CLKE_2 is electrically connected to the nineteenth clock signal line CLK_19b to receive the third clock signal, and the sixth clock signal terminal CLKF_2 is electrically connected to the twentieth clock signal line CLK_20b to receive the sixth clock signal.

As shown in FIG. 22, the gate driving circuit 1000 further includes a twenty-first clock signal line CLK_21b.

The global reset signal terminal TRST in the first scan unit 1 and the global reset signal terminal TRST in the second scan unit 2 in each stage of shift register 100 are electrically connected to the twenty-first clock signal line CLK_21b to receive the global reset signal.

As shown in FIG. 22, the gate driving circuit 1000 further includes a twenty-second clock signal line CLK_22b and a twenty-third clock signal line CLK_23b.

The selection control signal terminal OE in the blanking input unit 3 in each stage of shift register 100 is electrically connected to the twenty-second clock signal line CLK_22b to receive the selection control signal.

The fourth clock signal terminal CLKA in the blanking input unit 3 in each stage of shift register 100 is electrically connected to the twenty-third clock signal line CLK_23b to receive the fourth clock signal.

As shown in FIG. 22, the gate driving circuit 1000 further includes a twenty-fourth clock signal line CLK_24b and a twenty-fifth clock signal line CLK_25b.

The first voltage signal terminal VDD_A in the first scan unit 1 in each stage of shift register 100 is electrically connected to the twenty-fourth clock signal line CLK_24b to receive the first voltage signal. The third voltage signal terminal VDD_B in the second scan unit 2 in each stage of shift register 100 is electrically connected to the twenty-fifth clock signal line CLK_25b to receive the third voltage signal.

As shown in FIG. 22, the gate driving circuit 1000 further includes a twenty-sixth clock signal line CLK_26b.

The input signal terminal Iput in the first scan unit 1 and the input signal terminal Iput in the second scan unit 2 in the first stage shift register 100, and the input signal terminal Iput in the first scan unit 1 and the input signal terminal Iput in the second scan unit 2 in the second stage shift register 100 are electrically connected to the twenty-sixth clock signal line CLK_26b to receive the start signal as the input signal.

As shown in FIG. 22, except for the first stage shift register 100 and the second stage shift register 100, in other stage shift register 100, the input signal terminal Iput in the first scan unit 1 and the input signal terminal Iput in the second scan unit 2 are electrically connected to the shift signal terminal CR<N> in the first scan unit 1 in a stage of shift register 100 before a previous stage of shift register 100. Except for last three stages of shift registers 100, in other stage shift register 100, the display reset signal terminal STD in the first scan unit 1 and the display reset signal terminal STD in the second scan unit 2 are electrically connected to the shift signal terminal CR<N> in the first scan unit 1 in a stage of shift register 100 after next two stages of shift registers 100.

It will be noted that the cascade relationship shown in FIG. 22 is only an example, and other cascade methods may also be used according to actual situations.

In the above embodiments of the present disclosure, on and off (i.e., turning-on and turning-off) processes of a transistor are described in an example where all transistors are N-type transistors. In the embodiments of the present disclosure, the transistors may also be P-type transistors. In a case where all the transistors are P-type transistors, control signals are required to be inverted.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register comprising:
a first scan unit, wherein the first scan unit includes a first input circuit and a first output circuit, wherein
the first input circuit is electrically connected to an input signal terminal and a first pull-up node; and
the first output circuit is electrically connected to the first pull-up node, a first clock signal terminal, a second clock signal terminal, a shift signal terminal, and a first scan signal terminal; and
a second scan unit, wherein the second scan unit includes a second input circuit, a second output circuit, and a fourth transistor, wherein
the second input circuit is electrically connected to the input signal terminal and a second pull-up node;
the second output circuit is electrically connected to the second pull-up node, a third clock signal terminal, and a second scan signal terminal; and
a control electrode of the fourth transistor is electrically connected to the second pull-up node, a first electrode of the fourth transistor is electrically connected to a sub-clock signal terminal, and a second electrode of the fourth transistor is electrically connected to a dummy shift signal terminal, and the sub-clock signal terminal is the third clock signal terminal electrically connected to the second output circuit.

2. The shift register according to claim 1, wherein the first output circuit includes a first transistor, a second transistor, and a first capacitor; and the second output circuit includes a third transistor and a second capacitor; wherein
a control electrode of the first transistor is electrically connected to the first pull-up node, a first electrode of the first transistor is electrically connected to the first clock signal terminal, and a second electrode of the first transistor is electrically connected to the shift signal terminal;
a control electrode of the second transistor is electrically connected to the first pull-up node, a first electrode of the second transistor is electrically connected to the second clock signal terminal, and a second electrode of the second transistor is electrically connected to the first scan signal terminal;
a first terminal of the first capacitor is electrically connected to the first pull-up node, and a second terminal of the first capacitor is electrically connected to the first scan signal terminal;
a control electrode of the third transistor is electrically connected to the second pull-up node, a first electrode of the third transistor is electrically connected to the third clock signal terminal, and a second electrode of the third transistor is electrically connected to the second scan signal terminal; and
a first terminal of the second capacitor is electrically connected to the second pull-up node, and a second terminal of the second capacitor is electrically connected to the second scan signal terminal; or
the first output circuit includes a first transistor, a second transistor, and a first capacitor; and the second output circuit includes a third transistor and a second capacitor; wherein
a control electrode of the first transistor is electrically connected to the first pull-up node, a first electrode of the first transistor is electrically connected to the first clock signal terminal, and a second electrode of the first transistor is electrically connected to the shift signal terminal;
a control electrode of the second transistor is electrically connected to the first pull-up node, a first electrode of the second transistor is electrically connected to the second clock signal terminal, and a second electrode of the second transistor is electrically connected to the first scan signal terminal;
a first terminal of the first capacitor is electrically connected to the first pull-up node, and a second terminal of the first capacitor is electrically connected to the first scan signal terminal;
a control electrode of the third transistor is electrically connected to the second pull-up node, a first electrode of the third transistor is electrically connected to the third clock signal terminal, and a second electrode of the third transistor is electrically connected to the second scan signal terminal;
a first terminal of the second capacitor is electrically connected to the second pull-up node, and a second terminal of the second capacitor is electrically connected to the second scan signal terminal; and
the first output circuit is further electrically connected to a fifth clock signal terminal and a first sensing signal terminal; and the second output circuit is further electrically connected to a sixth clock signal terminal and a second sensing signal terminal; or
the first output circuit is further electrically connected to a fifth clock signal terminal and a first sensing signal terminal; and the second output circuit is further electrically connected to a sixth clock signal terminal and a second sensing signal terminal; and
the first output circuit includes a first transistor, a second transistor, a fifty-third transistor, a first capacitor, and a fourth capacitor; and the second output circuit includes a third transistor, a second capacitor, a fifty-fourth transistor, and a fifth capacitor; wherein
a control electrode of the first transistor is electrically connected to the first pull-up node, a first electrode of the first transistor is electrically connected to the first clock signal terminal, and a second electrode of the first transistor is electrically connected to the shift signal terminal;

a control electrode of the second transistor is electrically connected to the first pull-up node, a first electrode of the second transistor is electrically connected to the second clock signal terminal, and a second electrode of the second transistor is electrically connected to the first scan signal terminal;

a control electrode of the fifty-third transistor is electrically connected to the first pull-up node, a first electrode of the fifty-third transistor is electrically connected to the fifth clock signal terminal, and a second electrode of the fifty-third transistor is electrically connected to the first sensing signal terminal;

a first terminal of the first capacitor is electrically connected to the first pull-up node, and a second terminal of the first capacitor is electrically connected to the first scan signal terminal;

a first terminal of the fourth capacitor is electrically connected to the first pull-up node, and a second terminal of the fourth capacitor is electrically connected to the first sensing signal terminal;

a control electrode of the third transistor is electrically connected to the second pull-up node, a first electrode of the third transistor is electrically connected to the third clock signal terminal, and a second electrode of the third transistor is electrically connected to the second scan signal terminal;

a control electrode of the fifty-fourth transistor is electrically connected to the second pull-up node, a first electrode of the fifty-fourth transistor is electrically connected to the sixth clock signal terminal, and a second electrode of the fifty-fourth transistor is electrically connected to the second sensing signal terminal;

a first terminal of the second capacitor is electrically connected to the second pull-up node, and a second terminal of the second capacitor is electrically connected to the second scan signal terminal;

a first terminal of the fifth capacitor is electrically connected to the second pull-up node, and a second terminal of the fifth capacitor is electrically connected to the second sensing signal terminal.

3. The shift register according to claim 2, wherein a sum of a width-to-length ratio of the first transistor and a width-to-length ratio of the second transistor is approximately equal to a sum of a width-to-length ratio of the third transistor and a width-to-length ratio of the fourth transistor; or the first output circuit is further electrically connected to a fifth clock signal terminal and a first sensing signal terminal; the first output circuit further includes a fifty-third transistor, and a control electrode of the fifty-third transistor is electrically connected to the first pull-up node, a first electrode of the fifty-third transistor is electrically connected to the fifth clock signal terminal, and a second electrode of the fifty-third transistor is electrically connected to the first sensing signal terminal; the second output circuit is further electrically connected to a sixth clock signal terminal and a second sensing signal terminal; the second output circuit further includes a fifty-fourth transistor, and a control electrode of the fifty-fourth transistor is electrically connected to the second pull-up node, a first electrode of the fifty-fourth transistor is electrically connected to the sixth clock signal terminal, and a second electrode of the fifty-fourth transistor is electrically connected to the second sensing signal terminal; and a sum of the width-to-length ratio of the first transistor, the width-to-length ratio of the second transistor, and a width-to-length ratio of the fifty-third transistor is approximately equal to a sum of the width-to-length ratio of the third transistor, the width-to-length ratio of the fourth transistor, and a width-to-length ratio of the fifty-fourth transistor.

4. The shift register according to claim 1, wherein the first scan unit further includes a first control circuit;

the first control circuit is electrically connected to the first pull-up node, a first voltage signal terminal, a first pull-down node, and a second voltage signal terminal; the first control circuit is configured to control a voltage of the first pull-down node under one of a control of the voltage of the first pull-up node and a first voltage signal transmitted by the first voltage signal terminal and a control of the voltage of the first pull-up node and a second voltage signal transmitted by the second voltage signal terminal; and the second scan unit further includes a second control circuit;

the second control circuit is electrically connected to the second pull-up node, a third voltage signal terminal, a second pull-down node, and the second voltage signal terminal; the second control circuit is configured to control a voltage of the second pull-down node under one of a control of the voltage of the second pull-up node and a third voltage signal transmitted by the third voltage signal terminal and a control of the voltage of the second pull-up node and the second voltage signal transmitted by the second voltage signal terminal.

5. The shift register according to claim 4, wherein the second scan unit further includes a third control circuit; the third control circuit is electrically connected to the first pull-down node, the second pull-down node, the second voltage signal terminal, and the dummy shift signal terminal; the third control circuit is configured to, under a control of one of the voltage of the first pull-down node and the voltage of the second pull-down node, transmit the second voltage signal transmitted by the second voltage signal terminal to the dummy shift signal terminal to control a voltage of the dummy shift signal terminal; or the second scan unit further includes a third control circuit; the third control circuit is electrically connected to the first pull-down node, the second pull-down node, the second voltage signal terminal, and the dummy shift signal terminal; wherein the third control circuit includes a thirteenth transistor and a fourteenth transistor; a control electrode of the thirteenth transistor is electrically connected to the second pull-down node, a first electrode of the thirteenth transistor is electrically connected to the dummy shift signal terminal, and a second electrode of the thirteenth transistor is electrically connected to the second voltage signal terminal; a control electrode of the fourteenth transistor is electrically connected to the first pull-down node, a first electrode of the fourteenth transistor is electrically connected to the dummy shift signal terminal, and a second electrode of the fourteenth transistor is electrically connected to the second voltage signal terminal.

6. The shift register according to claim 4, wherein the first control circuit includes a fifth transistor, a sixth transistor, a seventh transistor, and an eighth transistor; a control electrode of the fifth transistor is electrically connected to the first voltage signal terminal, a first electrode of the fifth transistor is electrically connected to the first voltage signal terminal, and a second electrode of the fifth transistor is electrically connected to a control electrode of the sixth transistor and a first electrode of the seventh transistor; a first electrode of the sixth transistor is electrically connected to the first voltage signal terminal, and a second electrode of the sixth transistor is electrically connected to the first pull-down node and a first electrode of the eighth transistor; a control electrode of the seventh transistor is electrically connected to the first pull-up node, and a second electrode of the seventh transistor is electrically connected to the second voltage signal terminal; a control electrode of the eighth transistor is electrically connected to the first pull-up node, and a second electrode of the eighth transistor is electrically connected to the second voltage signal terminal; and the second control circuit includes a ninth transistor, a tenth transistor, an eleventh transistor, and a twelfth transistor; a control electrode of the ninth transistor is electrically connected to the third voltage signal terminal, a first electrode of the ninth transistor is electrically connected to the third voltage signal terminal, and a second electrode of the ninth transistor is electrically connected to a control electrode of the tenth transistor and a first electrode of the eleventh transistor; a first electrode of the tenth transistor is electrically connected to the third voltage signal terminal, and a second electrode of the tenth transistor is electrically connected to the second pull-down node and a first electrode of the twelfth transistor; a control electrode of the eleventh transistor is electrically connected to the second pull-up node, and a second electrode of the eleventh transistor is electrically connected to the second voltage signal terminal; a control electrode of the twelfth transistor is electrically connected to the second pull-up node, and a second electrode of the twelfth transistor is electrically connected to the second voltage signal terminal.

7. The shift register according to claim 4, wherein the first scan unit further includes a first reset circuit, a second reset circuit, a third reset circuit, and a fourth reset circuit, and the second scan unit further includes a fifth reset circuit, a sixth reset circuit, a seventh reset circuit, and an eighth reset circuit, wherein the first reset circuit is electrically connected to the input signal terminal, the first pull-down node, and the second voltage signal terminal; the first reset circuit is configured to, under a control of the input signal transmitted by the input signal terminal, transmit the second voltage signal transmitted by the second voltage signal terminal to the first pull-down node to reset the first pull-down node;

the second reset circuit is electrically connected to the first pull-down node, the second pull-down node, the first pull-up node, and the second voltage signal terminal; the second reset circuit is configured to, under a control of one of the voltage of the first pull-down node and the voltage of the second pull-down node, transmit the second voltage signal transmitted by the second voltage signal terminal to the first pull-up node to reset the first pull-up node;

the third reset circuit is electrically connected to the first pull-down node, the second pull-down node, the shift signal terminal, the first scan signal terminal, the second voltage signal terminal, and a fourth voltage signal terminal; the third reset circuit is configured to, under the control of one of the voltage of the first pull-down node and the voltage of the second pull-down node, transmit the second voltage signal transmitted by the second voltage signal terminal to the shift signal terminal to reset the shift signal terminal, and transmit a fourth voltage signal transmitted by the fourth voltage signal terminal to the first scan signal terminal to reset the first scan signal terminal;

the fourth reset circuit is electrically connected to a display reset signal terminal, the first pull-up node, and the second voltage signal terminal; the fourth reset circuit is configured to, under a control of a display reset signal transmitted by the display reset signal terminal, transmit the second voltage signal transmitted by the second voltage signal terminal to the first pull-up node to reset the first pull-up node;

the fifth reset circuit is electrically connected to the input signal terminal, the second pull-down node, and the second voltage signal terminal; the fifth reset circuit is configured to, under the control of the input signal transmitted by the input signal terminal, transmit the second voltage signal transmitted by the second voltage signal terminal to the second pull-down node to reset the second pull-down node;

the sixth reset circuit is electrically connected to the first pull-down node, the second pull-down node, the second pull-up node, and the second voltage signal terminal; the sixth reset circuit is configured to, under the control of one of the voltage of the first pull-down node and the voltage of the second pull-down node, transmit the second voltage signal transmitted by the second voltage signal terminal to the second pull-up node to reset the second pull-up node;

the seventh reset circuit is electrically connected to the first pull-down node, the second pull-down node, the second scan signal terminal, and the fourth voltage signal terminal; the seventh reset circuit is configured to, under the control of one of the voltage of the first pull-down node and the voltage of the second pull-down node, transmit the fourth voltage signal transmitted by the fourth voltage signal terminal to the second scan signal terminal to reset the second scan signal terminal; and the eighth reset circuit is electrically connected to the display reset signal terminal, the second pull-up node, and the second voltage signal terminal; the eighth reset circuit is configured to, under the control of the display reset signal transmitted by the display reset signal terminal, transmit the second voltage signal transmitted by the second voltage signal terminal to the second pull-up node to reset the second pull-up node; or the first scan unit further includes a first reset circuit, a second reset circuit, a third reset circuit, and a fourth reset circuit, and the second scan unit further includes a fifth reset circuit, a sixth reset circuit, a seventh reset circuit, and an eighth reset circuit, wherein the first reset circuit is electrically connected to the input signal terminal, the first pull-down node, and the second voltage signal terminal; the first reset circuit includes a fifteenth transistor; a control electrode of the fifteenth transistor is electrically connected to the input signal terminal, a first electrode of the fifteenth transistor is electrically connected to the first pull-down node, and a second electrode of the fifteenth transistor is electrically connected to the second voltage signal terminal;

the second reset circuit is electrically connected to the first pull-down node, the second pull-down node, the first pull-up node, and the second voltage signal terminal; the second reset circuit includes a sixteenth transistor and a seventeenth transistor; a control electrode of the sixteenth transistor is electrically connected to the second pull-down node, a first electrode of the sixteenth transistor is electrically connected to the first pull-up node, and a second electrode of the sixteenth transistor is electrically connected to the second voltage signal terminal; a control electrode of the seventeenth transistor is electrically connected to the first pull-down node, a first electrode of the seventeenth transistor is electrically connected to the first pull-up node, and a second electrode of the seventeenth transistor is electrically connected to the second voltage signal terminal; the third reset circuit is electrically connected to the first pull-down node, the second pull-down node, the shift signal terminal, the first scan signal terminal, the second voltage signal terminal, and a fourth voltage signal terminal; the third reset circuit includes an eighteenth transistor, a nineteenth transistor, a twentieth transistor, and a twenty-first transistor; a control electrode of the eighteenth transistor is electrically connected to the first pull-down node, a first electrode of the eighteenth transistor is electrically connected to the shift signal terminal, and a second electrode of the eighteenth transistor is electrically connected to the second voltage signal terminal; a control electrode of the nineteenth transistor is electrically connected to the second pull-down node, a first electrode of the nineteenth transistor is electrically connected to the shift signal terminal, and a second electrode of the nineteenth transistor is electrically connected to the second voltage signal terminal; a control electrode of the twentieth transistor is electrically connected to the first pull-down node, a first electrode of the twentieth transistor is electrically connected to the first scan signal terminal, and a second electrode of the twentieth transistor is electrically connected to the fourth voltage signal terminal; a control electrode of the twenty-first transistor is electrically connected to the second pull-down node, a first electrode of the twenty-first transistor is electrically connected to the first scan signal terminal, and a second electrode of the twenty-first transistor is electrically connected to the fourth voltage signal terminal;

the fourth reset circuit is electrically connected to a display reset signal terminal, the first pull-up node, and the second voltage signal terminal; the fourth reset circuit includes a twenty-second transistor; a control electrode of the twenty-second transistor is electrically connected to the display reset signal terminal, a first electrode of the twenty-second transistor is electrically connected to the first pull-up node, and a second electrode of the twenty-second transistor is electrically connected to the second voltage signal terminal;

the fifth reset circuit is electrically connected to the input signal terminal, the second pull-down node, and the second voltage signal terminal; the fifth reset circuit includes a twenty-third transistor; a control electrode of the twenty-third transistor is electrically connected to the input signal terminal, a first electrode of the twenty-third transistor is electrically connected to the second pull-down node, and a second electrode of the twenty-third transistor is electrically connected to the second voltage signal terminal;

the sixth reset circuit is electrically connected to the first pull-down node, the second pull-down node, the second pull-up node, and the second voltage signal terminal; the sixth reset circuit includes a twenty-fourth transistor and a twenty-fifth transistor; a control electrode of the twenty-fourth transistor is electrically connected to the first pull-down node, a first electrode of the twenty-fourth transistor is electrically connected to the second pull-up node, and a second electrode of the twenty-fourth transistor is electrically connected to the second voltage signal terminal; a control electrode of the twenty-fifth transistor is electrically connected to the second pull-down node, a first electrode of the twenty-fifth transistor is electrically connected to the second pull-up node, and a second electrode of the twenty-fifth transistor is electrically connected to the second voltage signal terminal;

the seventh reset circuit is electrically connected to the first pull-down node, the second pull-down node, the second scan signal terminal, and the fourth voltage signal terminal; the seventh reset circuit includes a twenty-sixth transistor and a twenty-seventh transistor; a control electrode of the twenty-sixth transistor is electrically connected to the second pull-down node, a first electrode of the twenty-sixth transistor is electrically connected to the second scan signal terminal, and a second electrode of the twenty-sixth transistor is electrically connected to the fourth voltage signal terminal; a control electrode of the twenty-seventh transistor is electrically connected to the first pull-down node, a first electrode of the twenty-seventh transistor is electrically connected to the second scan signal terminal, and a second electrode of the twenty-seventh transistor is electrically connected to the fourth voltage signal terminal; and the eighth reset circuit is electrically connected to the display reset signal terminal, the second pull-up node, and the second voltage signal terminal; the eighth reset circuit includes a twenty-eighth transistor; a control electrode of the twenty-eighth transistor is electrically connected to the display reset signal terminal, a first electrode of the twenty-eighth transistor is electrically connected to the second pull-up node, and a second electrode of the twenty-eighth transistor is electrically connected to the second voltage signal terminal.

8. The shift register circuit according to claim 7, wherein the first output circuit is further electrically connected to a fifth clock signal terminal and a first sensing signal terminal, and the first output circuit is further configured to transmit a fifth clock signal received at the fifth clock signal terminal to the first sensing signal terminal under the control of the voltage of the first pull-up node, so that a first sensing signal is output from the first sensing signal terminal; and the second output circuit is further electrically connected to a sixth clock signal terminal and a second sensing signal terminal, and the second output circuit is further configured to transmit a sixth clock signal received at the sixth clock signal terminal to the second sensing signal terminal under the control of the voltage of the second pull-up node, so that a second sensing signal is output from the second sensing signal terminal; the third reset circuit is further electrically connected to the first sensing signal terminal; the third reset circuit is further configured to reset the first sensing signal terminal under the control of one of the voltage of the first pull-down node and the voltage of the second pull-down node; and the seventh reset circuit is further electrically connected to the second sensing signal terminal; the seventh reset circuit is further configured to reset the second sensing signal terminal under the control of one of the voltage of the first pull-down node and the voltage of the second pull-down node; or the first output circuit is further electrically connected to a fifth clock signal terminal and a first sensing signal terminal, and the first output circuit is further configured to transmit a fifth clock signal received at the fifth clock signal terminal to the first sensing signal terminal under the control of the voltage of the first pull-up node, so that a first sensing signal is output from the first sensing signal terminal; the second output circuit is further electrically connected to a sixth clock signal terminal and a second sensing signal terminal, and the second output circuit is further configured to transmit a sixth clock signal received at the sixth clock signal terminal to the second sensing signal terminal under the control of the voltage of the second pull-up node, so that a second sensing signal is output from the second sensing signal terminal;

the third reset circuit is further electrically connected to the first sensing signal terminal; the third reset circuit includes a fifty-fifth transistor and a fifty-sixth transistor; a control electrode of the fifty-fifth transistor is electrically connected to the first pull-down node, a first electrode of the fifty-fifth transistor is electrically connected to the first sensing signal terminal, and a second electrode of the fifty-fifth transistor is electrically connected to the fourth voltage signal terminal; a control electrode of the fifty-sixth transistor is electrically connected to the second pull-down node, a first electrode of the fifty-sixth transistor is electrically connected to the first sensing signal terminal, and a second electrode of the fifty-sixth transistor is electrically connected to the fourth voltage signal terminal; and the seventh reset circuit is further electrically connected to the second sensing signal terminal; the seventh reset circuit includes a fifty-seventh transistor and a fifty-eighth transistor; a control electrode of the fifty-seventh transistor is electrically connected to the second pull-down node, a first electrode of the fifty-seventh transistor is electrically connected to the second sensing signal terminal, and a second electrode of the fifty-seventh transistor is electrically connected to the fourth voltage signal terminal; a control electrode of the fifty-eighth transistor is electrically connected to the first pull-down node, a first electrode of the fifty-eighth transistor is electrically connected to the second sensing signal terminal, and a second electrode of the fifty-eighth transistor is electrically connected to the fourth voltage signal terminal.

9. The shift register according to claim 7, wherein the first scan unit further includes a ninth reset circuit; the ninth reset circuit is electrically connected to a global reset signal terminal, the first pull-up node, and the second voltage signal terminal; the ninth reset circuit is configured to reset the first pull-up node under a control of a global reset signal transmitted by the global reset signal terminal; and the second scan unit further includes a tenth reset circuit; the tenth reset circuit is electrically connected to the global reset signal terminal, the second pull-up node, and the second voltage signal terminal; the tenth reset circuit is configured to reset the second pull-up node under the control of the global reset signal transmitted by the global reset signal terminal; or the first scan unit further includes a ninth reset circuit; the ninth reset circuit is electrically connected to a global reset signal terminal, the first pull-up node, and the second voltage signal terminal; the ninth reset circuit includes a twenty-ninth transistor; a control electrode of the twenty-ninth transistor is electrically connected to the global reset signal terminal, a first electrode of the twenty-ninth transistor is electrically connected to the first pull-up node, and a second electrode of the twenty-ninth transistor is electrically connected to the second voltage signal terminal; and the second scan unit further includes a tenth reset circuit; the tenth reset circuit is electrically connected to the global reset signal terminal, the second pull-up node, and the second voltage signal terminal; the tenth reset circuit includes a thirtieth transistor; a control electrode of the thirtieth transistor is electrically connected to the global reset signal terminal, a first electrode of the thirtieth transistor is electrically connected to the second pull-up node, and a second electrode of the thirtieth transistor is electrically connected to the second voltage signal terminal.

10. The shift register according to claim 4, wherein the first scan unit further includes a first reset circuit, a second reset circuit, a third reset circuit, and a fourth reset circuit, wherein the first reset circuit is electrically connected to the input signal terminal, the first pull-down node, and the second voltage signal terminal; the first reset circuit is configured to, under a control of the input signal transmitted by the input signal terminal, transmit the second voltage signal transmitted by the second voltage signal terminal to the first pull-down node to reset the first pull-down node;

the second reset circuit is electrically connected to the first pull-down node, the second pull-down node, the first pull-up node, and the second voltage signal terminal; the second reset circuit is configured to, under a control of one of the voltage of the first pull-down node and the voltage of the second pull-down node, transmit the second voltage signal transmitted by the second voltage signal terminal to the first pull-up node to reset the first pull-up node;

the third reset circuit is electrically connected to the first pull-down node, the second pull-down node, the shift signal terminal, the first scan signal terminal, the second voltage signal terminal, and a fourth voltage signal terminal; the third reset circuit is configured to, under the control of one of the voltage of the first pull-down node and the voltage of the second pull-down node, transmit the second voltage signal transmitted by the second voltage signal terminal to the shift signal terminal to reset the shift signal terminal, and transmit a fourth voltage signal transmitted by the fourth voltage signal terminal to the first scan signal terminal to reset the first scan signal terminal;

the fourth reset circuit is electrically connected to a display reset signal terminal, the first pull-up node, and the second voltage signal terminal; the fourth reset circuit is configured to, under a control of a display reset signal transmitted by the display reset signal terminal, transmit the second voltage signal transmitted by the second voltage signal terminal to the first pull-up node to reset the first pull-up node; or the first scan unit further includes a first reset circuit, a second reset circuit, a third reset circuit, and a fourth reset circuit, wherein the first reset circuit is electrically connected to the input signal terminal, the first pull-down node, and the second voltage signal terminal; the first reset circuit includes a fifteenth transistor; a control electrode of the fifteenth transistor is electrically connected to the input signal terminal, a first electrode of the fifteenth transistor is electrically connected to the first pull-down node, and a second electrode of the fifteenth transistor is electrically connected to the second voltage signal terminal;

the second reset circuit is electrically connected to the first pull-down node, the second pull-down node, the first pull-up node, and the second voltage signal terminal; the second reset circuit includes a sixteenth transistor and a seventeenth transistor; a control electrode of the sixteenth transistor is electrically connected to the second pull-down node, a first electrode of the sixteenth transistor is electrically connected to the first pull-up node, and a second electrode of the sixteenth transistor is electrically connected to the second voltage signal terminal; a control electrode of the seventeenth transistor is electrically connected to the first pull-down node, a first electrode of the seventeenth transistor is electrically connected to the first pull-up node, and a second electrode of the seventeenth transistor is electrically connected to the second voltage signal terminal;

the third reset circuit is electrically connected to the first pull-down node, the second pull-down node, the shift signal terminal, the first scan signal terminal, the second voltage signal terminal, and a fourth voltage signal terminal; the third reset circuit includes an eighteenth transistor, a nineteenth transistor, a twentieth transistor, and a twenty-first transistor; a control electrode of the eighteenth transistor is electrically connected to the first pull-down node, a first electrode of the eighteenth transistor is electrically connected to the shift signal terminal, and a second electrode of the eighteenth transistor is electrically connected to the second voltage signal terminal; a control electrode of the nineteenth transistor is electrically connected to the second pull-down node, a first electrode of the nineteenth transistor is electrically connected to the shift signal terminal, and a second electrode of the nineteenth transistor is electrically connected to the second voltage signal terminal; a control electrode of the twentieth transistor is electrically connected to the first pull-down node, a first electrode of the twentieth transistor is electrically connected to the first scan signal terminal, and a second electrode of the twentieth transistor is electrically connected to the fourth voltage signal terminal; a control electrode of the twenty-first transistor is electrically connected to the second pull-down node, a first electrode of the twenty-first transistor is electrically connected to the first scan signal terminal, and a second electrode of the twenty-first transistor is electrically connected to the fourth voltage signal terminal;

the fourth reset circuit is electrically connected to a display reset signal terminal, the first pull-up node, and the second voltage signal terminal; the fourth reset circuit includes a twenty-second transistor; a control electrode of the twenty-second transistor is electrically connected to the display reset signal terminal, a first electrode of the twenty-second transistor is electrically connected to the first pull-up node, and a second electrode of the twenty-second transistor is electrically connected to the second voltage signal terminal.

11. The shift register according to claim 1, further comprising a blanking input unit; wherein the blanking input unit is electrically connected to a selection control signal terminal, the input signal terminal, a second voltage signal terminal, a fourth clock signal terminal, the first pull-up node, and the second pull-up node; and the blanking input unit is configured to, under a control of a selection control signal transmitted by the selection control signal terminal and the input signal transmitted by the input signal terminal, transmit a fourth clock signal received at the fourth clock signal terminal to the first pull-up node and the second pull-up node.

12. The shift register according to claim 11, wherein the blanking input unit includes a selection control circuit, a third input circuit, a first transmission circuit, and a second transmission circuit, wherein the selection control circuit is electrically connected to the selection control signal terminal, the input signal terminal, the second voltage signal terminal, and a first blanking node; the selection control circuit is configured to transmit the input signal received at the input signal terminal to the first blanking node under the control of the selection control signal, and to maintain a voltage of the first blanking node under a control of the input signal received at the input signal terminal and a second voltage signal received at the second voltage signal terminal;

the third input circuit is electrically connected to the first blanking node, the fourth clock signal terminal, and a second blanking node; the third input circuit is configured to transmit the fourth clock signal received at the fourth clock signal terminal to the second blanking node under a control of a voltage of the first blanking node;

the first transmission circuit is electrically connected to the fourth clock signal terminal, the second blanking node, and the first pull-up node; the first transmission circuit is configured to transmit the fourth clock signal received at the second blanking node to the first pull-up node under a control of the fourth clock signal transmitted by the fourth clock signal terminal; and the second transmission circuit is electrically connected to the fourth clock signal terminal, the second blanking node, and the second pull-up node; the second transmission circuit is configured to transmit the fourth clock signal received at the second blanking node to the second pull-up node under the control of the fourth clock signal transmitted by the fourth clock signal terminal.

13. The shift register according to claim 12, wherein the selection control circuit includes a thirty-third transistor and a third capacitor;

a control electrode of the thirty-third transistor is electrically connected to the selection control signal terminal, a first electrode of the thirty-third transistor is electrically connected to the input signal terminal, and a second electrode of the thirty-third transistor is electrically connected to the first blanking node; and a first terminal of the third capacitor is electrically connected to the first blanking node, and a second terminal of the third capacitor is electrically connected to the second voltage signal terminal;

the third input circuit includes a thirty-fourth transistor;

a control electrode of the thirty-fourth transistor is electrically connected to the first blanking node, a first electrode of the thirty-fourth transistor is electrically connected to the fourth clock signal terminal, and a second electrode of the thirty-fourth transistor is electrically connected to the second blanking node;

the first transmission circuit includes a thirty-fifth transistor;

a control electrode of the thirty-fifth transistor is electrically connected to the fourth clock signal terminal, a first electrode of the thirty-fifth transistor is electrically connected to the second blanking node, and a second electrode of the thirty-fifth transistor is electrically connected to the first pull-up node; and the second transmission circuit includes a thirty-sixth transistor;

a control electrode of the thirty-sixth transistor is electrically connected to the fourth clock signal terminal, a first electrode of the thirty-sixth transistor is electrically connected to the second blanking node, and a second electrode of the thirty-sixth transistor is electrically connected to the second pull-up node.

14. The shift register according to claim 13, wherein the blanking input unit further includes a first leakage prevention circuit; the first leakage prevention circuit is electrically connected to the first blanking node, a fifth voltage signal terminal, and a first leakage prevention node; the first leakage prevention circuit is configured to transmit a fifth voltage signal received at the fifth voltage signal terminal to the first leakage prevention node under the control of the voltage of the first blanking node, wherein the selection control circuit is further electrically connected to the first leakage prevention node; or the blanking input unit further includes a first leakage prevention circuit; the first leakage prevention circuit is electrically connected to the first blanking node, a fifth voltage signal terminal, and a first leakage prevention node; and the first leakage prevention circuit includes a thirty-seventh transistor; a control electrode of the thirty-seventh transistor is electrically connected to the first blanking node, a first electrode of the thirty-seventh transistor is electrically connected to the fifth voltage signal terminal, and a second electrode of the thirty-seventh transistor is electrically connected to the first leakage prevention node; the selection control circuit further includes a thirty-eighth transistor; a control electrode of the thirty-eighth transistor is electrically connected to the selection control signal terminal, a first electrode of the thirty-eighth transistor is electrically connected to the first leakage prevention node, and a second electrode of the thirty-eighth transistor is electrically connected to the first blanking node;

wherein the second electrode of the thirty-third transistor is electrically connected to the first leakage prevention node, and is electrically connected to the first blanking node through the thirty-eighth transistor.

15. The shift register according to claim 9, further comprising a leakage prevention unit, wherein the leakage prevention unit includes a second leakage prevention circuit;

the second leakage prevention circuit is electrically connected to the first pull-up node, a second leakage prevention node, and a fifth voltage signal terminal; the second leakage prevention circuit is configured to transmit a fifth voltage signal received at the fifth voltage signal terminal to the second leakage prevention node under the control of the voltage of the first pull-up node; wherein the second leakage prevention node is further electrically connected to at least one of the second reset circuit, the fourth reset circuit and the ninth reset circuit that are included in the first scan unit, and the sixth reset circuit, the eighth reset circuit and the tenth reset circuit that are included in the second scan unit; or, the second leakage prevention node is further electrically connected to a first transmission circuit and a second transmission circuit that are included in a blanking input unit in the shift register; or, the second leakage prevention node is further electrically connected to at least one of the second reset circuit, the fourth reset circuit and the ninth reset circuit that are included in the first scan unit, and the sixth reset circuit, the eighth reset circuit and the tenth reset circuit that are included in the second scan unit, and the second leakage prevention node is further electrically connected to a first transmission circuit and a second transmission circuit that are included in a blanking input unit in the shift register; wherein the first transmission circuit is electrically connected to a fourth clock signal terminal, a second blanking node, and the first pull-up node; the first transmission circuit is configured to transmit a fourth clock signal received at the second blanking node to the first pull-up node under a control of the fourth clock signal transmitted by the fourth clock signal terminal; the second transmission circuit is electrically connected to the fourth clock signal terminal, the second blanking node, and the second pull-up node; the second transmission circuit is configured to transmit the fourth clock signal received at the second blanking node to the second pull-up node under the control of the fourth clock signal transmitted by the fourth clock signal terminal.

16. The shift register according to claim 15, wherein the second leakage prevention circuit includes a thirty-ninth transistor; a control electrode of the thirty-ninth transistor is electrically connected to the first pull-up node, a first electrode of the thirty-ninth transistor is electrically connected to the fifth voltage signal terminal, and a second electrode of the thirty-ninth transistor is electrically connected to the second leakage prevention node, wherein if the second reset circuit is electrically connected to the second leakage prevention node, the second reset circuit includes a sixteenth transistor, a seventeenth transistor, a fortieth transistor and a forty-first transistor;

a control electrode of the sixteenth transistor is electrically connected to the second pull-down node, a first electrode of the sixteenth transistor is electrically connected to the first pull-up node, and a second electrode of the sixteenth transistor is electrically connected to the second leakage prevention node, and is electrically connected to the second voltage signal terminal through the fortieth transistor;

a control electrode of the seventeenth transistor is electrically connected to the first pull-down node, a first electrode of the seventeenth transistor is electrically connected to the first pull-up node, and a second electrode of the seventeenth transistor is electrically connected to the second leakage prevention node, and is electrically connected to the second voltage signal terminal through the forty-first transistor;

a control electrode of the fortieth transistor is electrically connected to the second pull-down node, a first electrode of the fortieth transistor is electrically connected to the second leakage prevention node, and a second electrode of the fortieth transistor is electrically connected to the second voltage signal terminal; and a control electrode of the forty-first transistor is electrically connected to the first pull-down node, a first electrode of the forty-first transistor is electrically connected to the second leakage prevention node, and a second electrode of the forty-first transistor is electrically connected to the second voltage signal terminal;

if the fourth reset circuit is electrically connected to the second leakage prevention node, the fourth reset circuit includes a twenty-second transistor and a forty-second transistor;

a control electrode of the twenty-second transistor is electrically connected to the display reset signal terminal, a first electrode of the twenty-second transistor is electrically connected to the first pull-up node, and a second electrode of the twenty-second transistor is electrically connected to the second leakage prevention node, and is electrically connected to the second voltage signal terminal through the forty-second transistor; and a control electrode of the forty-second transistor is electrically connected to the display reset signal terminal, a first electrode of the forty-second transistor is electrically connected to the second leakage prevention node, and a second electrode of the forty-second transistor is electrically connected to the second voltage signal terminal;

if the ninth reset circuit is electrically connected to the second leakage prevention node, the ninth reset circuit includes a twenty-ninth transistor and a forty-third transistor;

a control electrode of the twenty-ninth transistor is electrically connected to the global reset signal terminal, a first electrode of the twenty-ninth transistor is electrically connected to the first pull-up node, and a second electrode of the twenty-ninth transistor is electrically connected to the second leakage prevention node, and is electrically connected to the second voltage signal terminal through the forty-third transistor; and a control electrode of the forty-third transistor is electrically connected to the global reset signal terminal, a first electrode of the forty-third transistor is electrically connected to the second leakage prevention node, and a second electrode of the forty-third transistor is electrically connected to the second voltage signal terminal;

if the sixth reset circuit is electrically connected to the second leakage prevention node, the sixth reset circuit includes a twenty-fourth transistor and a twenty-fifth transistor;

a control electrode of the twenty-fourth transistor is electrically connected to the first pull-down node, a first electrode of the twenty-fourth transistor is electrically connected to the second pull-up node, and a second electrode of the twenty-fourth transistor is electrically connected to the second leakage prevention node, and is electrically connected to the second voltage signal terminal through the forty-first transistor; and a control electrode of the twenty-fifth transistor is electrically connected to the second pull-down node, a first electrode of the twenty-fifth transistor is electrically connected to the second pull-up node, and a second electrode of the twenty-fifth transistor is electrically connected to the second leakage prevention node, and is electrically connected to the second voltage signal terminal through the fortieth transistor;

if the eighth reset circuit is electrically connected to the second leakage prevention node, the eighth reset circuit includes a twenty-eighth transistor;

a control electrode of the twenty-eighth transistor is electrically connected to the display reset signal terminal, a first electrode of the twenty-eighth transistor is electrically connected to the second pull-up node, and a second electrode of the twenty-eighth transistor is electrically connected to the second leakage prevention node, and is electrically connected to the second voltage signal terminal through the forty-second transistor;

if the tenth reset circuit is electrically connected to the second leakage prevention node, the tenth reset circuit includes a thirtieth transistor;

a control electrode of the thirtieth transistor is electrically connected to the global reset signal terminal, a first electrode of the thirtieth transistor is electrically connected to the second pull-up node, and a second electrode of the thirtieth transistor is electrically connected to the second leakage prevention node, and is electrically connected to the second voltage signal terminal through the forty-third transistor;

if the first transmission circuit and the second transmission circuit are electrically connected to the second leakage prevention node, the first transmission circuit includes a thirty-fifth transistor and a forty-ninth transistor, and the second transmission circuit includes a thirty-sixth transistor;

a control electrode of the thirty-fifth transistor is electrically connected to the fourth clock signal terminal, a first electrode of the thirty-fifth transistor is electrically connected to the second blanking node, and a second electrode of the thirty-fifth transistor is electrically connected to the second leakage prevention node, and is electrically connected to the first pull-up node through the forty-ninth transistor;

a control electrode of the forty-ninth transistor is electrically connected to the fourth clock signal terminal, a first electrode of the forty-ninth transistor is electrically connected to the second leakage prevention node, and a second electrode of the forty-ninth transistor is electrically connected to the first pull-up node; and a control electrode of the thirty-sixth transistor is electrically connected to the fourth clock signal terminal, a second electrode of the thirty-sixth transistor is electrically connected to the second pull-up node, and a first electrode of the thirty-sixth transistor is electrically connected to the second leakage prevention node, and is electrically connected to the second blanking node through the thirty-fifth transistor.

17. The shift register according to claim 9, further comprising a leakage prevention unit, wherein the leakage prevention unit includes a third leakage prevention circuit and a fourth leakage prevention circuit;

the third leakage prevention circuit is electrically connected to the first pull-up node, a second leakage prevention node, and a fifth voltage signal terminal; the third leakage prevention circuit is configured to transmit a fifth voltage signal received at the fifth voltage signal terminal to the second leakage prevention node under the control of the voltage of the first pull-up node;

the fourth leakage prevention circuit is electrically connected to the second pull-up node, a third leakage prevention node, and the fifth voltage signal terminal; the fourth leakage prevention circuit is configured to transmit the fifth voltage signal received at the fifth voltage signal terminal to the third leakage prevention node under the control of the voltage of the second pull-up node; wherein the second leakage prevention node is electrically connected to at least one of the second reset circuit, the fourth reset circuit and the ninth reset circuit that are included in the first scan unit, and the third leakage prevention node is electrically connected to at least one of the sixth reset circuit, the eighth reset circuit and the tenth reset circuit that are included in the second scan unit; or, the second leakage prevention node is electrically connected to a first transmission circuit, the third leakage prevention node is electrically connected to a second transmission circuit, and the first transmission circuit and the second transmission circuit are included in a blanking input unit in the shift register; or, the second leakage prevention node is electrically connected to at least one of the second reset circuit, the fourth reset circuit and the ninth reset circuit that are included in the first scan unit, the third leakage prevention node is electrically connected to at least one of the sixth reset circuit, the eighth reset circuit and the tenth reset circuit that are included in the second scan unit, the second leakage prevention node is further electrically connected to a first transmission circuit, the third leakage prevention node is further electrically connected to a second transmission circuit, and the first transmission circuit and the second transmission circuit are included in a blanking input unit in the shift register; wherein the first transmission circuit is electrically connected to a fourth clock signal terminal, a second blanking node, and the first pull-up node; the first transmission circuit is configured to transmit a fourth clock signal received at the second blanking node to the first pull-up node under a control of the fourth clock signal transmitted by the fourth clock signal terminal; the second transmission circuit is electrically connected to the fourth clock signal terminal, the second blanking node, and the second pull-up node; the second transmission circuit is configured to transmit the fourth clock signal received at the second blanking node to the second pull-up node under the control of the fourth clock signal transmitted by the fourth clock signal terminal.

18. The shift register according to claim 17, wherein the third leakage prevention circuit includes a sixty-third transistor; a control electrode of the sixty-third transistor is electrically connected to the first pull-up node, a first electrode of the sixty-third transistor is electrically connected to the fifth voltage signal terminal, and a second electrode of the sixty-third transistor is electrically connected to the second leakage prevention node; and the fourth leakage prevention circuit includes a forty-fourth transistor; a control electrode of the forty-fourth transistor is electrically connected to the second pull-up node, a first electrode of the forty-fourth transistor is electrically connected to the fifth voltage signal terminal, and a second electrode of the forty-fourth transistor is electrically connected to the third leakage prevention node; wherein if the second reset circuit is electrically connected to the second leakage prevention node, the second reset circuit includes a sixteenth transistor, a seventeenth transistor, a fortieth transistor and a forty-first transistor;

a control electrode of the sixteenth transistor is electrically connected to the second pull-down node, a first electrode of the sixteenth transistor is electrically connected to the first pull-up node, and a second electrode of the sixteenth transistor is electrically connected to the second leakage prevention node, and is electrically connected to the second voltage signal terminal through the fortieth transistor;

a control electrode of the seventeenth transistor is electrically connected to the first pull-down node, a first electrode of the seventeenth transistor is electrically connected to the first pull-up node, and a second electrode of the seventeenth transistor is electrically connected to the second leakage prevention node, and is electrically connected to the second voltage signal terminal through the forty-first transistor;

a control electrode of the fortieth transistor is electrically connected to the second pull-down node, a first electrode of the fortieth transistor is electrically connected to the second leakage prevention node, and a second electrode of the fortieth transistor is electrically connected to the second voltage signal terminal; and a control electrode of the forty-first transistor is electrically connected to the first pull-down node, a first electrode of the forty-first transistor is electrically connected to the second leakage prevention node, and a second electrode of the forty-first transistor is electrically connected to the second voltage signal terminal;

if the fourth reset circuit is electrically connected to the second leakage prevention node, the fourth reset circuit includes a twenty-second transistor and a forty-second transistor;

a control electrode of the twenty-second transistor is electrically connected to the display reset signal terminal, a first electrode of the twenty-second transistor is electrically connected to the first pull-up node, and a second electrode of the twenty-second transistor is electrically connected to the second leakage prevention node, and is electrically connected to the second voltage signal terminal through the forty-second transistor; and a control electrode of the forty-second transistor is electrically connected to the display reset signal terminal, a first electrode of the forty-second transistor is electrically connected to the second leakage prevention node, and a second electrode of the forty-second transistor is electrically connected to the second voltage signal terminal;

if the ninth reset circuit is electrically connected to the second leakage prevention node, the ninth reset circuit includes a twenty-ninth transistor and a forty-third transistor;

a control electrode of the twenty-ninth transistor is electrically connected to the global reset signal terminal, a first electrode of the twenty-ninth transistor is electrically connected to the first pull-up node, and a second electrode of the twenty-ninth transistor is electrically connected to the second leakage prevention node, and is electrically connected to the second voltage signal terminal through the forty-third transistor; and a control electrode of the forty-third transistor is electrically connected to the global reset signal terminal, a first electrode of the forty-third transistor is electrically connected to the second leakage prevention node, and a second electrode of the forty-third transistor is electrically connected to the second voltage signal terminal;

if the sixth reset circuit is electrically connected to the third leakage prevention node, the sixth reset circuit includes a twenty-fourth transistor, a twenty-fifth transistor, a forty-fifth transistor and a forty-sixth transistor;

a control electrode of the twenty-fourth transistor is electrically connected to the first pull-down node, a first electrode of the twenty-fourth transistor is electrically connected to the second pull-up node, and a second electrode of the twenty-fourth transistor is electrically connected to the third leakage prevention node, and is electrically connected to the second voltage signal terminal through the forty-fifth transistor;

a control electrode of the forty-fifth transistor is electrically connected to the first pull-down node, a first electrode of the forty-fifth transistor is electrically connected to the third leakage prevention node, and a second electrode of the forty-fifth transistor is electrically connected to the second voltage signal terminal;

a control electrode of the twenty-fifth transistor is electrically connected to the second pull-down node, a first electrode of the twenty-fifth transistor is electrically connected to the second pull-up node, and a second electrode of the twenty-fifth transistor is electrically connected to the third leakage prevention node, and is electrically connected to the second voltage signal terminal through the forty-sixth transistor; and a control electrode of the forty-sixth transistor is electrically connected to the second pull-down node, a first electrode of the forty-sixth transistor is electrically connected to the third leakage prevention node, and a second electrode of the forty-sixth transistor is electrically connected to the second voltage signal terminal;

if the eighth reset circuit is electrically connected to the third leakage prevention node, the eighth reset circuit includes a twenty-eighth transistor and a forty-seventh transistor;

a control electrode of the twenty-eighth transistor is electrically connected to the display reset signal terminal, a first electrode of the twenty-eighth transistor is electrically connected to the second pull-up node, and a second electrode of the twenty-eighth transistor is electrically connected to the third leakage prevention node, and is electrically connected to the second voltage signal terminal through the forty-seventh transistor; and a control electrode of the forty-seventh transistor is electrically connected to the display reset signal terminal, a first electrode of the forty-seventh transistor is electrically connected to the third leakage prevention node, and a second electrode of the forty-seventh transistor is electrically connected to the second voltage signal terminal;

if the tenth reset circuit is electrically connected to the third leakage prevention node, the tenth reset circuit includes a thirtieth transistor and a forty-eighth transistor;

a control electrode of the thirtieth transistor is electrically connected to the global reset signal terminal, a first electrode of the thirtieth transistor is electrically connected to the second pull-up node, and a second electrode of the thirtieth transistor is electrically connected to the third leakage prevention node, and is electrically connected to the second voltage signal terminal through the forty-eighth transistor; and a control electrode of the forty-eighth transistor is electrically connected to the global reset signal terminal, a first electrode of the forty-eighth transistor is electrically connected to the third leakage prevention node, and a second electrode of the forty-eighth transistor is electrically connected to the second voltage signal terminal;

if the first transmission circuit is electrically connected to the second leakage prevention node, and the second transmission circuit is electrically connected to the third leakage prevention node, the first transmission circuit includes a thirty-fifth transistor and a forty-ninth transistor, and the second transmission circuit includes a thirty-sixth transistor and a fiftieth transistor;

a control electrode of the thirty-fifth transistor is electrically connected to the fourth clock signal terminal, a first electrode of the thirty-fifth transistor is electrically connected to the second blanking node, and a second electrode of the thirty-fifth transistor is electrically connected to the second leakage prevention node, and is electrically connected to the first pull-up node through the forty-ninth transistor;

a control electrode of the forty-ninth transistor is electrically connected to the fourth clock signal terminal, a first electrode of the forty-ninth transistor is electrically connected to the second leakage prevention node, and a second electrode of the forty-ninth transistor is electrically connected to the first pull-up node;

a control electrode of the thirty-sixth transistor is electrically connected to the fourth clock signal terminal, a first electrode of the thirty-sixth transistor is electrically connected to the second blanking node, and a second electrode of the thirty-sixth transistor is electrically connected to the third leakage prevention node, and is electrically connected to the second pull-up node through the fiftieth transistor; and a control electrode of the fiftieth transistor is electrically connected to the fourth clock signal terminal, a first electrode of the fiftieth transistor is electrically connected to the third leakage prevention node, and a second electrode of the fiftieth transistor is electrically connected to the second pull-up node.

19. A gate driving circuit, comprising N stages of shift registers that are cascaded according to claim 1, wherein N is a positive integer.

20. A display device, comprising the gate driving circuit according to claim 19.

* * * * *